(12) United States Patent  
Tsuboi et al.

(10) Patent No.: US 9,666,541 B2  
(45) Date of Patent: May 30, 2017

(54) ELECTRONIC DEVICE, MANUFACTURING METHOD OF THE SAME, AND NETWORK SYSTEM

(71) Applicant: FUJITSU LIMITED, Kawasaki-shi, Kanagawa (JP)

(72) Inventors: Osamu Tsuboi, Kawasaki (JP); Ikuo Soga, Isehara (JP); Tamotsu Yamamoto, Tachikawa (JP)

(73) Assignee: FUJITSU LIMITED, Kawasaki (JP)

( * ) Notice: Subject to any disclaimer, the term of this patent is extended or adjusted under 35 U.S.C. 154(b) by 112 days.

(21) Appl. No.: 14/857,946

(22) Filed: Sep. 18, 2015

(65) Prior Publication Data

US 2016/0013140 A1 Jan. 14, 2016

Related U.S. Application Data

(63) Continuation of application No. PCT/JP2013/057672, filed on Mar. 18, 2013.

(51) Int. Cl.
*H01L 23/58* (2006.01)
*H01M 10/42* (2006.01)
(Continued)

(52) U.S. Cl.
CPC .............. *H01L 23/58* (2013.01); *H01L 24/18* (2013.01); *H01L 25/16* (2013.01); *H01L 27/1225* (2013.01); *H01L 27/1259* (2013.01); *H01L 27/283* (2013.01); *H01L 29/7869* (2013.01); *H01L 29/78603* (2013.01); *H01L 35/32* (2013.01); *H01L 51/0545* (2013.01);
(Continued)

(58) Field of Classification Search
CPC combination set(s) only.
See application file for complete search history.

(56) References Cited

U.S. PATENT DOCUMENTS 5,304,915 A 4/1994 Sanpei et al.
5,547,775 A 8/1996 Eguchi et al.
(Continued)

FOREIGN PATENT DOCUMENTS

JP 59-025531 2/1984
JP 04-331425 11/1992
(Continued)

OTHER PUBLICATIONS

International Search Report, mailed in connection with PCT/JP2013/057672 and mailed Jun. 18, 2013.

*Primary Examiner* — Kaity Chandler
(74) *Attorney, Agent, or Firm* — Fujitsu Patent Center

(57) ABSTRACT

An electronic device includes: a substrate; a first all-solid-state secondary cell provided on the substrate, the first all-solid-state secondary cell including a first electrode layer, a solid electrolyte layer, and a second electrode layer; a first transistor including a first source drain, a second source drain electrically connected to the second electrode layer, and a first gate electrode; a first terminal electrically connected to the first electrode layer; a second terminal to control a potential of the first gate electrode; a third terminal electrically connected to the first source drain; and a sealing layer covering the first all-solid-state secondary cell and the first transistor, wherein the first terminal, the second terminal, and the third terminal are exposed on an upper surface of the sealing layer.

20 Claims, 68 Drawing Sheets

(51) Int. Cl.
*H01L 29/786* (2006.01)
*H01L 27/28* (2006.01)
*H01L 25/16* (2006.01)
*H01L 35/32* (2006.01)
*H01L 27/12* (2006.01)
*H01L 23/00* (2006.01)
*H01M 2/10* (2006.01)
*H01L 51/05* (2006.01)
*H01M 10/052* (2010.01)
*H01M 10/0562* (2010.01)
*H01L 29/66* (2006.01)
*H01L 21/56* (2006.01)

(52) U.S. Cl.
CPC ..... *H01M 2/1066* (2013.01); *H01M 10/4257* (2013.01); *H01L 21/568* (2013.01); *H01L 29/66969* (2013.01); *H01L 2924/12032* (2013.01); *H01L 2924/1306* (2013.01); *H01L 2924/15788* (2013.01); *H01M 10/052* (2013.01); *H01M 10/0562* (2013.01); *H01M 2010/4271* (2013.01); *H01M 2220/10* (2013.01); *H01M 2220/30* (2013.01)

(56) References Cited

U.S. PATENT DOCUMENTS

| | | | |
|---|---|---|---|
| 5,864,182 A | 1/1999 | Matsuzaki | |
| 7,253,494 B2 * | 8/2007 | Mino | H01L 23/58 |
| | | | 257/528 |
| 7,750,332 B2 * | 7/2010 | Sakamoto | G11C 13/0011 |
| | | | 257/2 |
| RE42,040 E * | 1/2011 | Sakamoto | G11C 13/0011 |
| | | | 326/39 |
| 8,450,208 B2 * | 5/2013 | Nishi | H01L 21/28518 |
| | | | 257/E21.159 |
| 2006/0157802 A1 * | 7/2006 | Sakamoto | G11C 13/0011 |
| | | | 257/393 |
| 2007/0217252 A1 * | 9/2007 | Symanczyk | G11C 8/10 |
| | | | 365/153 |
| 2007/0285246 A1 | 12/2007 | Koyama | |
| 2008/0138701 A1 | 6/2008 | Kuboki et al. | |
| 2009/0242868 A1 * | 10/2009 | Kurotsuchi | H01L 27/2436 |
| | | | 257/4 |
| 2013/0193916 A1 | 8/2013 | Koyama | |
| 2014/0035619 A1 * | 2/2014 | Zaitsu | H03K 19/17764 |
| | | | 326/41 |
| 2014/0217554 A1 * | 8/2014 | Sasaki | C30B 29/16 |
| | | | 257/616 |

FOREIGN PATENT DOCUMENTS

| | | |
|---|---|---|
| JP | 06-153412 | 5/1994 |
| JP | 2001-052751 | 2/2001 |
| JP | 2004-281593 | 10/2004 |
| JP | 2005-340479 | 12/2005 |
| JP | 2008-009972 | 1/2008 |
| JP | 2008-103203 | 5/2008 |
| JP | 2008-147391 | 6/2008 |
| WO | 2009/063805 | 5/2009 |

* cited by examiner

ELECTRONIC DEVICE, MANUFACTURING METHOD OF THE SAME, AND NETWORK SYSTEM

CROSS-REFERENCE TO RELATED APPLICATION

This application is a continuation of International Patent Application No. PCT/JP2013/057672 filed on Mar. 18, 2013 and designated the U.S., the entire contents of which are incorporated herein by reference.

FIELD

The embodiments discussed herein are related to an electronic device, a manufacturing method of the same, and a network system.

BACKGROUND

There is an increasing attention on an energy harvest technology to generate power by converting weak energy existing in various forms, such as heat, vibration, solar light and radio waves present in human life environment, and to utilize the power in a sensor network and the like. In the energy harvest technology, it is preferable to stabilize the power by storing the power in a secondary cell, since the power is generated from unstable energy such as solar light.

As for such a secondary cell, an all-solid-state secondary cell is available, which uses a solid electrolyte instead of an electrolyte solution. The all-solid-state secondary cell can be formed to be very thin and small by using a semiconductor process technology.

In the sensor network, the all-solid-state secondary cell described above and a power generating element are used as one electronic device, and power generated by the power generating element is stored in the all-solid-state secondary cell.

The electronic device including the all-solid-state secondary cell and the power generating element as described above has room for improvement in its miniaturization.

Note that techniques relating to the present application are disclosed in Japanese Laid-open Patent Publication No. 2008-103203, and Japanese Laid-open Patent Publication No. 04-331425.

SUMMARY

According to one aspect discussed herein, there is provided an electronic device including: a substrate; a first all-solid-state secondary cell provided on the substrate, the first all-solid-state secondary cell including a first electrode layer, a solid electrolyte layer, and a second electrode layer; a first transistor including a first source drain, a second source drain electrically connected to the second electrode layer, and a first gate electrode; a first terminal electrically connected to the first electrode layer;

a second terminal to control a potential of the first gate electrode; a third terminal electrically connected to the first source drain; and a sealing layer covering the first all-solid-state secondary cell and the first transistor, wherein the first terminal, the second terminal, and the third terminal are exposed on an upper surface of the sealing layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Prior to description of the present embodiments, description is given of the results of the studies conducted by the inventors of the present application.

As described above, an all-solid-state secondary cell can be manufactured using a semiconductor process technology, and is thus considered useful for miniaturizing an electronic device.

Figure 1:
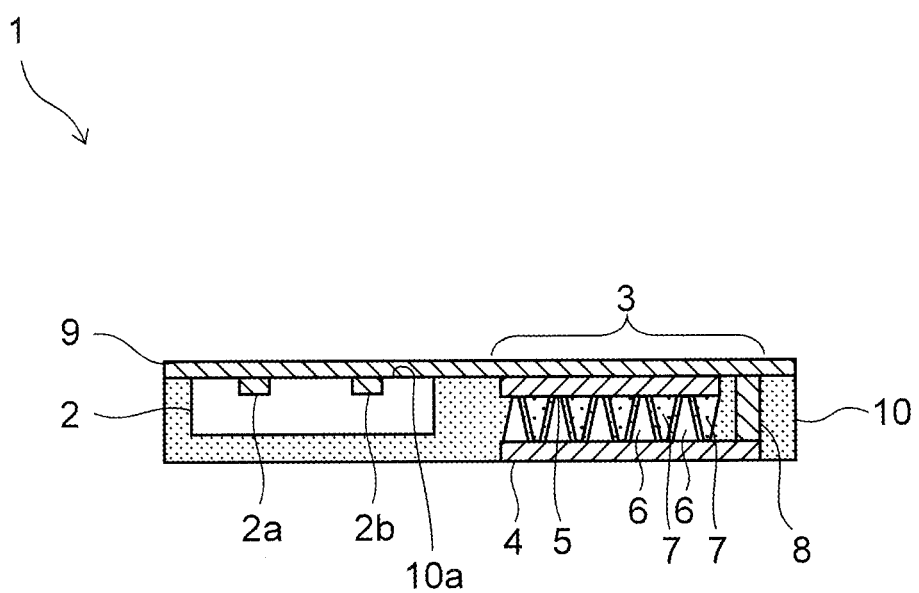
FIG. 1 is a cross-sectional view illustrating an example of an electronic device including an all-solid-state secondary cell.

FIG. 1 is a cross-sectional view illustrating an example of an electronic device including an all-solid-state secondary cell.

This electronic device 1 is driven by weak power generated using natural energy or the like, and includes an all-solid-state secondary cell 2 and a power generating element 3.

The all-solid-state secondary cell 2 is a lithium-ion cell including a positive electrode 2a and a negative electrode 2b. Meanwhile, the power generating element 3 is a thermoelectric conversion element. The power generating element 3 is provided with a first electrode 4 and a second electrode 5, among which a temperature difference is applied, and n type semiconductors 6 and p type semiconductors 7 are alternately disposed therebetween.

When a temperature difference is applied between the first and second electrodes 4 and 5, electromotive force is generated between the electrodes 4 and 5. The electromotive force is drawn out to the first electrode 4 through a conductor plug 8 connected to the first electrode 4.

In this example, the all-solid-state secondary cell 2 and the power generating element 3 are covered with a sealing layer 10 to prevent the all-solid-state secondary cell 2 and the power generating element 3 from being deteriorated by moisture and the like.

On an upper surface 10a of the sealing layer 10, there is provided a wiring layer 9 connected to the above-described positive electrode 2a, negative electrode 2b, second electrode 5, and the conductor plug 8. The wiring layer 9 can be formed by forming a copper plated film on the entire upper surface 10a of the sealing layer 10, for example, and patterning the copper plated film. The power generated by the power generating element 3 is stored in the all-solid-state secondary cell 2 through the wiring layer 9.

Here, even when not being charged from outside, the all-solid-state secondary cell 2 generates a certain amount of electromotive force in the course of manufacturing of the electronic device 1. Therefore, when a conductive film such as the copper plated film is formed on the entire upper surface 10a to form the wiring layer 9, the positive electrode 2a and the negative electrode 2b are short-circuited through the conductive film, which results in discharging of the all-solid-state secondary cell 2.

However, when the all-solid-state secondary cell 2 is discharged in the course of manufacturing of the electronic device 1 in this manner, life of the all-solid-state secondary cell 2 is significantly shortened.

This problem is described with reference to FIG. 2.

Figure 2:
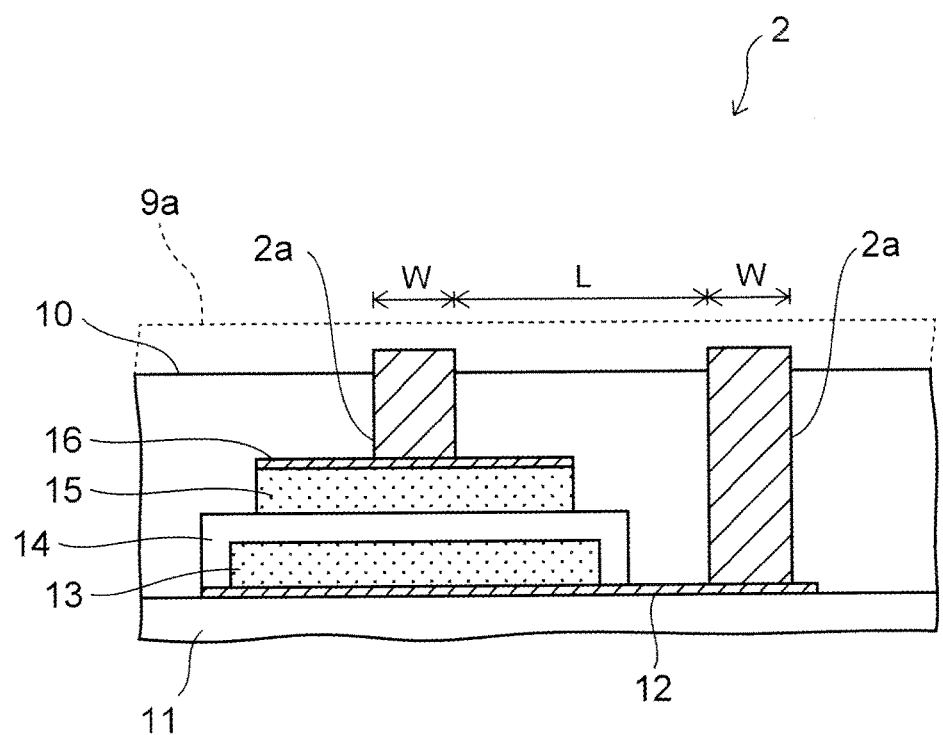
FIG. 2 is a cross-sectional view of the all-solid-state secondary cell.

FIG. 2 is a cross-sectional view of the all-solid-state secondary cell 2.

As illustrated in FIG. 2, the all-solid-state secondary cell 2 includes a substrate 11 such as a silicon substrate, and a positive electrode collecting layer 12, a positive electrode body 13, a solid electrolyte layer 14, a negative electrode body 15 and a negative electrode collecting layer 16 are laminated thereon in this order.

As described above, the all-solid-state secondary cell 2 is a lithium-ion cell. A material of the positive electrode body 13 is $LiCoO_2$, a material of the solid electrolyte layer 14 is LiPON, and a material of the negative electrode body 15 is In—Li.

Also, copper is used as a material of the positive electrode collecting layer 12 and the negative electrode collecting layer 16.

Here, calculation is performed for the current, which flows through the all-solid-state secondary cell 2 when the positive electrode 2a and the negative electrode 2b are short-circuited as described above. In the following, such a case is hypothesized where a nickel film 9a having a thickness of 20 nm is formed using a sputtering method as a seed layer of a copper plated film in order to form the wiring layer 9 by electrolytic copper plating, and the positive electrode 2a and the negative electrode 2b are short-circuited by the nickel film 9a.

In this case, the nickel film 9a has a sheet resistance r of about $100\Omega/\square$. When an interval L between the positive electrode 2a and the negative electrodes 2b is 8.2 mm and each of the positive electrode 2a and negative electrode 2b has a width w of 2.5 mm, a resistance value of the nickel film 9a between the electrodes 2a and 2b is about $328\Omega$ ($=r \times L/W$).

Assuming that an internal resistance of the all-solid-state secondary cell 2 is $290\Omega$ and a terminal voltage of the all-solid-state secondary cell 2 in a full charge state is 4.1 V, a current of 6.7 mA ($=4.1$ V/$290\Omega$) flows through the all-solid-state secondary cell 2. With this current, a cell capacity of 100 uAh is exceeded in about two minutes, which results in an over-discharge state.

When over discharge occurs in the all-solid-state secondary cell 2, an $LiCoO_2$ crystal of the positive electrode body 13 is broken or copper ions flow into the solid electrolyte layer 14 from the negative electrode collecting layer 16.

Such copper ions are deposited when the all-solid-state secondary cell 2 is charged next time, which causes the life of the all-solid-state secondary cell 2 to be significantly shortened.

To avoid such a problem, it is also conceivable to separately mount the all-solid-state secondary cell 2 and the power generating element 3 on a wiring substrate that is prepared in advance, instead of sealing the all-solid-state secondary cell 2 and the power generating element 3 with the sealing layer 10 as illustrated in FIG. 1.

However, such a structure needs to ensure the space for mounting the all-solid-state secondary cell 2 and the power generating element 3 on the wiring substrate. Therefore, miniaturization of the electronic device 1 is inhibited.

Furthermore, it is also conceivable to provide a protection circuit to protect the all-solid-state secondary cell 2 from the aforementioned over discharge. However, the protection circuit increases the size of the electronic device 1.

Hereinafter, description is given of the embodiments capable of miniaturizing the electronic device while preventing over discharge of the all-solid-state secondary cell.

First Embodiment

An electronic device according to the present embodiment is described by following a manufacturing method thereof.

FIGS. 3A to 3K are cross-sectional views of the electronic device in the course of manufacturing according to the present embodiment, and FIGS. 4A to 4F are plan views thereof. Note that the cross-sectional views of FIGS. 3A to 3K correspond to cross-sectional views taken along the line I-I in FIGS. 4A to 4F.

Figure 3A:
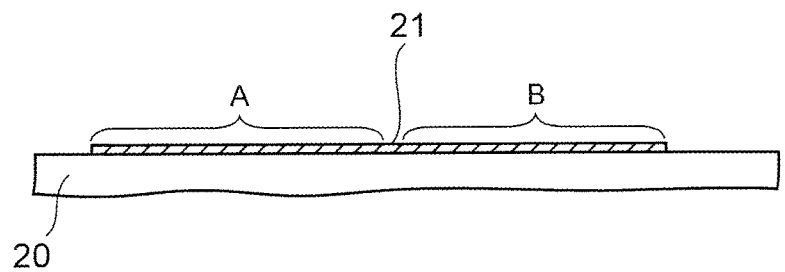
FIGS. 3A to 3K are cross-sectional views of the electronic device in the course of manufacturing according to the first embodiment.

First, as illustrated in FIG. 3A, a titanium film and a platinum film are formed in this order using a sputtering method on a silicon substrate 20, and these laminated films are patterned to form a positive electrode collecting layer 21 having a first region A and a second region B.

As for a method for the patterning, dry etching and a liftoff technique are available, in which an unillustrated resist film is used as a mask. In the liftoff technique, after the positive electrode collecting layer 21 is formed using the resist film as a mask, the positive electrode collecting layer 21 can be patterned by removing the resist film with oxygen plasma or liquid remover.

Note that, although the thickness of the positive electrode collecting layer 21 is not particularly limited, the thickness thereof is 1 µm to 10 µm in the present embodiment.

Moreover, before the formation of the positive electrode collecting layer 21, a silicon oxide film having a thickness of about 1 µm may be formed beforehand as an insulating film on the silicon substrate 20.

Figure 3B:
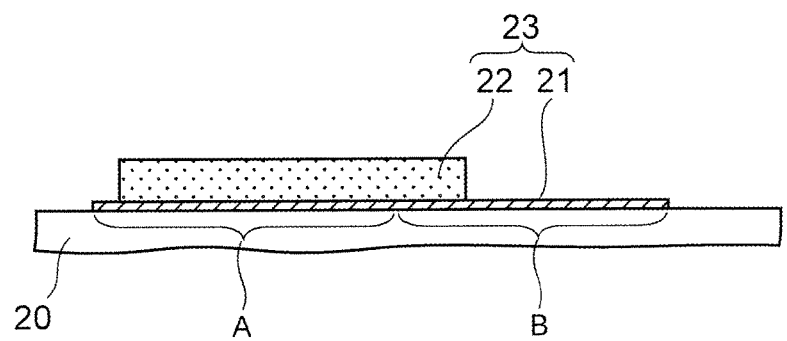

Next, as illustrated in FIG. 3B, a polycrystalline oxide film such as a $LiCoO_2$ film is formed to have a thickness of about 1 µm to 10 µm, using the sputtering method, as a positive electrode body 22 on the entire upper surface of the silicon substrate 20. Note that a $LiFePO_4$ film may be formed instead of the $LiCoO_2$ film.

Thereafter, the positive electrode body 22 is patterned to be left only on the first region A of the positive electrode collecting layer 21, thereby making the positive electrode collecting layer 21 and the positive electrode body 22 into a positive electrode layer 23.

Figure 3C:
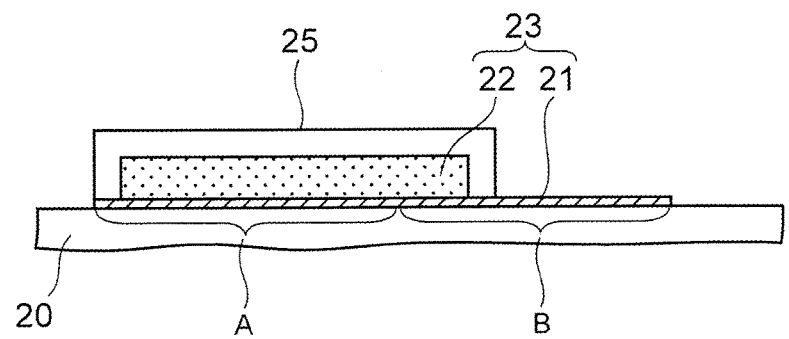

Subsequently, as illustrated in FIG. 3C, a LiPON film is formed as a solid electrolyte layer 25 on the entire upper surface of the silicon substrate 20, and the solid electrolyte layer 25 is patterned to be left only on the upper and side surfaces of the positive electrode body 22.

Note that the positive electrode collecting layer 21 in the second region B is exposed without being covered with the solid electrolyte layer 25.

Figure 3D:
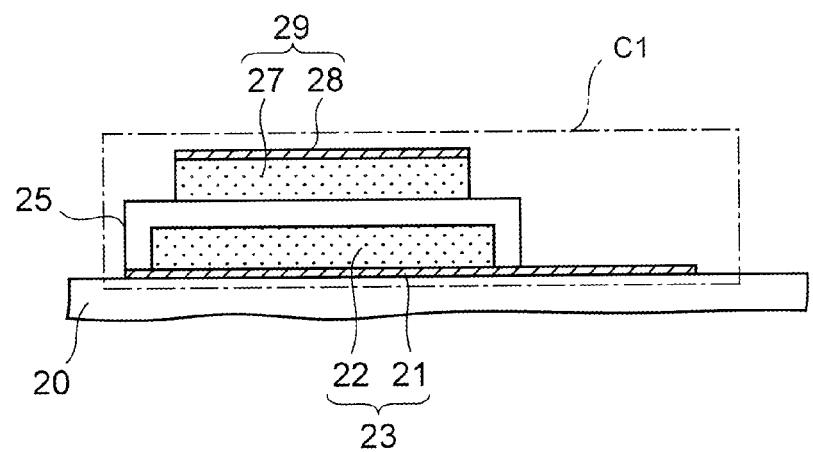
Figure 4A:
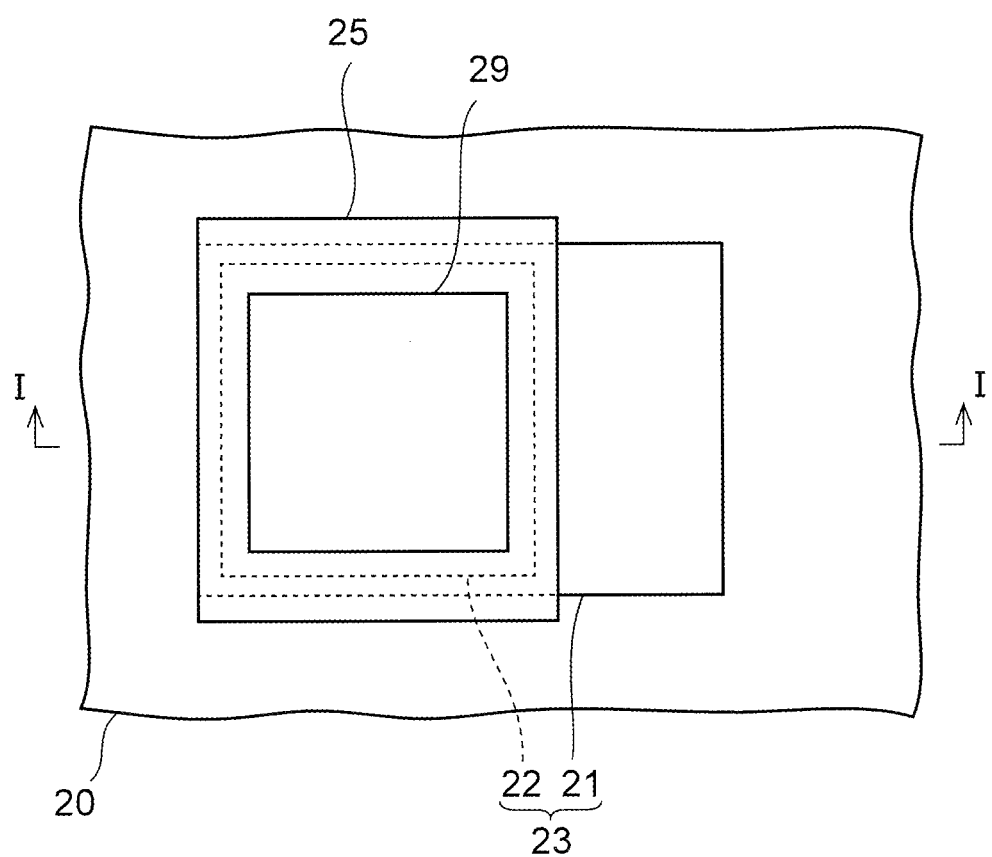
FIGS. 4A to 4F are plan views of the electronic device in the course of manufacturing according to the first embodiment.

Next, description is given of steps for obtaining a structure illustrated in FIG. 3D and FIG. 4A.

First, a lithium film is formed to have a thickness of about 0.1 µm to 1 µm on the entire upper surface of the silicon substrate 20, and the lithium film is patterned to form a negative electrode body 27 on the solid electrolyte layer 25. Note that, instead of the lithium film, any of an alloy film of indium and lithium, a carbon film, and a silicon film may be formed as the negative electrode body 27.

Thereafter, a copper film or an aluminum film is formed to have a thickness of about 0.5 µm to 5 µm as a negative electrode collector 28 on the entire upper surface of the silicon substrate 20. Thereafter, the negative electrode collector 28 is patterned to be left only on the negative electrode body 27, thereby making the negative electrode body 27 and the negative electrode collector 28 into a negative electrode layer 29.

Through the steps up to this point, a first all-solid-state secondary cell C1 is obtained, in which the positive electrode layer 23, the solid electrolyte layer 25, and the negative electrode layer 29 are laminated in this order. The first all-solid-state secondary cell C1 is a lithium-ion cell, which is useful for obtaining high power density. Note that the positive electrode layer 23 in the first all-solid-state secondary cell C1 is an example of the first or second electrode layer. Likewise, the negative electrode layer 29 is also an example of the first or second electrode layer.

Figure 3E:
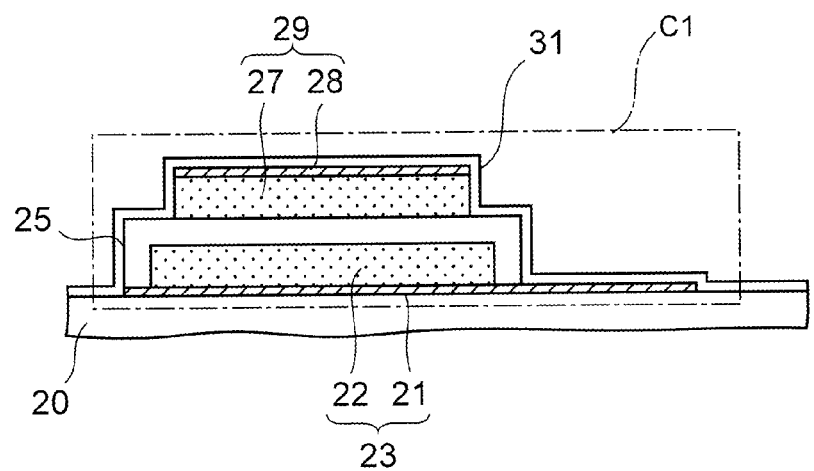

Subsequently, as illustrated in FIG. 3E, an alumina ($Al_2O_3$) film is formed to have a thickness of about 0.1 µm to 5 µm, using the sputtering method, as an insulating film 31 covering the silicon substrate 20 and the first all-solid-state secondary cell C1.

Figure 3F:
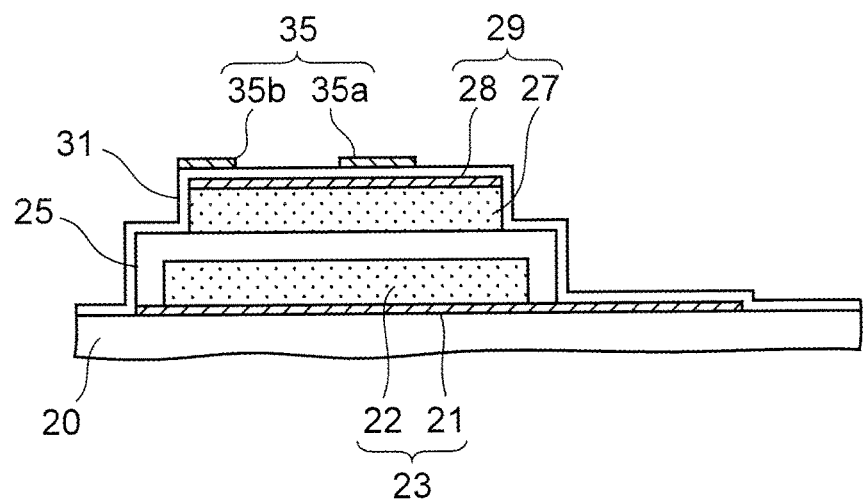

Then, as illustrated in FIG. 3F, a first gate electrode 35 including a gate body 35a and an extension portion 35b is formed on the insulating film 31 on the negative electrode layer 29. The first gate electrode 35 can be formed by forming a titanium film and a platinum film in this order using the sputtering method on the insulating film 31, for example, and then patterning these films by dry etching using an unillustrated resist film as a mask.

At this time, since the insulating film 25 is formed before the formation of the first gate electrode 35, the positive electrode layer 23 and the negative electrode layer 29 can be prevented from being electrically short-circuited by the first gate electrode 35 before patterning. This is also the case for embodiments to be described later.

Note that the first gate electrode 35 may be formed using a liftoff technique instead of dry etching.

Furthermore, although the thickness of the first gate electrode 35 is not particularly limited, the first gate electrode 35 is formed to have a thickness of about 0.1 µm to 1 µm in the present embodiment.

Figure 3G:
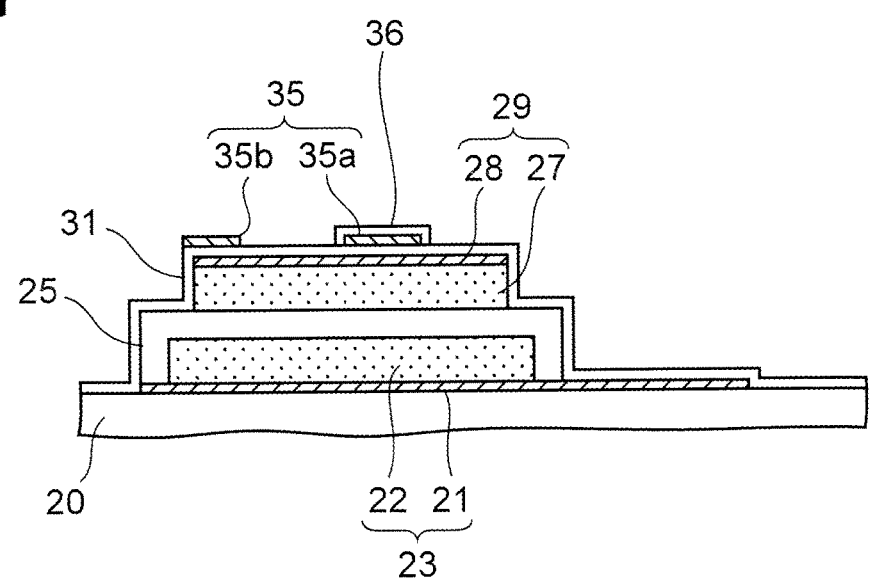
Figure 4B:
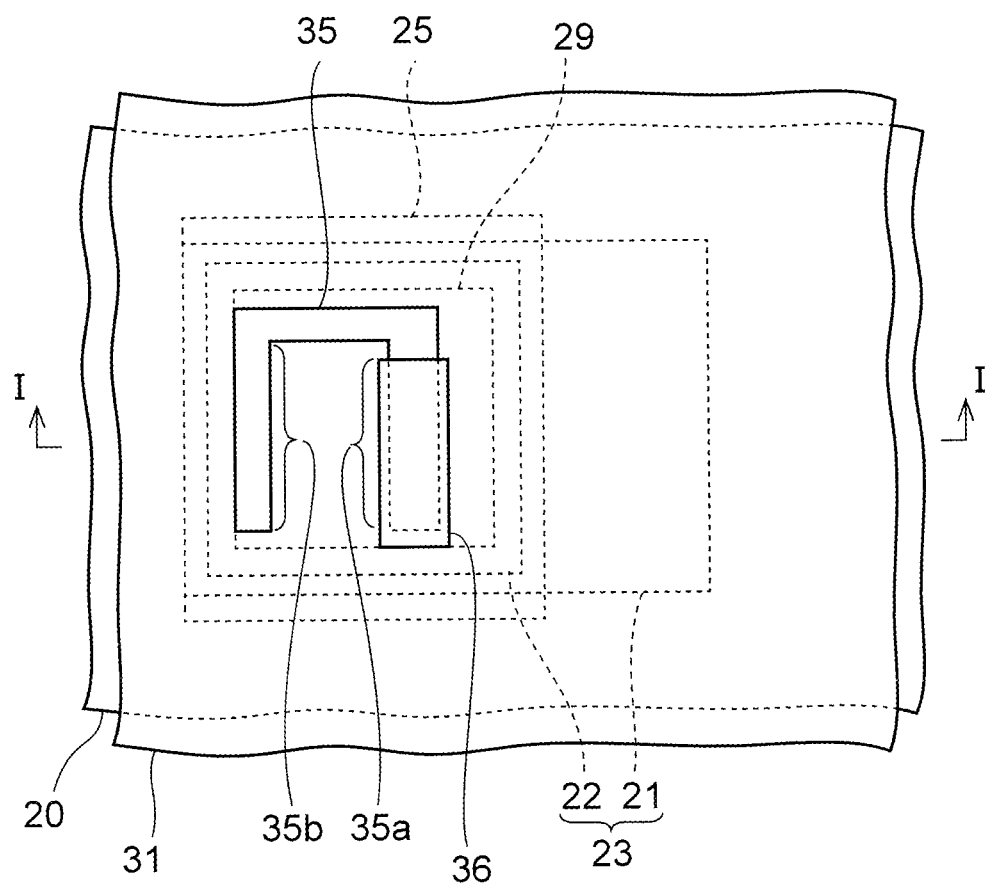

Next, as illustrated in FIG. 3G and FIG. 4B, an alumina film is formed to have a thickness of about 0.05 µm to 0.5 µm as a gate insulating film 36 on the entire upper surface of the silicon substrate 20. Then, the gate insulating film 36 is patterned and removed from on the extension portion 35b of the first gate electrode 35, and is thus left only on the gate body 35a.

The patterning of the gate insulating film 36 may be performed by dry etching using an unillustrated resist film as a mask or by using the liftoff technique.

Furthermore, the gate insulating film 36 is not limited to the alumina film, but a hafnium oxide ($HfO_2$) film may be formed as the gate insulating film 36.

As illustrated in FIG. 4B, the first gate electrode 35 has a U-shape having the gate body 35a and the extension portion 35b facing each other. Then, only the gate body 35a is covered with the gate insulating film 36.

Figure 3H:
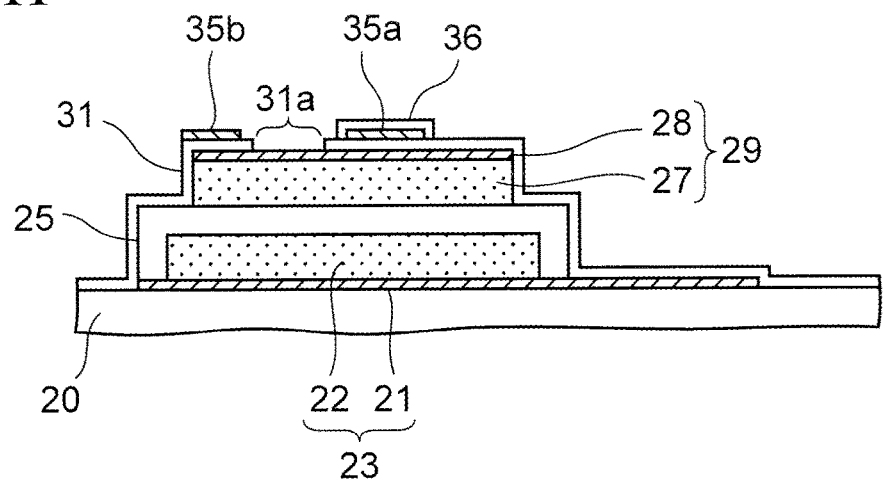
Figure 4C:
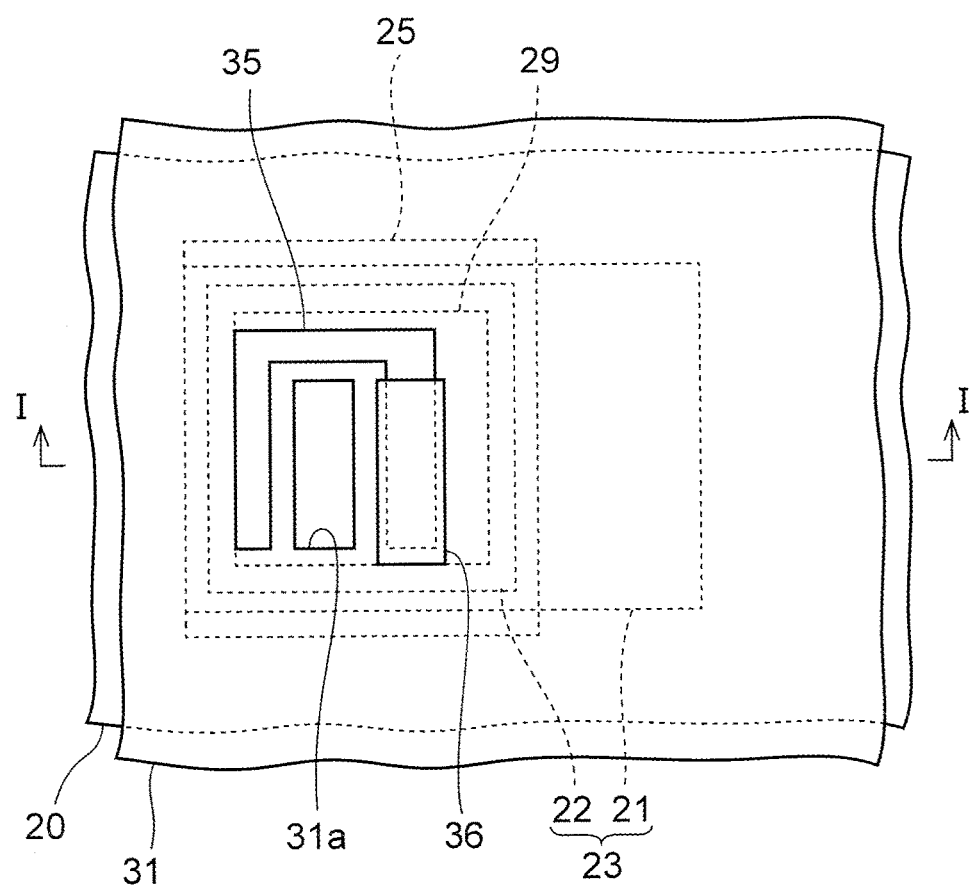

Subsequently, as illustrated in FIG. 3H and FIG. 4C, the insulating film 31 is patterned by dry etching using an unillustrated resist film as a mask, thereby forming an opening 31a in which the negative electrode layer 29 is exposed in the insulating film 31 at one side of the gate body 35a. As for etching gas which can be used for the dry etching, mixed gas of $CF_4$ gas and argon gas is available, for example.

Figure 3I:
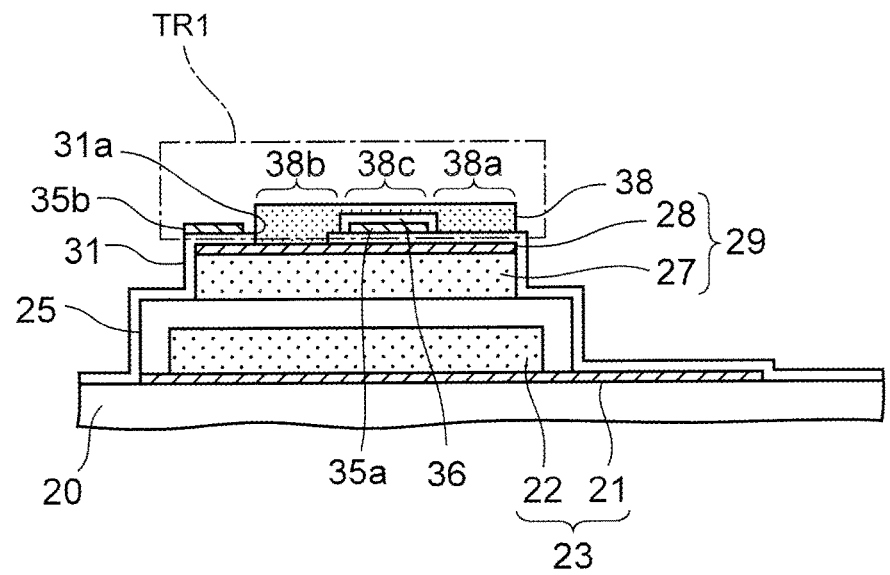
Figure 4D:
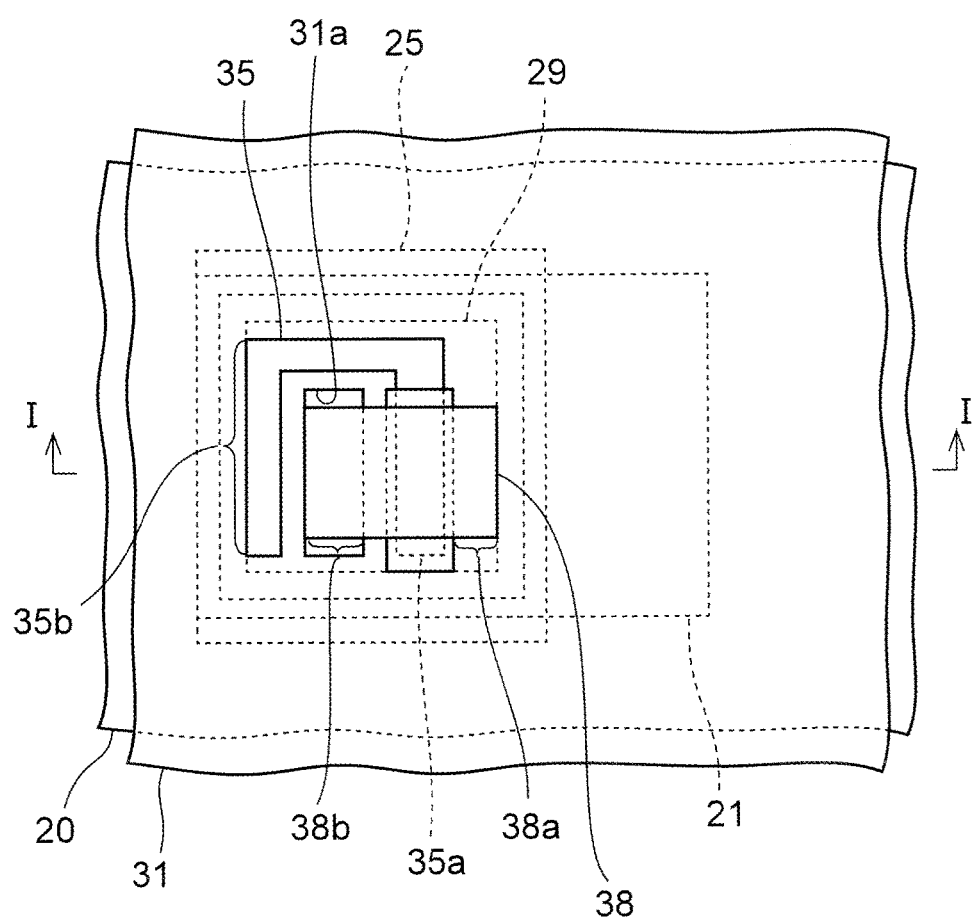

Next, as illustrated in FIG. 3I and FIG. 4D, a first semiconductor layer 38 is formed to have a thickness of about 0.05 µm to 0.5 µm, using the sputtering method, on the entire upper surface of the silicon substrate 20. Then, the first semiconductor layer 38 is patterned to be left only on the negative electrode layer 29.

The first semiconductor layer 38 has a first source drain 38a, a second source drain 38b and a channel 38c, and forms a first transistor TR1 in cooperation with the first gate electrode 35 described above.

The first source drain 38a in the first transistor TR1 is provided on the insulating film 31 at another side of the gate body 35a. Also, the second source drain 38b comes into ohmic contact with the negative electrode layer 29 in the opening 31a. Then, the channel 38c is provided over the gate body 35a.

In the present embodiment, a p type semiconductor material is used as a material of the first semiconductor layer 38. As for the p type semiconductor material, an oxide semiconductor is available, which contains any of tin (Sn), nickel (Ni), lithium (Li) and calcium (Ca). Examples of the oxide semiconductor include tin oxide (SnO), nickel oxide (NiO), $LiCoO_2$ and $CaCoO_2$.

Note that, instead of such oxide semiconductors, an organic semiconductor such as pentacene and poly(3-hexylthiophene) (P3HT) may be used as a material of the first semiconductor layer 38.

The structure having the first gate electrode 35 below the first semiconductor layer 38 as in this example is called a bottom gate structure. The bottom gate structure has an advantage that the first semiconductor layer 38 is less likely to be damaged during the formation of the first gate electrode 35, since the first semiconductor layer 38 is formed after the formation of the first gate electrode 35. Note that, when such damage is not problematic, a top gate structure may be adopted, in which the first gate electrode 35 is located over the first semiconductor layer 38. This is also the case for the embodiments to be described later.

Furthermore, although the first transistor TR1 is a MIS (Metal Insulator Semiconductor) field-effect transistor including the gate insulating film 36, the structure of the transistor is not limited thereto. For example, a MES (Metal Semiconductor) field-effect transistor without the gate insulating film 36 may be formed as the first transistor TR1 by using a schottky barrier between the first gate electrode 35 and the first semiconductor layer 38. This is also the case for the embodiments to be described later.

As illustrated in FIG. 4D, the gate body 35a of the first gate electrode 35 is positioned between the first source drain 38a and the second source drain 38b in a planar view. Also, the extension portion 35b of the first gate electrode 35 is exposed without being covered with the first semiconductor layer 38.

Figure 3J:
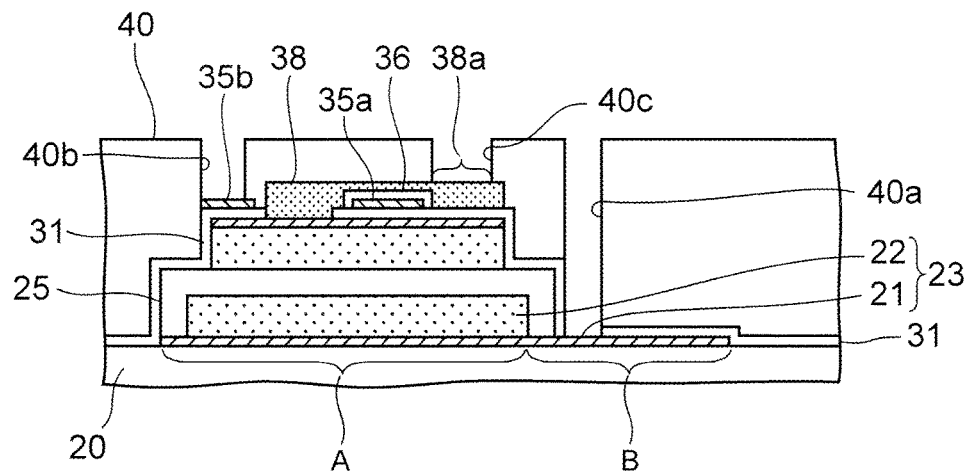
Figure 4E:
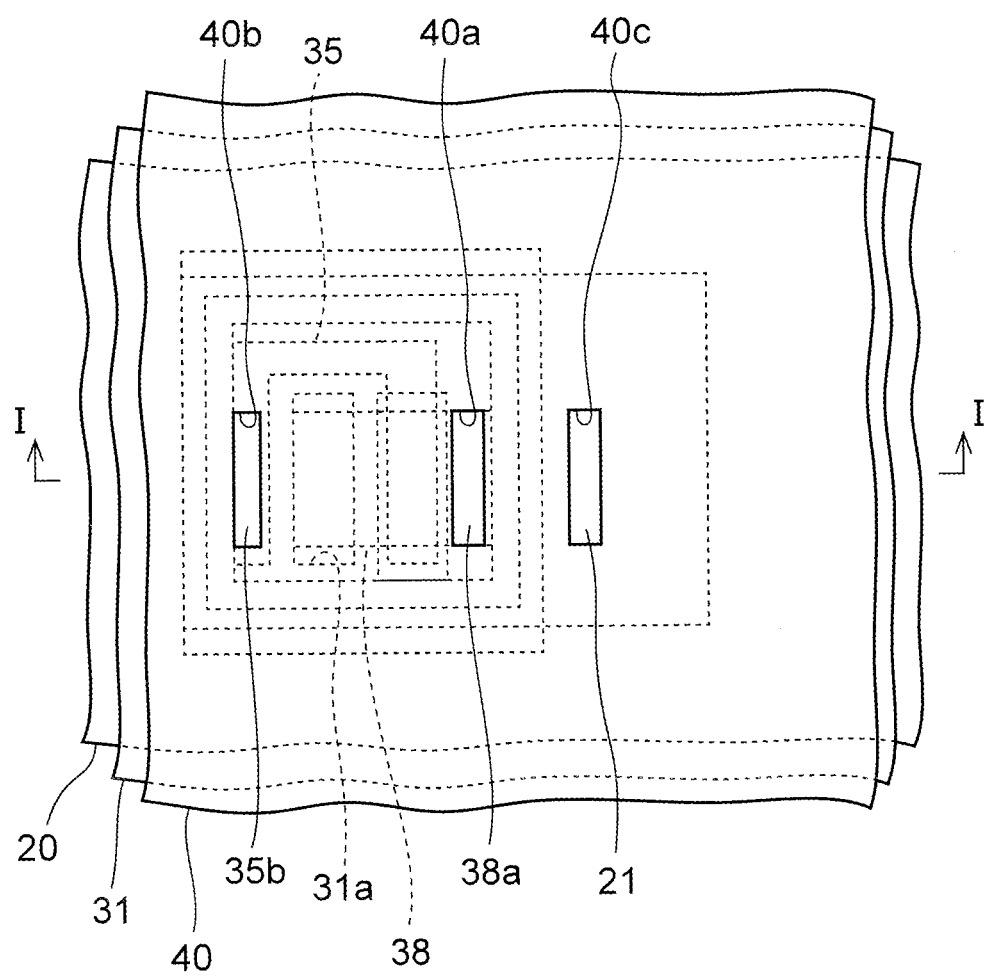

Next, as illustrated in FIG. 3J and FIG. 4E, an alumina film is formed to have a thickness of about 0.1 µm to 1 µm, using the sputtering method, as a sealing layer 40 on the extension portion 35b of the first gate electrode 35, the first semiconductor layer 38 and the insulating film 31.

The sealing layer 40 has a function to protect the first transistor TR1 and the first all-solid-state secondary cell C1 from moisture in the atmosphere. As for a film having such a function, a silicon oxynitride (SiON) film, a polyimide film and a parylene film are available besides the alumina film described above, and any of these films or a laminated film thereof may be formed as the sealing layer 40.

Thereafter, the sealing layer 40 is patterned to form first to third holes 40a to 40c. Among these holes, the first hole 40a is provided on the positive electrode collecting layer 21 in the second region B, the second hole 40b is provided on the extension portion 35b of the first gate electrode 35. Then, the third hole 40c is provided on the first source drain 38a in the first semiconductor layer 38.

Note that the patterning of the sealing layer 40 is performed by dry etching using an unillustrated resist film as a mask. For the dry etching, any one of $Cl_2$ gas, $BCl_3$ gas, and gas mixture of $Cl_2$ gas and $BCl_3$ gas can be used as etching gas.

Figure 3K:
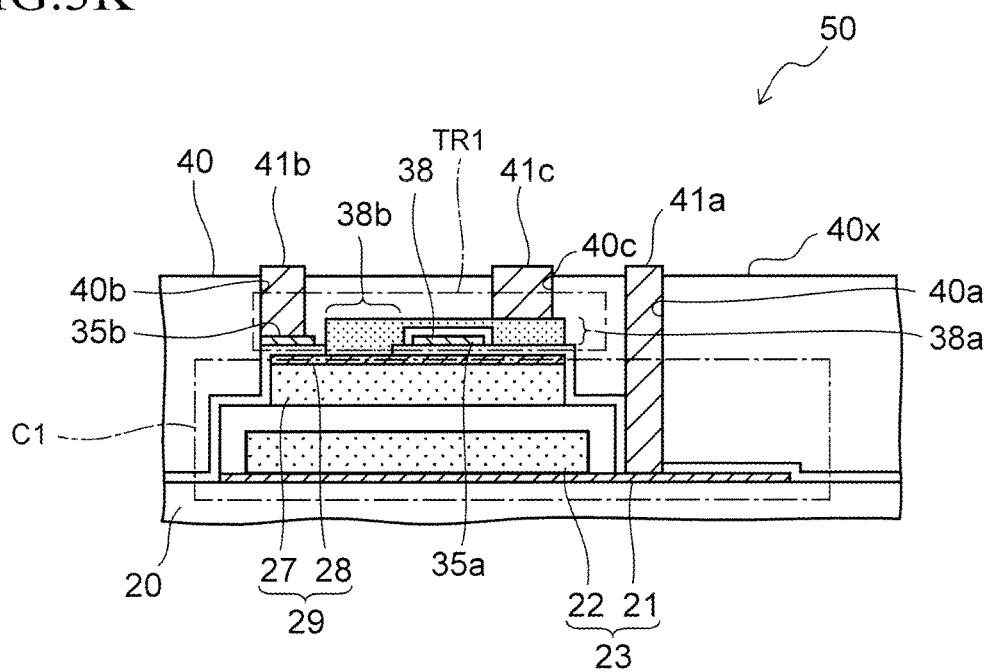
Figure 4F:
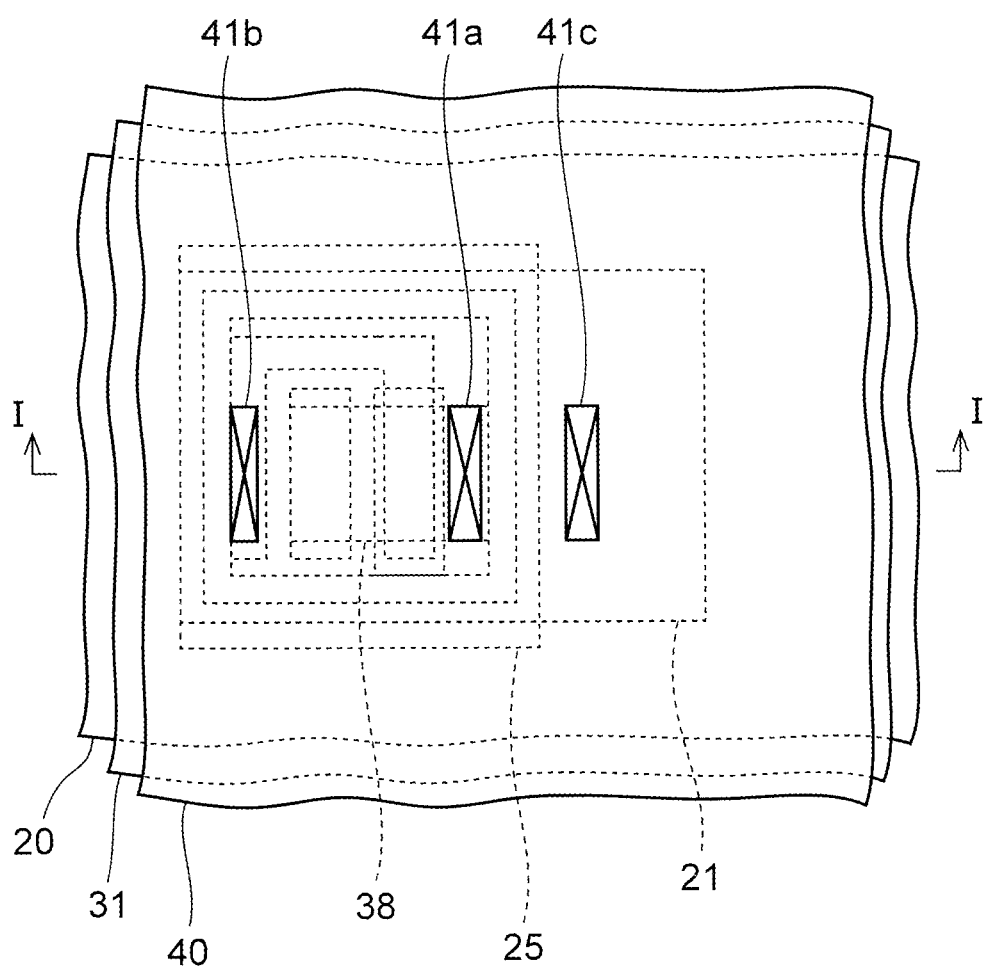

Next, as illustrated in FIG. 3K and FIG. 4F, after metal film is formed in the holes 40a to 40c by an electrolytic plating method, the metal film is patterned to be left as first to third terminals 41a to 41c in the holes 40a to 40c, respectively. As for a material of the metal film, nickel, copper, gold and the like are available, for example.

Among these terminals, the first terminal 41a is electrically connected to the positive electrode layer 23, and the third terminal 41c comes into ohmic contact with the first source drain 38a.

Meanwhile, the second terminal 41b is connected to the extension portion 35b of the first gate electrode 35, thus the second terminal 41b controls the potential of the first gate electrode 35.

Note that, in the example illustrated in FIG. 3K, the terminals 41a to 41c protrude from the surface of the sealing layer 40. This is because the above-described metal film formed by the plating method bulge from the respective holes 40a to 40c. When the thickness of the metal film is not sufficient to fill the holes 40a to 40c, upper ends of the respective terminals 41a to 41c may retreat into the holes 40a to 40c, contrary to the above. This is also the case for the embodiments to be described later.

Thus, an electric storage unit 50, which has the first all-solid-state secondary cell C1 and the first transistor TR1, of the electronic device according to the present embodiment is completed.

In the electric storage unit 50, the first to third terminals 41a to 41c are exposed from an upper surface 40x of the sealing layer 40 as illustrated in FIG. 3K.

Figure 5:
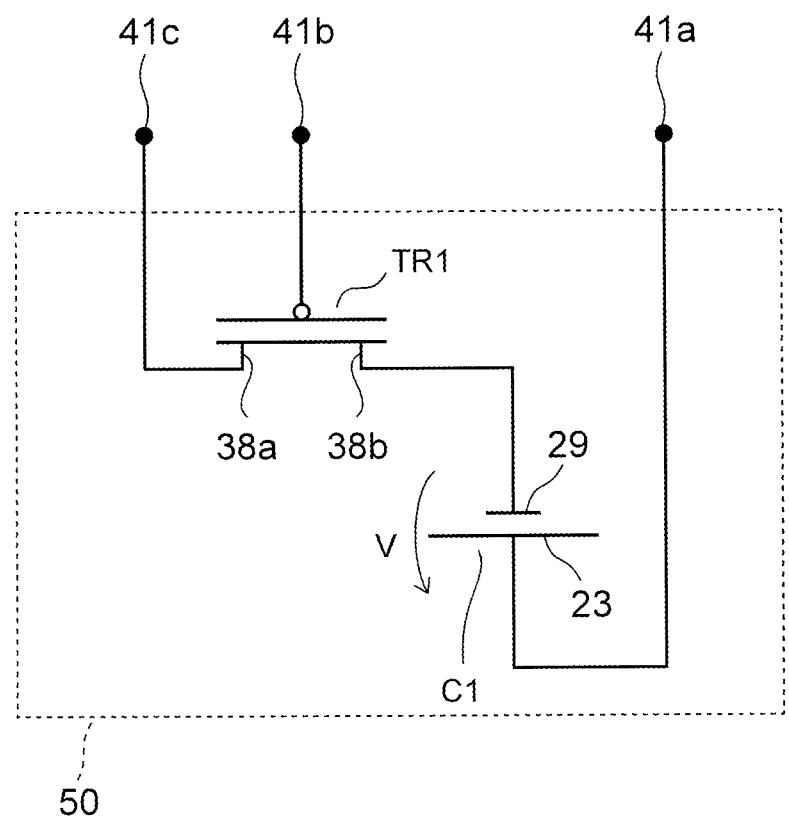
FIG. 5 is an equivalent circuit diagram of an electric storage unit included in the electronic device according to the first embodiment.

FIG. 5 is an equivalent circuit diagram of the electric storage unit 50.

The first transistor TR1 is provided as a switch to shut off the current flowing into the first all-solid-state secondary cell C1. A switch provided on the negative electrode side of the first all-solid-state secondary cell C1 as in the present embodiment is also called a low-side switch.

Here, when the first terminal 41a and the second terminal 41b are short-circuited, a positive potential V of the first all-solid-state secondary cell C1 is applied to the gate of the first transistor TR1. As a result, the first transistor TR1 having a p conductivity type is turned off. Thus, no current flows into the first all-solid-state secondary cell C1, making it possible to prevent over discharge of the first all-solid-state secondary cell C1.

Note that, in order to take power out of the first all-solid-state secondary cell C1 in actual usage, the first transistor TR1 may be turned on by applying a negative voltage lower than a threshold voltage to the gate of the first transistor TR1.

Next, description is given of an electronic device on which the electric storage unit 50 and a power generating element are mounted in combination.

FIGS. 6A to 6F are cross-sectional views of the electronic device in the course of manufacturing, where the electric storage unit 50 and a power generating element being mounted in combination on the electronic device.

Figure 6A:
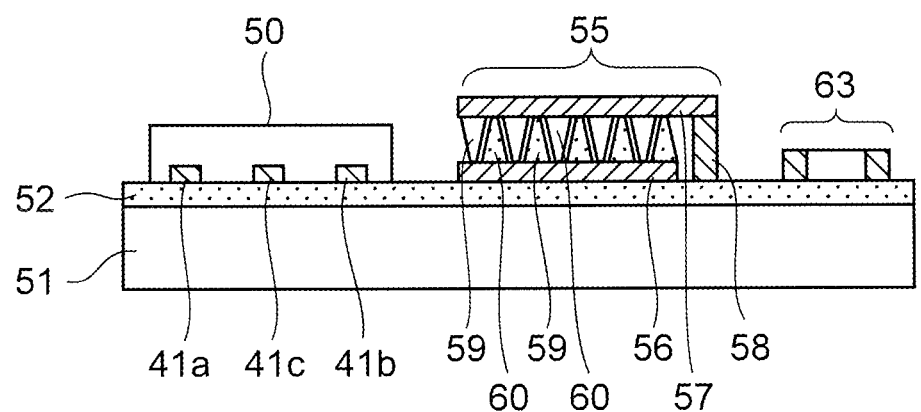
FIGS. 6A to 6F are cross-sectional views of the electronic device in the course of manufacturing according to the first embodiment.

First, as illustrated in FIG. 6A, an adhesive layer 52 is formed on a temporarily fixed substrate 51 such as a silicon substrate and a glass substrate. As for the adhesive layer 52, an adhesive sheet can be used, whose adhesive force is reduced by heating or ultraviolet irradiation.

Then, the electric storage unit 50 is attached onto the adhesive layer 51 in a state where the terminals 41a to 41c are positioned on the lower side. Furthermore, together with the electric storage unit 50, a power generating element 55 and a circuit element 63 are also attached to the adhesive layer 52.

The power generating element 55 is a thermoelectric conversion element, for example, and includes a first electrode 56 and a second electrode 57, to which a temperature difference is applied. Also, n type semiconductors 59 and p type semiconductors 60 are alternately disposed between these electrodes. In this example, the first electrode 56 of the two electrodes is attached to the adhesive layer 52.

Meanwhile, the circuit element 63 is a capacitor or a sensor to acquire information on surrounding environment. As for such a sensor, a temperature sensor, an optical sensor, a vibration sensor, an acceleration sensor, a pressure sensor and the like are available. Alternatively, an operation unit such as an MPU, or the like may be provided as the circuit element 63.

Figure 6B:
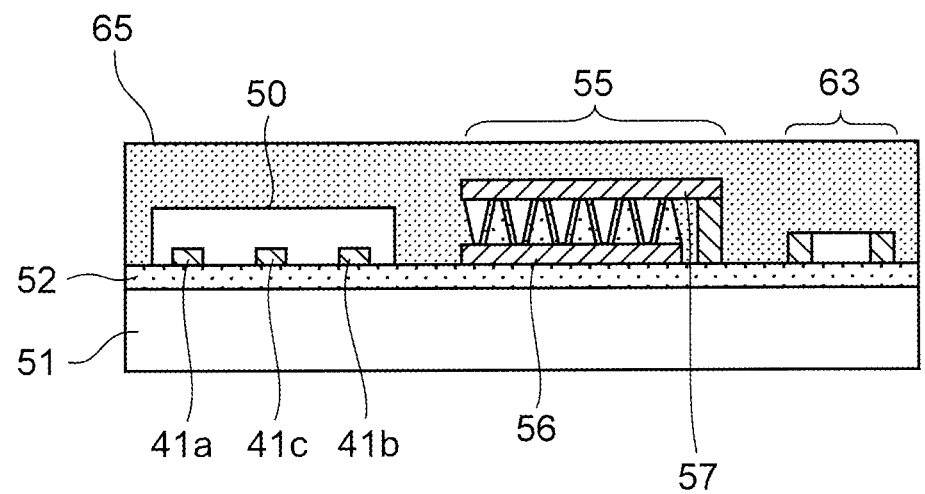

Next, as illustrated in FIG. 6B, the electric storage unit 50, the power generating element 55 and the circuit element 63 described above are covered with a resin layer 65 made of thermosetting epoxy resin or the like. Then, the resin layer 65 is thermally cured by heating.

Figure 6C:
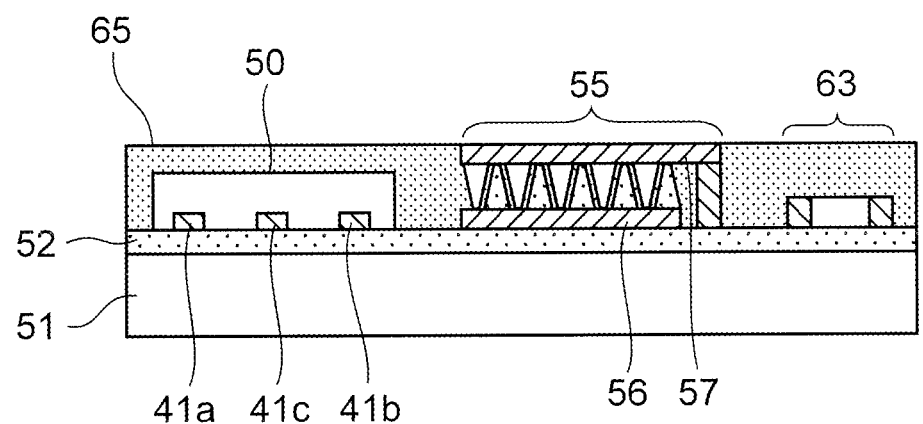

Thereafter, as illustrated in FIG. 6C, the surface of the resin layer 65 is ground or polished to expose the surface of the second electrode 5 of the power generating element 55 from the resin layer 65.

Figure 6D:
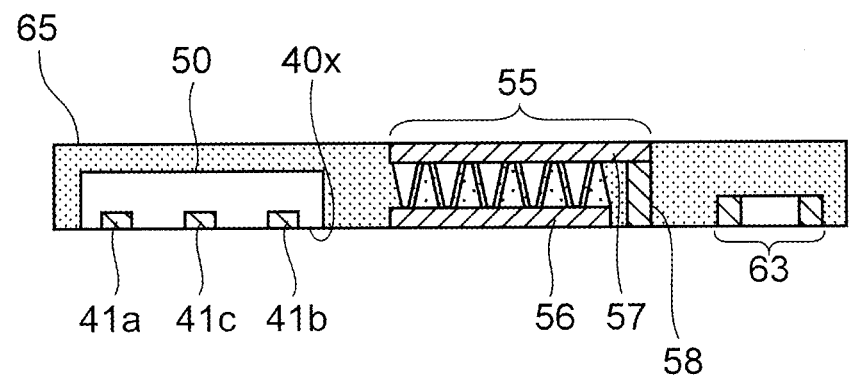

Subsequently, as illustrated in FIG. 6D, after the adhesive force of the adhesive layer 52 is reduced by heating or ultraviolet irradiation, the resin layer 65 is removed from the temporarily fixed substrate 51. Thus, in the electric storage unit 50, the first to third terminals 41a to 41c are exposed again on the upper surface 40x of the sealing layer 40. Moreover, the first electrode 56 of the power generating element 55 and the circuit element 63 are also exposed on the same side as the terminals 41a to 41c.

Figure 6E:
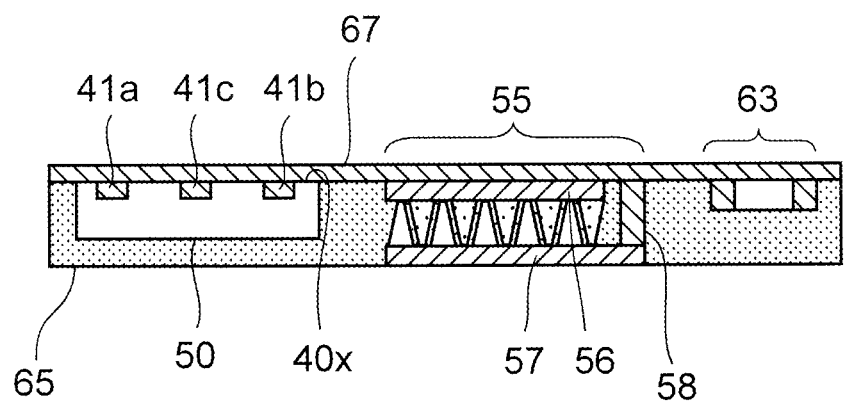

Thereafter, as illustrated in FIG. 6E, an unillustrated electroless copper plated film is formed as a seed layer on the upper surface 40x of the sealing layer 40 and the respective terminals 41a to 41c. Then, a copper plated film is formed as a conductive layer 67 on the seed layer by electrolytic plating. The thickness of the conductive layer 67 is not particularly limited. However, it is preferable that the conductive layer 67 is formed to have a thickness as thin as possible to miniaturize a wiring layer formed of the conductive layer 67. In the present embodiment, the conductive layer 67 is formed to have a thickness of about 0.1 μm to 1 μm.

The conductive layer 67 is also formed on the exposed first electrode 56 and circuit element 63.

Here, the respective terminals 41a to 41c in the electric storage unit 50 are electrically short-circuited from each other by the conductive layer 67. However, as described with reference to FIG. 5, the first transistor TR1 is turned off, and thus no current flows through the first all-solid-state secondary cell C1. Accordingly, over discharge of the first all-solid-state secondary cell C1 due to the conductive layer 67 can be prevented. As a result, the life of the first all-solid-state secondary cell C1 can be prevented from being shortened.

Figure 6F:
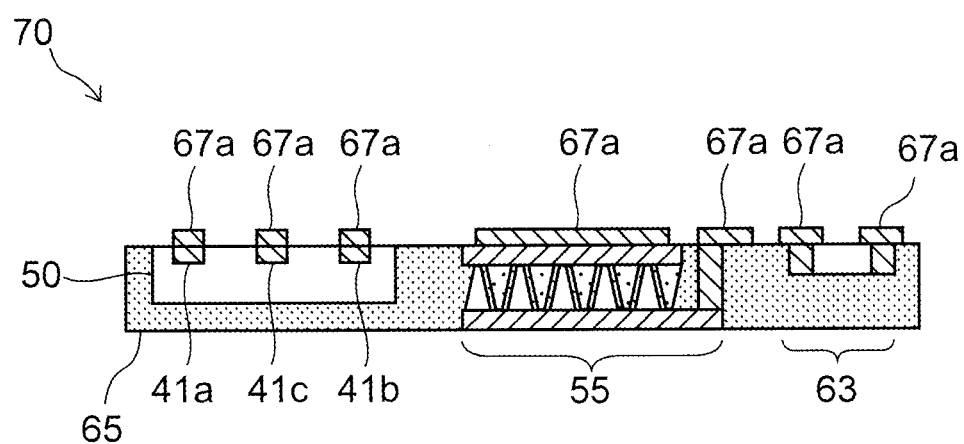

Next, as illustrated in FIG. 6F, the conductive layer 67 is patterned by dry etching using an unillustrated resist film as a mask, thereby forming a wiring layer 67a.

The wiring layer 67a electrically connects the respective terminals 41a to 41c in the electric storage unit 50, the power generating element 55 and the circuit element 63 to each other in a predetermined circuit pattern.

Thus, a basic structure of an electronic device 70 is completed, in which the electric storage unit 50, the power generating element 55 and the circuit element 63 are sealed with the resin layer 65.

According to the present embodiment described above, as described with reference to FIG. 6E, when the respective terminals 41a to 41c in the electric storage unit 50 are electrically short-circuited by the conductive layer 67, the first transistor TR1 (see FIG. 5) in the electric storage unit 50 is turned off. Thus, the first all-solid-state secondary cell C1 can be prevented from being over-discharged by the current flowing through the first all-solid-state secondary cell C1 in the course of manufacturing of the electronic device 70.

Furthermore, compared with the case where the electric storage unit 50, the power generating element 55 and the circuit element 63 are mounted on a wiring substrate as separate parts, the electronic device 70 can be miniaturized in the present embodiment in which the electric storage unit 50, the power generating element 55 and the circuit element 63 are collectively sealed with the resin layer 65.

Moreover, the conductive layer 67, which is thinly formed by electrolytic plating or the like, is advantageous for miniaturization of the wiring layer 67a. Thus, the electronic device 70 can be further miniaturized.

Second Embodiment

In the equivalent circuit illustrated in FIG. 5 according to the first embodiment, the first transistor TR1 is turned on by applying a negative voltage to the gate of the first transistor TR1 to take power out of the first all-solid-state secondary cell C1 in actual usage.

On the other hand, in the present embodiment, description is given of an electronic device in which a voltage to be applied to a gate to take currents out of the first all-solid-state secondary cell C1 can have a positive potential.

Figure 7A:
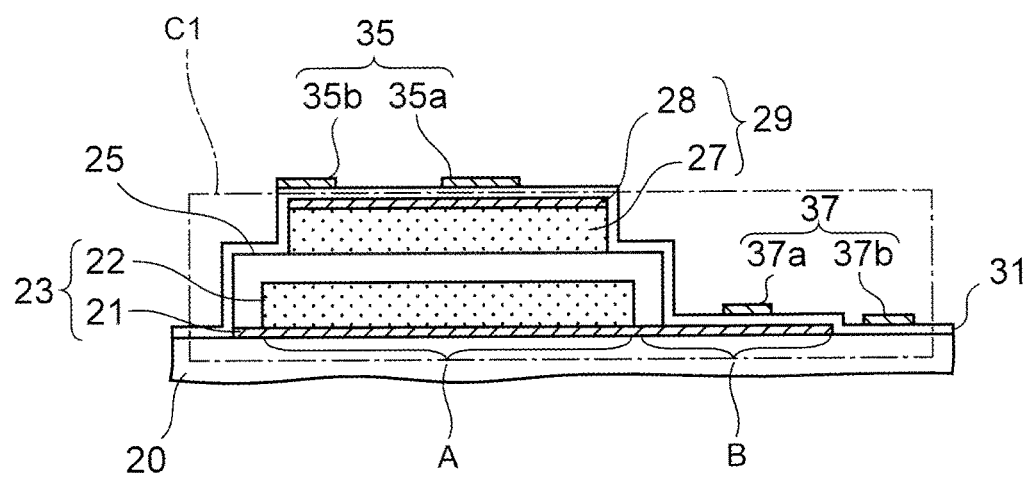
FIGS. 7A to 7H are cross-sectional views of an electronic device in the course of manufacturing according to a second embodiment.
Figure 7B:
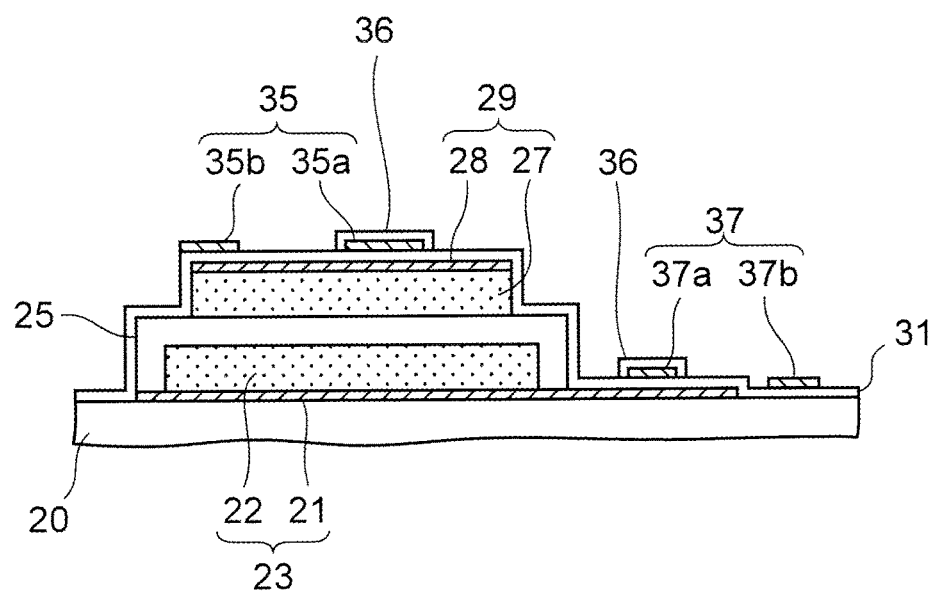
Figure 7C:
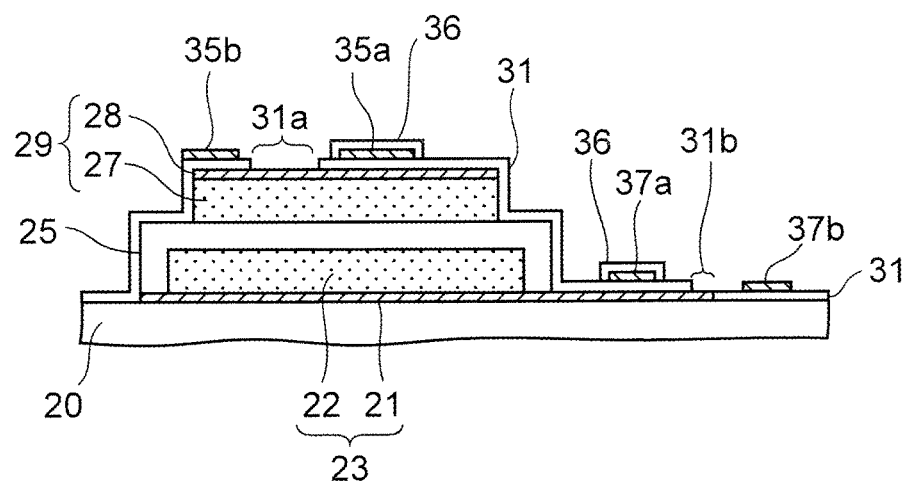
Figure 7D:
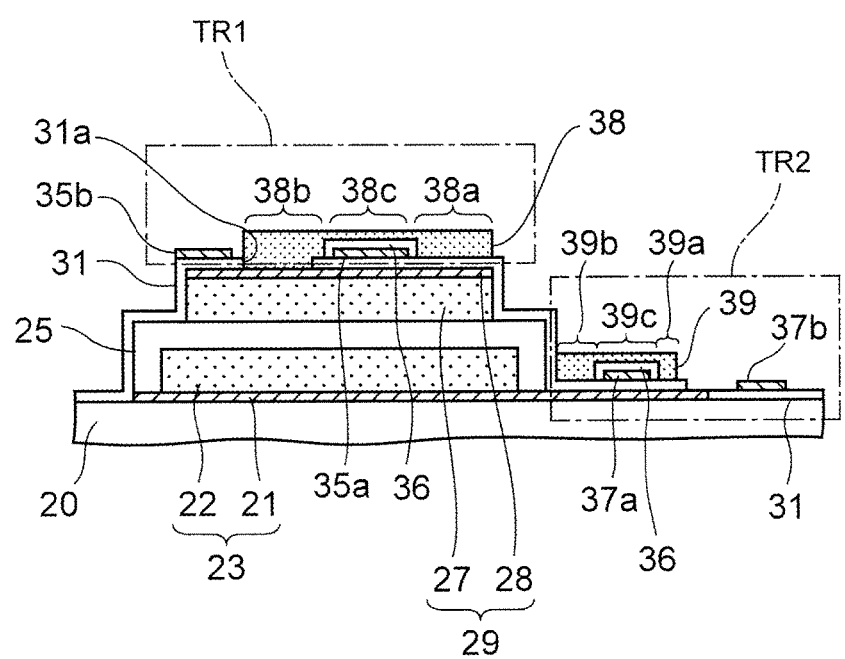
Figure 7E:
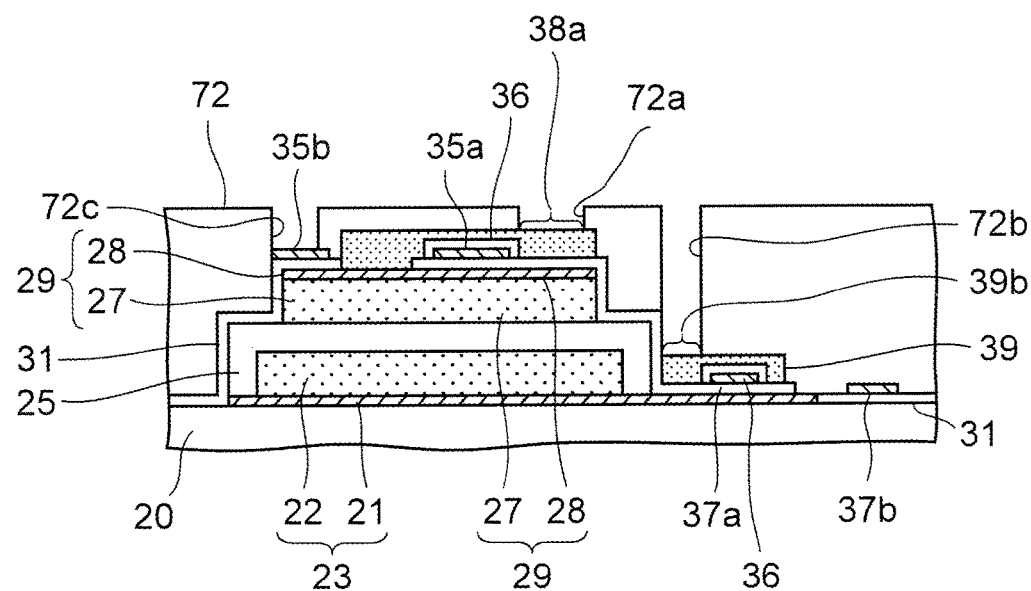
Figure 7F:
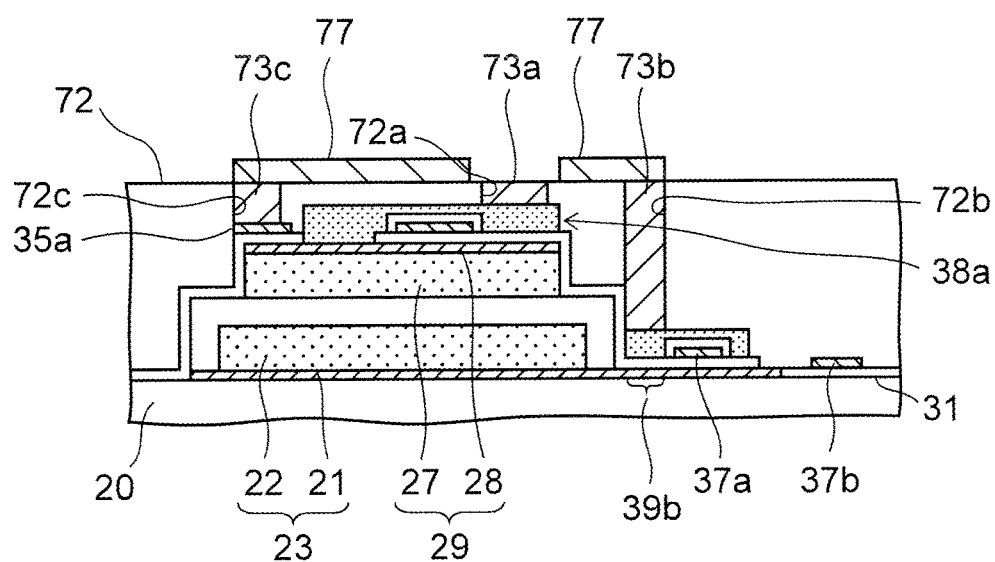
Figure 7G:
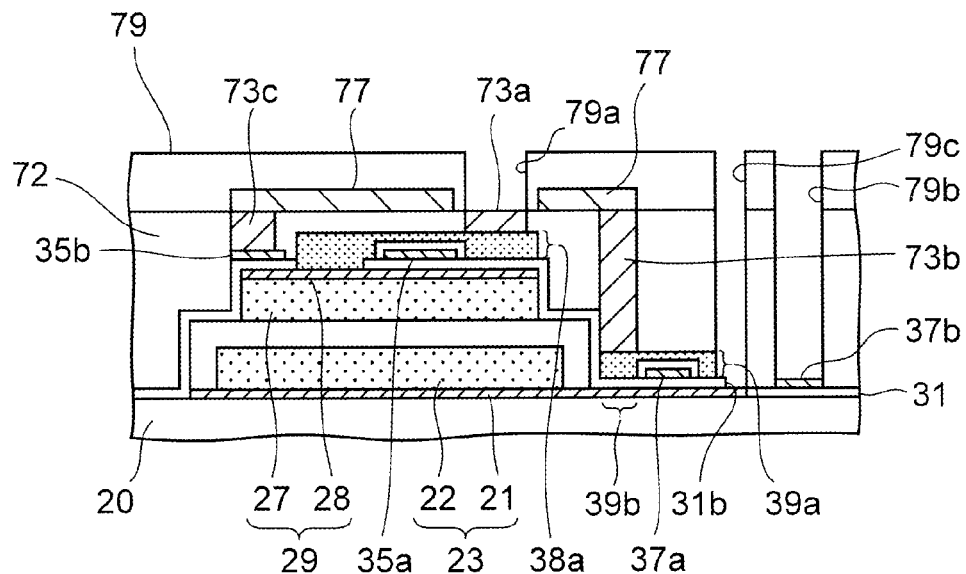
Figure 7H:
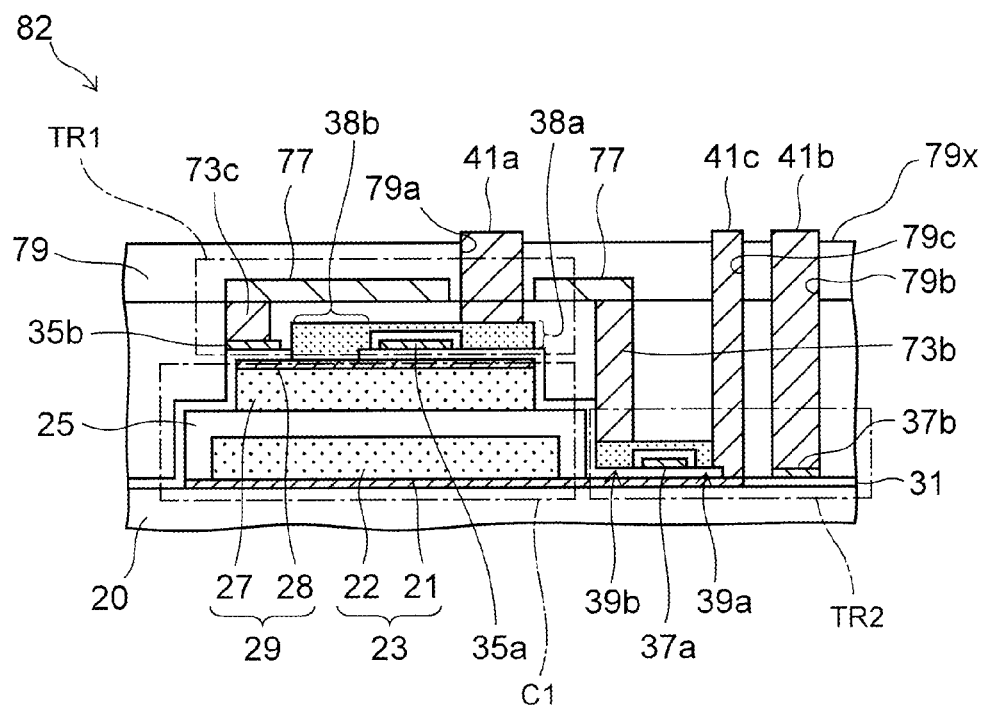
Figure 8A:
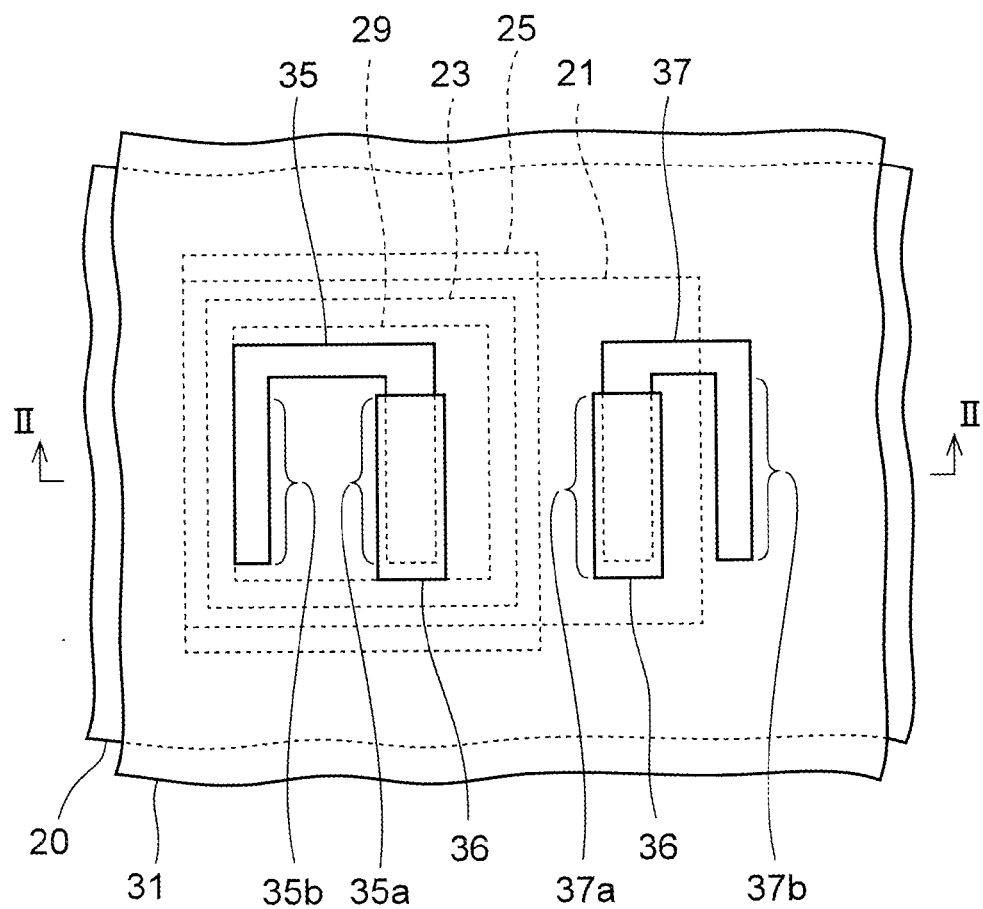
FIGS. 8A to 8C are a plan views of the electronic device in the course of manufacturing thereof according to the second embodiment.
Figure 8B:
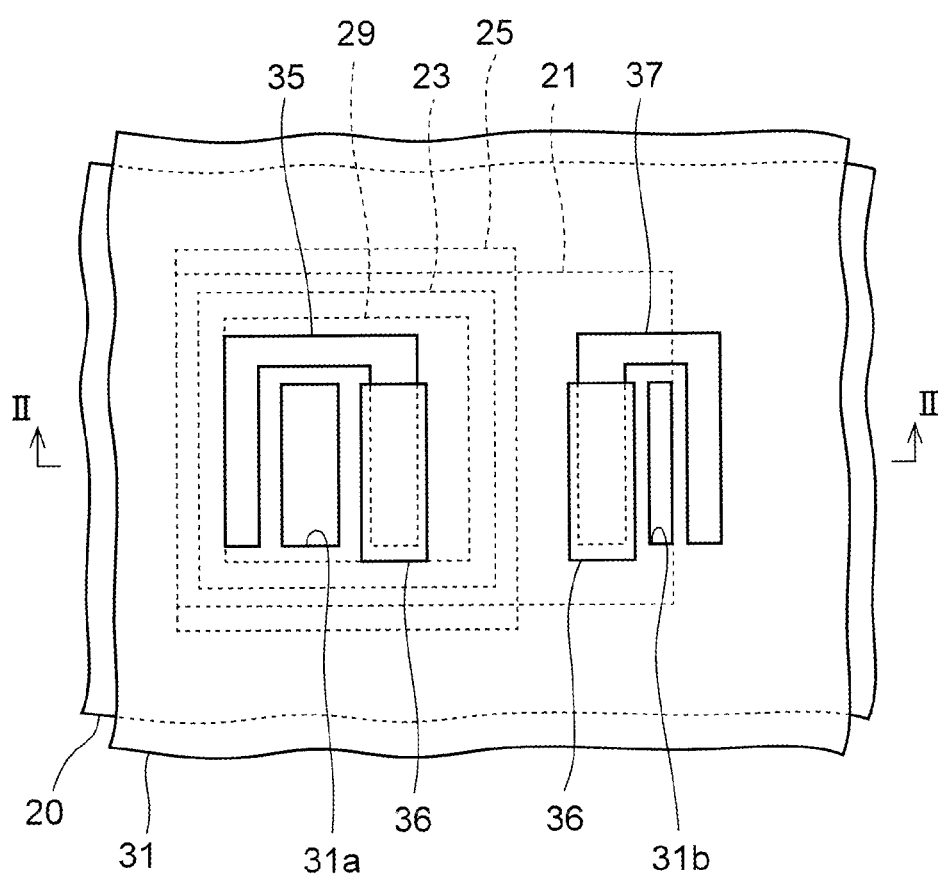
Figure 8C:
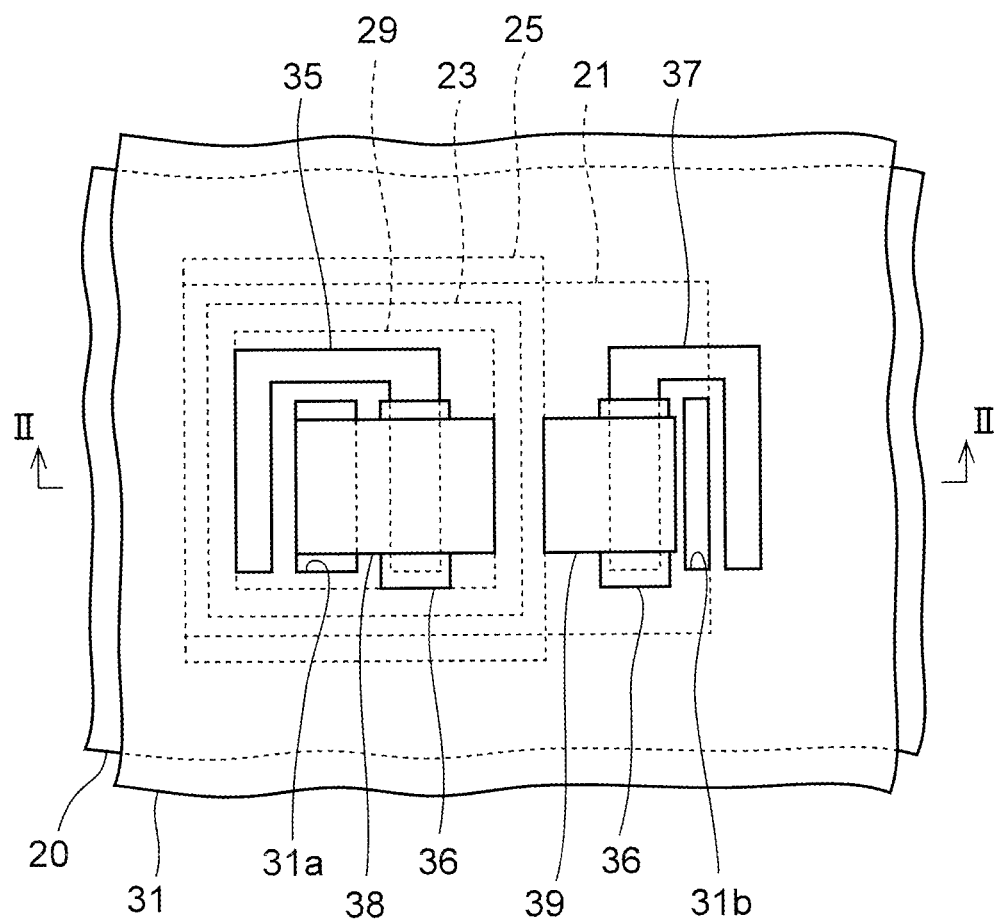

FIGS. 7A to 7H are cross-sectional views of the electronic device in the course of manufacturing according to the present embodiment, and FIGS. 8A to 8C are plan views thereof. Note that the cross-sectional views of FIGS. 7A to 7H correspond to cross-sectional views taken along the line II-II in FIGS. 8A to 8C.

Moreover, in FIGS. 7A to 7H and 8A to 8C, the same elements as those described in the first embodiment are denoted by the same reference numerals as those in the first embodiment, and description thereof is omitted below.

First, the steps illustrated in FIGS. 3A to 3F described in the first embodiment are performed to obtain a structure in which a first all-solid-state secondary cell C1 and a first gate electrode 35 are formed on a silicon substrate 20, as illustrated in FIG. 7A.

Note that, in the present embodiment, a second gate electrode 37 is formed beside the first all-solid-state secondary cell C1 by performing the same step as that of the first gate electrode 35.

The second gate electrode 37 has a gate body 37a over the positive electrode collecting layer 21 in a second region B. Also, second gate electrode 37 has an extension portion 37b over the silicon substrate 20 beside the second region B.

Next, as illustrated in FIG. 7B and FIG. 8A, an alumina film is formed to have a thickness of about 0.05 μm to 0.5 μm as a gate insulating film 36 on the entire upper surface of the silicon substrate 20. Then, the gate insulating film 36 is patterned and removed from on the extension portions 35b and 37b of the first and second gate electrodes 35 and 37, and is thus left only on the gate bodies 35a and 37a.

As in the case of the first embodiment, the patterning of the gate insulating film 36 may be performed by dry etching using an unillustrated resist film as a mask or by using the liftoff technique.

As illustrated in FIG. 8A, the second gate electrode 37 has a U-shape having the gate body 37a and the extension portion 37b facing each other.

Subsequently, as illustrated in FIG. 7C and FIG. 8B, the insulating film 31 is patterned to form a first opening 31a in which a negative electrode layer 29 is exposed in the insulating film 31 at one side of the gate body 35a of the first gate electrode 35. At the same time, a second opening 31b is formed, in which a positive electrode layer 23 is exposed, in the insulating film 31 at one side of the gate body 37a of the second gate electrode 37.

Note that the patterning of the insulating film 31 is performed by dry etching using an unillustrated resist film as a mask and using mixed gas of $CF_4$ gas and argon gas as etching gas.

Next, as illustrated in FIG. 7D and FIG. 8C, an n type first semiconductor layer 38 is formed to have a thickness of about 0.05 μm to 0.5 μm over the negative electrode layer 29, using the sputtering method and the liftoff technique.

The n type first semiconductor layer 38 has a first source drain 38a, a second source drain 38b and a channel 38c, and forms an n type first transistor TR1 in cooperation with the first gate electrode 35.

As for an n type semiconductor material which can be used as a material of the first semiconductor layer 38, an oxide semiconductor is available, which contains any of zinc (Zn), indium (In) and gallium (Ga). As for such an n type oxide semiconductor, zinc oxide (ZnO), IGZO ($InGaZnO_4$) and IZO (InZnO) are available.

Also, the second source drain 38b described above comes into ohmic contact with the negative electrode layer 29 in the first opening 31a in the insulating film 31.

Then, a p type second semiconductor layer 39 is formed to have a thickness of about 0.05 μm to 0.5 μm beside the first all-solid-state secondary cell C1, using the sputtering method and the liftoff technique.

The p type second semiconductor layer 39 includes a third source drain 39a, a fourth source drain 39b and a channel 39c, and forms a p type second transistor TR2 in cooperation with the second gate electrode 37.

While the second transistor TR2 is a MIS field-effect transistor having the gate insulating film 36, a MES field-effect transistor without the gate insulating film 36 may be formed instead of the second transistor TR2. This is also the case for the embodiments to be described later.

As for a material of the p type second semiconductor layer 39, tin oxide (SnO), nickel oxide (NiO), $LiCoO_2$, $CaCoO_2$ and the like, which are described in the first embodiment, are available.

Note that, in the above description, the first semiconductor layer 38 and the second semiconductor layer 39 are patterned using the liftoff technique. However, the respective semiconductor layers 38 and 39 may be formed on the entire upper surface of the silicon substrate 20 and then patterned by dry etching.

In this case, the respective semiconductor layers 38 and 39 formed on the entire upper surface of the silicon substrate 20 are connected to the positive electrode layer 29 and the negative electrode layer 29 in the respective openings 31a and 31b. Thus, the first all-solid-state secondary cell C1 is short-circuited through the semiconductor layers 38 and 39. At this time, in order to prevent over discharge of the first all-solid-state secondary cell C1, it is preferable that carrier concentrations of the respective semiconductor layers 38 and 39 are set as low as possible.

For example, in the n type first semiconductor layer 38, the carrier concentration in the first semiconductor layer 38 can be lowered by lowering an oxygen concentration as much as possible in a sputtering atmosphere during film formation.

Next, as illustrated in FIG. 7E, an alumina film is formed to have a thickness of about 0.1 μm to 1 μm, using the sputtering method, on the entire upper surface of the silicon substrate 20, and the alumina film is used as an interlayer insulating film 72.

Thereafter, the interlayer insulating film 72 is patterned to form first to third contact holes 72a to 72c. Among these holes, the first contact hole 72a is provided on the first source drain 38a, the second contact hole 72b is provided on the fourth source drain 39b. Then, the third contact hole 72c is provided on the extension portion 35b of the first gate electrode 35.

Note that the patterning of the interlayer insulating film 72 is performed by dry etching using an unillustrated resist film as a mask. For the dry etching, any one of $Cl_2$ gas, $BCl_3$ gas, and gas mixture of $Cl_2$ gas and $BCl_3$ gas can be used as etching gas.

Subsequently, as illustrated in FIG. 7F, a conductive film such as an electrolytic copper plated film is formed on the entire upper surface of the silicon substrate 20. Then, the conductive film is patterned to be left as first to third conductor plugs 73a to 73c in the first to third contact holes 72a to 72c.

The above-described first source drain 38a comes into ohmic contact with the first conductor plug 73a, while the fourth source drain 39b comes into ohmic contact with the second conductor plug 73b. Also, the extension portion 35b of the first gate electrode 35 is connected to the third conductor plug 73c.

Furthermore, an internal wiring 77 is formed on the interlayer insulating film 72, the second conductor plug 73b and the third conductor plug 73c, and the second conductor plug 73b and the third conductor plug 73c are electrically connected by the internal wiring 77. The internal wiring 77 can be formed, for example, by forming an electrolytic copper plated film on the entire upper surface of the silicon substrate 20 and patterning the electrolytic copper plated film.

Next, as illustrated in FIG. 7G, an alumina film is formed to have a thickness of 0.1 μm to 1 μm, using the sputtering method, as a sealing layer 79 on the interlayer insulating film 72 and the internal wiring 77.

Furthermore, the sealing layer 79 and the interlayer insulating film 72 are patterned to form first to third holes 79a to 79c. Among these holes, the first hole 79a is formed on the first conductor plug 73a, and the second hole 79b is formed on the extension portion 37b of the second gate electrode 37.

Moreover, the third hole 79c is formed on the second opening 31b in the insulating film 31, and the third source drain 39a and the positive electrode layer 23 are exposed from the third hole 79c.

Note that the patterning of the interlayer insulating film 72 is performed by dry etching using an unillustrated resist film as a mask and using any one of $Cl_2$ gas, $BCl_3$ gas, and gas mixture of $Cl_2$ gas and $BCl_3$ gas as etching gas.

Next, as illustrated in FIG. 7H, after metal film is formed in the holes 79a to 79c by an electrolytic plating method, the metal film is patterned to be left as first to third terminals 41a to 41c in the holes 79a to 79c, respectively. As for a material of the metal film, nickel, copper, gold and the like are available, for example.

Among these terminals, the third terminal 41c is electrically connected to the positive electrode layer 23 and the third source drain 39a, while the first terminal 41a is electrically connected to the first source drain 38a.

Then, the second terminal 41b is connected to the extension portion 37b of the second gate electrode 37. The second transistor TR2 is turned on by controlling the potential of the second terminal 41b. Thus, a voltage of the third source drain 39a in the second transistor TR2 can be applied to the first gate electrode 35 of the first transistor TR1.

Thus, a basic structure of an electric storage unit 82 according to the present embodiment is completed, which includes the first all-solid-state secondary cell C1, the first transistor TR1 and the second transistor TR2.

In the electric storage unit 82, the first to third terminals 41a to 41c are exposed from an upper surface 79x of the sealing layer 79 as illustrated in FIG. 7H.

Thereafter, the electronic device 70 as illustrated in FIG. 6F is completed by performing the steps illustrated in FIGS. 6A to 6F described in the first embodiment.

Figure 9:
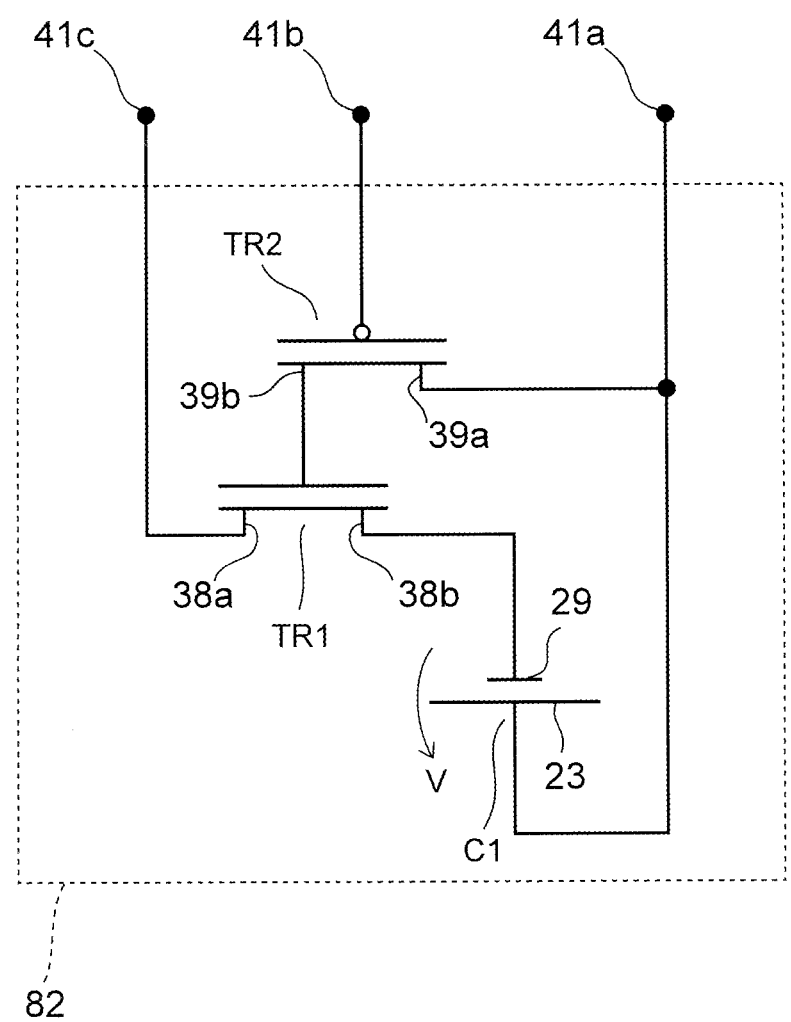
FIG. 9 is an equivalent circuit diagram of an electric storage unit included in the electronic device according to the second embodiment.

FIG. 9 is an equivalent circuit diagram of the electric storage unit 82 described above.

As in the case of the first embodiment, the first transistor TR1 is provided on the negative electrode side of the first all-solid-state secondary cell C1, and functions as a low-side switch to shut off the current flowing into the first all-solid-state secondary cell C1.

Here, when the second terminal 41b and the first terminal 41a are short-circuited, a positive potential of the first all-solid-state secondary cell C1 is applied to the gate of the second transistor TR2. As a result, the second transistor TR2 having a p conductivity type is turned off. Thus, the positive potential V of the first all-solid-state secondary cell C1 does not appear in the fourth source drain 39b of the second transistor TR2. Therefore, when the second terminal 41b and the first terminal 41a are short-circuited as described above, the first transistor TR1 having the n conductivity type is turned off. Thus, no current flows into the first all-solid-state secondary cell C1, making it possible to prevent over discharge of the first all-solid-state secondary cell C1.

Also, in order to take power out of the first all-solid-state secondary cell C1 in actual usage, the first transistor TR1 may be turned on by turning on the second transistor TR2 and thus applying the positive potential V of the cell C1 to the gate of the first transistor TR1.

In this example, the positive potential V of the cell C1 is applied to the third source drain 39a of the second transistor TR2. Thus, the second transistor TR2 is turned on by applying a voltage lower than the positive potential V to the gate of the second transistor TR2.

Thus, it is not required to generate a negative voltage as a gate voltage in order to turn on the second transistor TR2. Therefore, the second transistor TR2 can be turned on at a positive voltage of 0 to V.

According to the present embodiment described above, even when the second terminal 41b and the first terminal 41a are short-circuited, no current flows through the first all-solid-state secondary cell C1. Thus, as in the case of the first embodiment, over discharge of the cell C1 can be prevented in the course of manufacturing of the electronic device 70.

Moreover, the voltage to be applied to the gate of the second transistor TR2 to turn on the second transistor TR2 needs to be only the positive voltage of 0 to V. Thus, unlike the first embodiment, it is not required to generate a negative voltage, and thus a circuit for generating a negative voltage can be eliminated.

Third Embodiment

In the first and second embodiments, the transistor for the switch to shut off the current flowing through the all-solid-state secondary cell is the low-side switch provided on the negative electrode side of the all-solid-state secondary cell. On the other hand, in the present embodiment, description is given of a high-side switch provided on the positive electrode side of the all-solid-state secondary cell.

FIGS. 10A to 10F are cross-sectional views of an electronic device in the course of manufacturing according to the present embodiment, and FIGS. 11A to 11E are plan views thereof. Note that the cross-sectional views of FIGS. 10A to 10F correspond to cross-sectional views taken along the line III-III in FIGS. 11A to 11E.

Moreover, in FIGS. 10A to 10F and 11A to 11E, the same elements as those described in the first and second embodiments are denoted by the same reference numerals as those in the first and second embodiments, and description thereof is omitted below.

Figure 10A:
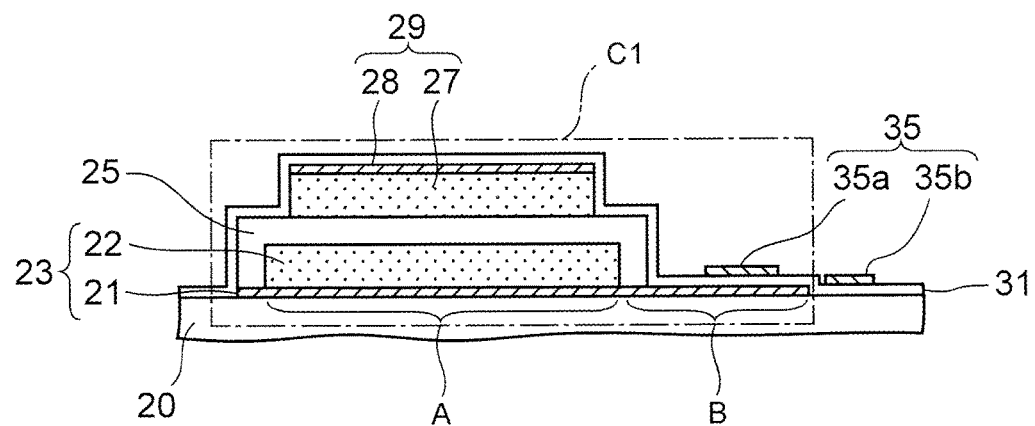
FIGS. 10A to 10F are cross-sectional views of an electronic device in the course of manufacturing according to a third embodiment.

First, the steps illustrated in FIGS. 3A to 3F described in the first embodiment are performed to obtain a structure in which a first all-solid-state secondary cell C1 and a first gate electrode 35 are formed on a silicon substrate 20, as illustrated in FIG. 10A.

Note that, in the present embodiment, the gate body 35a of the first gate electrode 35 is formed over the positive electrode collecting layer 21 in a second region B, while the extension portion 35b of the gate electrode 35 is formed over the silicon substrate 20 beside the second region B.

Figure 10B:
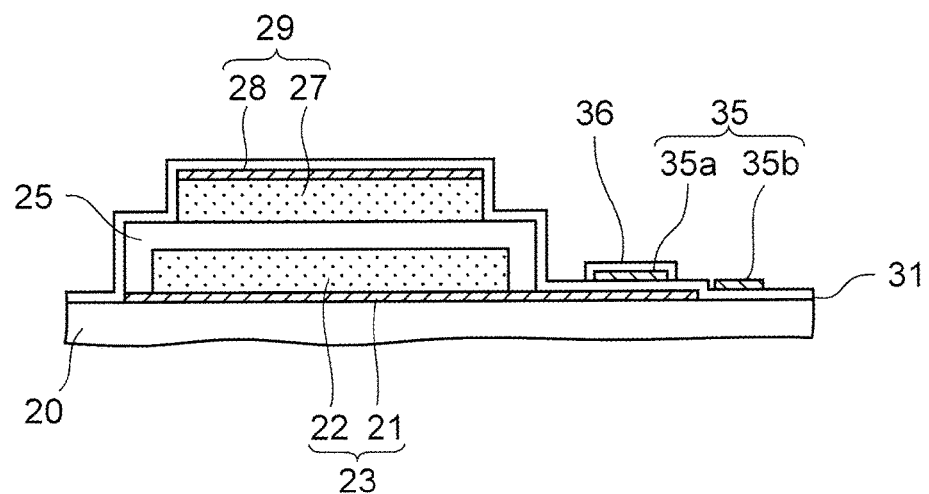
Figure 11A:
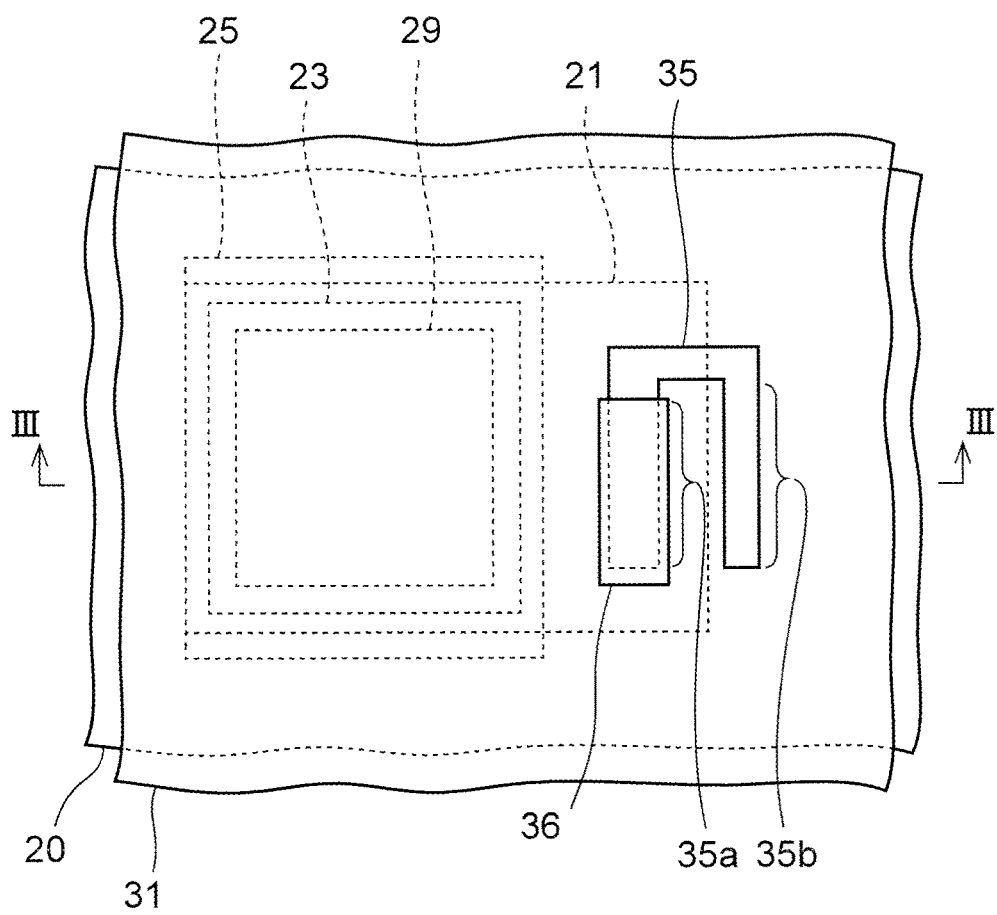
FIGS. 11A to 11E are plan views of the electronic device in the course of manufacturing according to the third embodiment.

Next, as illustrated in FIG. 10B and FIG. 11A, an alumina film is formed to have a thickness of about 0.05 μm to 0.5 μm as a gate insulating film 36 on the entire upper surface of the silicon substrate 20. Then, as in the case of the first and second embodiments, the gate insulating film 36 is patterned and removed from on the extension portion 35b of the first gate electrode 35, and is thus left only on the gate body 35a.

Figure 10C:
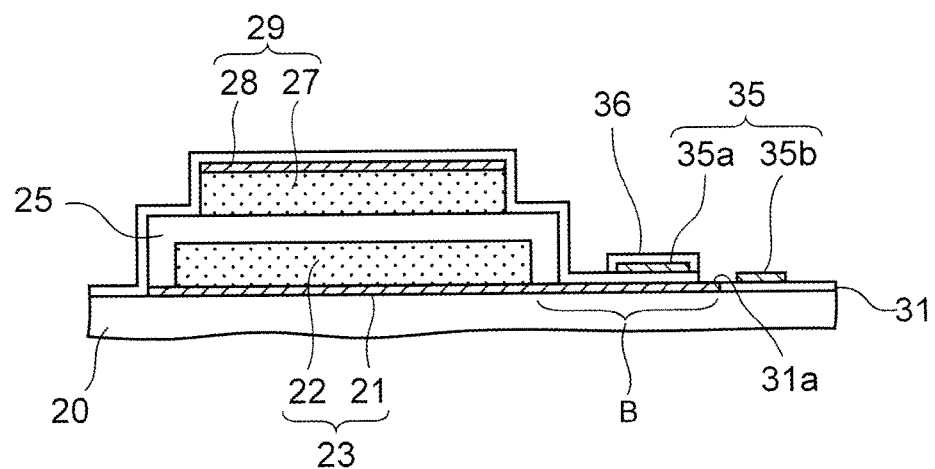
Figure 11B:
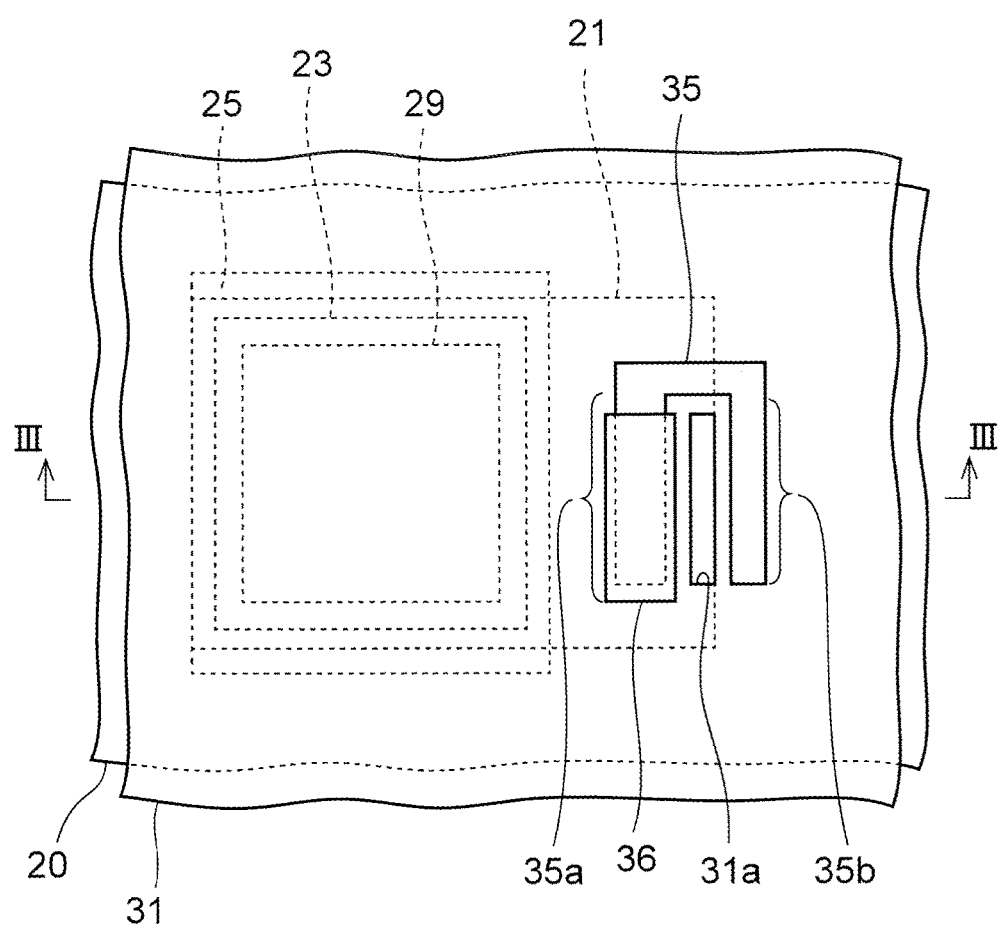

Subsequently, as illustrated in FIG. 10C and FIG. 11B, the insulating film 31 is patterned to form a first opening 31a in which the positive electrode layer 23 is exposed in the insulating film 31 at one side of the gate body 35*a*.

A method for patterning the insulating film 31 is not particularly limited. In the present embodiment, as in the case of the first and second embodiments, the insulating film 31 is patterned by dry etching using an unillustrated resist film as a mask and using mixed gas of $CF_4$ gas and argon gas.

Figure 10D:
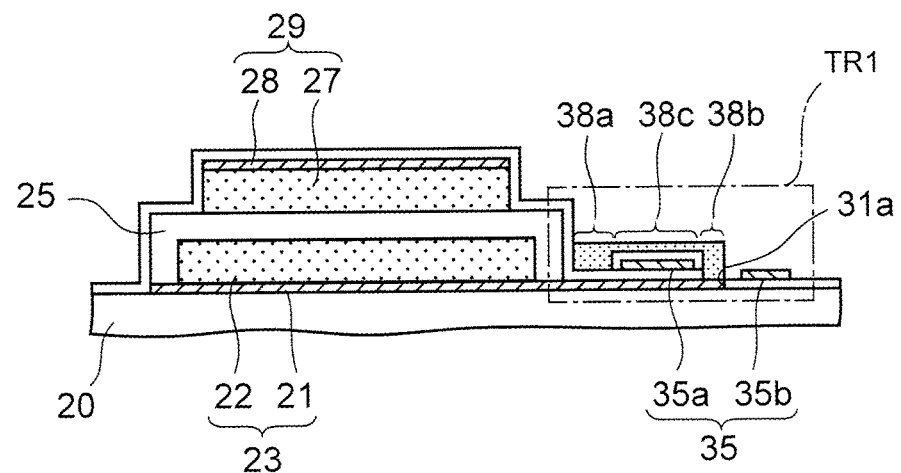
Figure 11C:
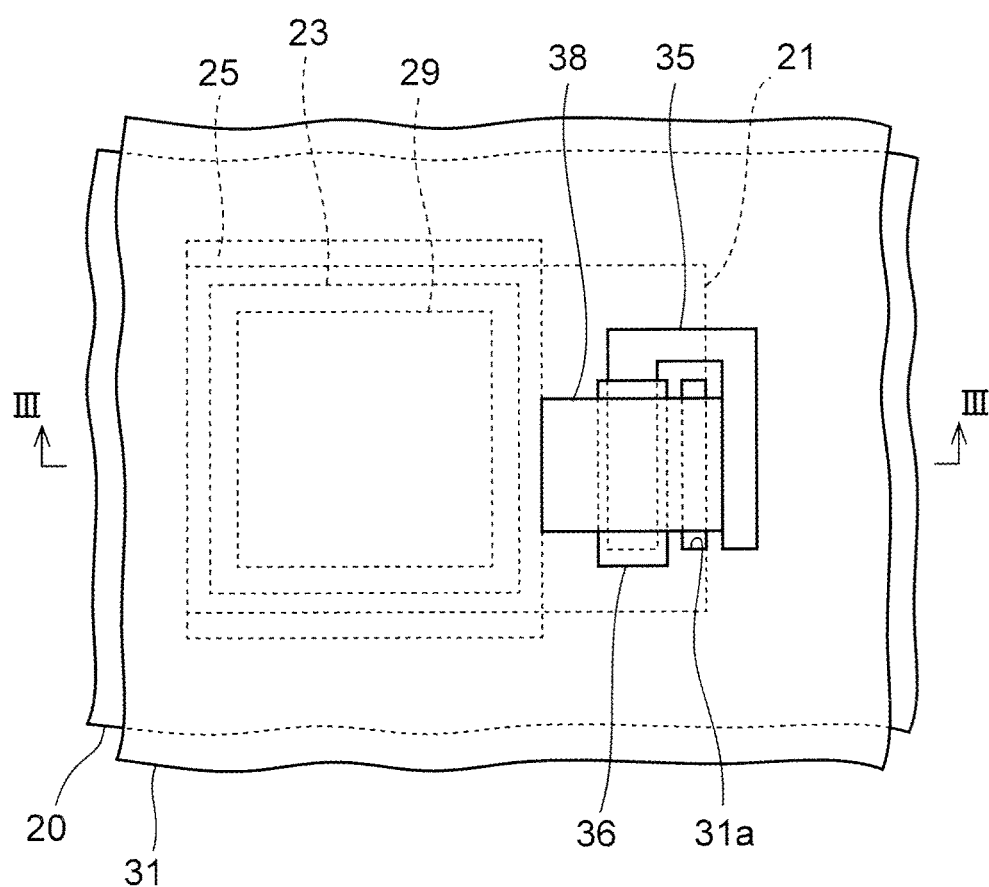

Next, as illustrated in FIG. 10D and FIG. 11C, an n type first semiconductor layer 38 is formed to have a thickness of about 0.05 μm to 0.5 μm beside the first all-solid-state secondary cell C1.

The n type first semiconductor layer 38 includes a first source drain 38*a* formed on the insulating film 31 at one side of the gate body 35*a*, a second source drain 38*b* formed on the insulating film 31 at another side of the gate body 35*a*, and a channel 38*c*.

Also, the first semiconductor layer 38 forms an n type first transistor TR1 in cooperation with the first gate electrode 35 described above.

As for an n type semiconductor material which can be used as a material of the first semiconductor layer 38, an oxide semiconductor is available, which contains any of zinc (Zn), indium (In) and gallium (Ga). As for such an n type oxide semiconductor, zinc oxide (ZnO), IGZO ($InGaZnO_4$) and IZO (InZnO) are available.

Also, the second source drain 38*b* comes into ohmic contact with the positive electrode layer 23 in the first opening 31*a* in the insulating film 31.

Figure 10E:
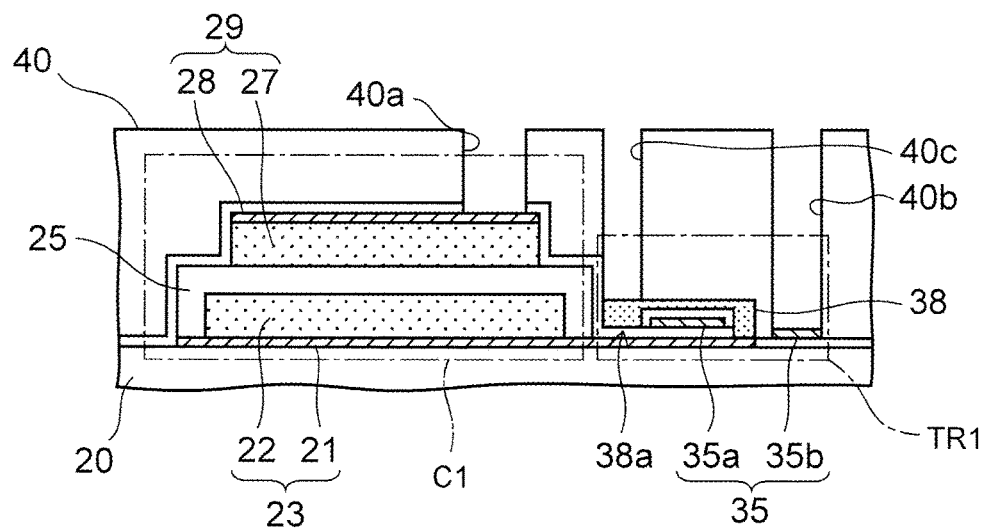
Figure 11D:
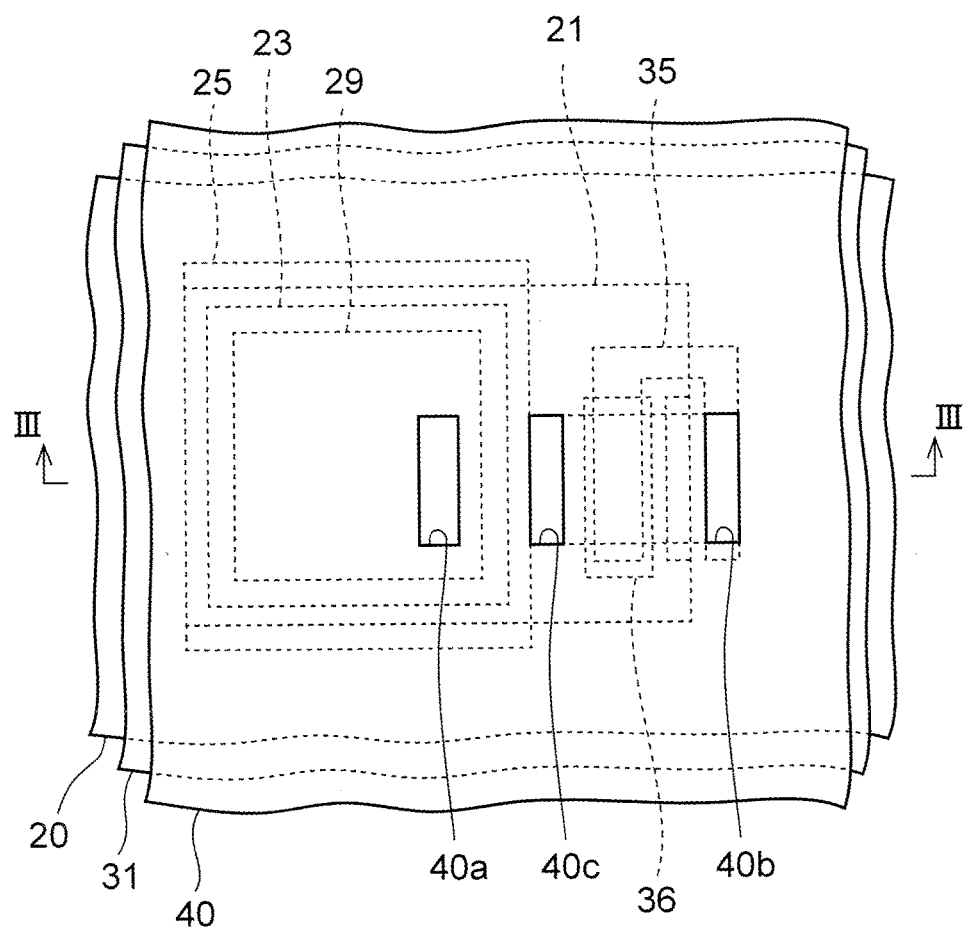

Next, as illustrated in FIG. 10E and FIG. 11D, an alumina film is formed to have a thickness of about 0.1 μm to 1 μm, using the sputtering method, as a sealing layer 40 on the extension portion 35*b* of the first gate electrode 35, the first semiconductor layer 38 and the insulating film 31.

Then, as in the case of the first embodiment, the sealing layer 40 is patterned to form first to third holes 40*a* to 40*c*. Among these holes, the first hole 40*a* is provided on the negative electrode layer 29, and the second hole 40*b* is provided on the extension portion 35*b* of the first gate electrode 35. Also, the third hole 40*c* is provided on the first source drain 38*a* of the first semiconductor layer 38.

Figure 10F:
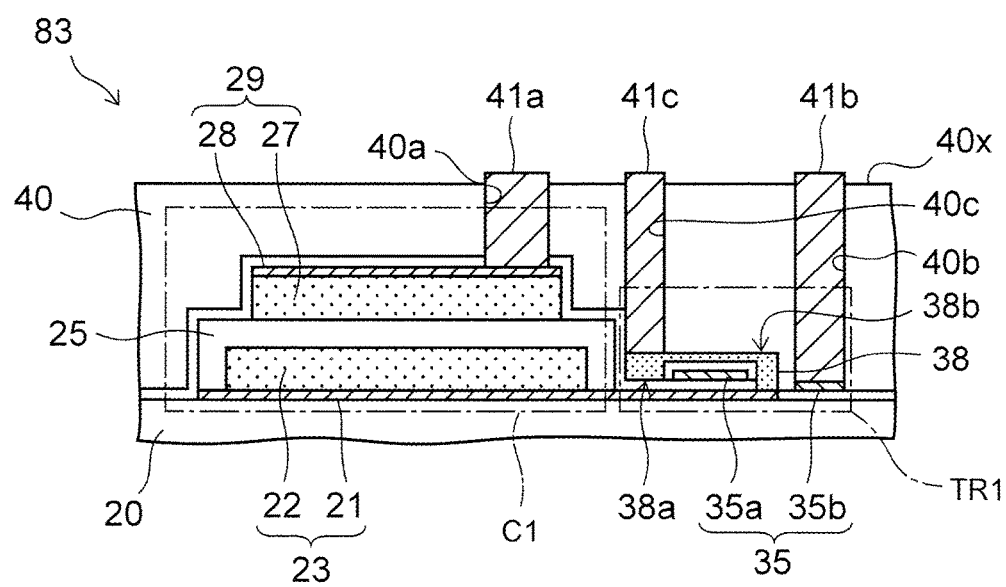
Figure 11E:
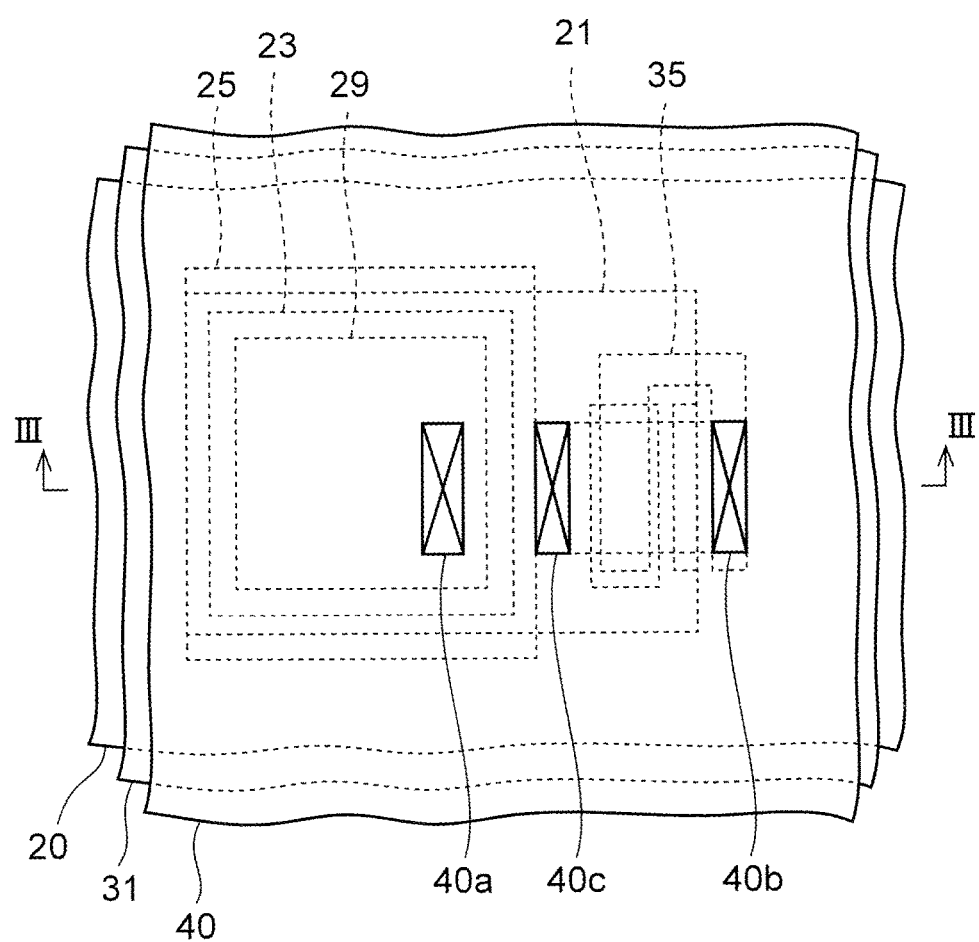

Thereafter, as illustrated in FIG. 10F and FIG. 11E, after a metal film is formed in the holes 40*a* to 40*c* by an electrolytic plating method, the metal film is patterned to be left as first to third terminals 41*a* to 41*c* in the holes 40*a* to 40*c*, respectively. As for a material of the metal film, nickel, copper, gold and the like are available, for example.

Among these terminals, the first terminal 41*a* is electrically connected to the negative electrode layer 29, while the third terminal 41*c* comes into ohmic contact with the first source drain 38*a*.

Then, the second terminal 41*b* is connected to the extension portion 35*b* of the first gate electrode 35, thereby controlling the potential of the first gate electrode 35.

Thus, a basic structure of an electric storage unit according to the present embodiment is completed, which includes the first all-solid-state secondary cell C1 and the first transistor TR1.

In the electric storage unit 83, the first to third terminals 41*a* to 41*c* are exposed from an upper surface 40*x* of the sealing layer 40 as illustrated in FIG. 10F.

Thereafter, the electronic device 70 as illustrated in FIG. 6F is completed by performing the steps illustrated in FIGS. 6A to 6F described in the first embodiment.

Figure 12:
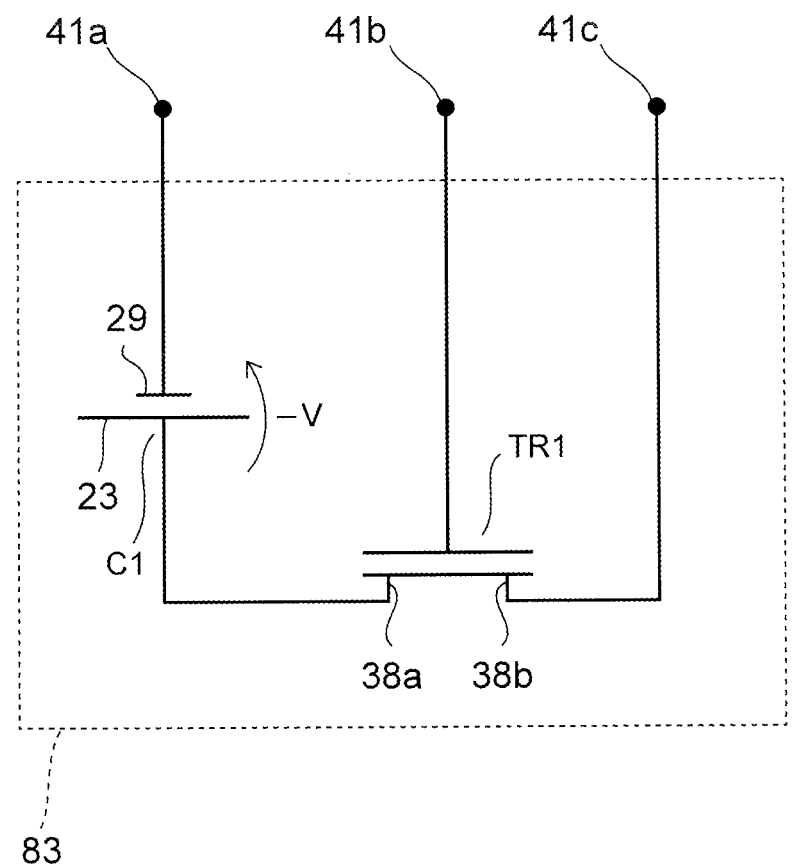
FIG. 12 is an equivalent circuit diagram of an electric storage unit included in the electronic device according to the third embodiment.

FIG. 12 is an equivalent circuit diagram of the electric storage unit 83 described above.

As illustrated in FIG. 12, in the present embodiment, the first transistor TR1 is provided on the positive electrode side of the first all-solid-state secondary cell C1, and the first transistor TR1 shuts off the current flowing into the first all-solid-state secondary cell C1. As described above, the transistor provided on the positive electrode side of the first all-solid-state secondary cell C1 for the purpose of switching is also called the high-side transistor.

Here, when the first terminal 41*a* and the second terminal 41*b* are short-circuited, a negative potential −V of the first all-solid-state secondary cell C1 is applied to the gate of the first transistor TR1. As a result, the first transistor TR1 having an n conductivity type is turned off. Thus, no current flows into the first all-solid-state secondary cell C1, making it possible to prevent over discharge of the first all-solid-state secondary cell C1.

Note that, in order to take power out of the first all-solid-state secondary cell C1 in actual usage, the first transistor TR1 may be turned on by applying a positive voltage higher than a threshold to the gate of the first transistor TR1. Since the positive potential V of the cell C1 is applied to the second source drain 38*b* in the first transistor TR1, the first transistor TR1 is turned on by applying a voltage higher than the positive potential V to the gate of the first transistor TR1.

According to the present embodiment described above, even when the first terminal 41*a* and the second terminal 41*b* are short-circuited, no current flows through the first all-solid-state secondary cell C1. Thus, as in the case of the first embodiment, over discharge of the cell C1 can be prevented in the course of manufacturing of the electronic device 70.

Fourth Embodiment

In the present embodiment, description is given of an electronic device capable of lowering the gate voltage, compared with the third embodiment, to be applied to take power out of the first all-solid-state secondary cell C1 in actual usage, in the case of using the high-side switch as in the case of the third embodiment.

Figure 13A:
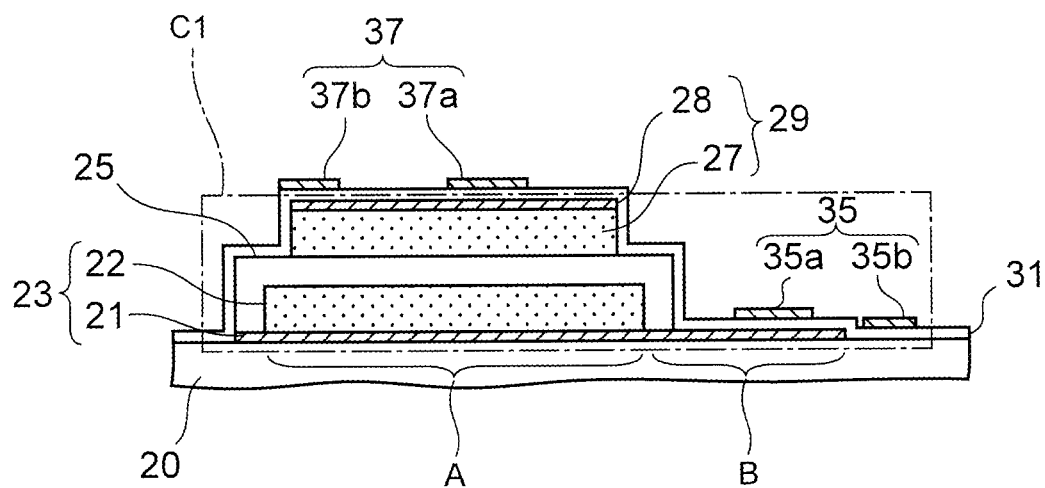
FIGS. 13A to 13H are cross-sectional views of an electronic device in the course of manufacturing according to a fourth embodiment.
Figure 13B:
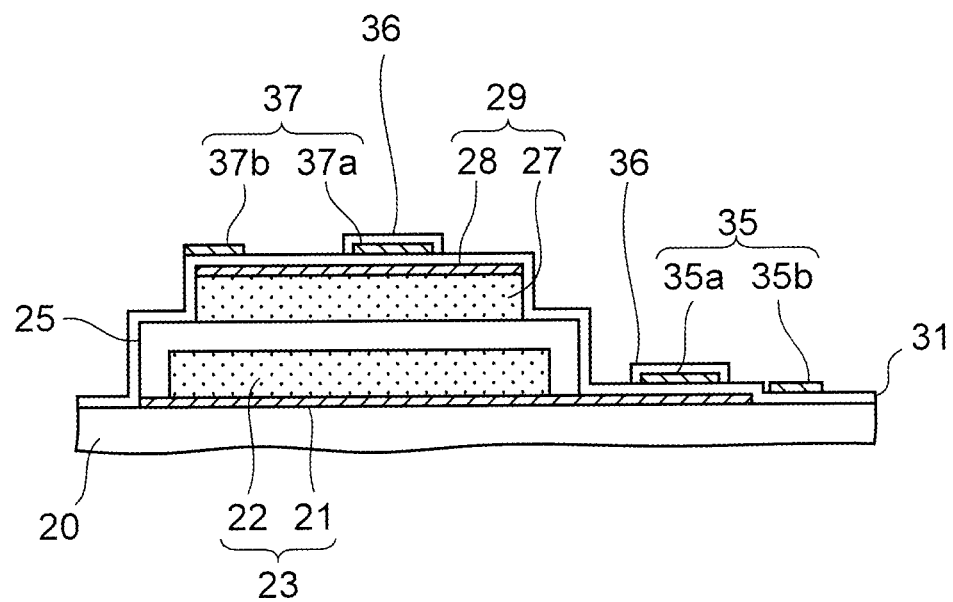
Figure 13C:
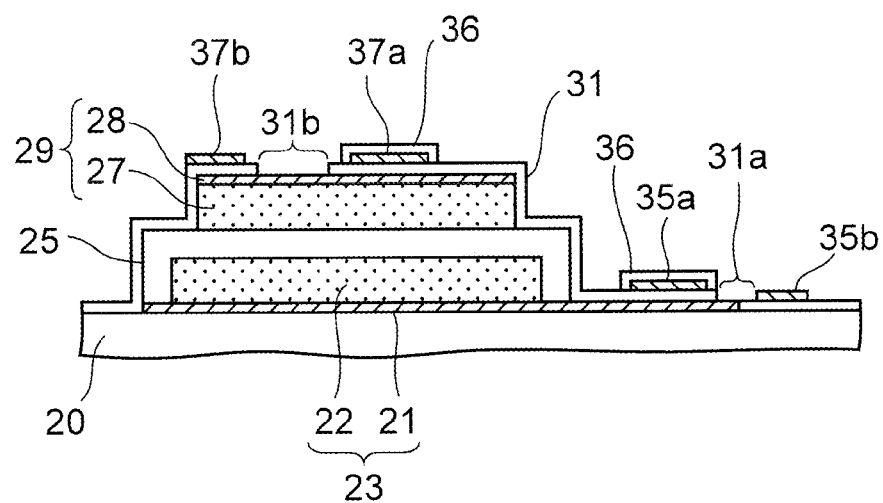
Figure 13D:
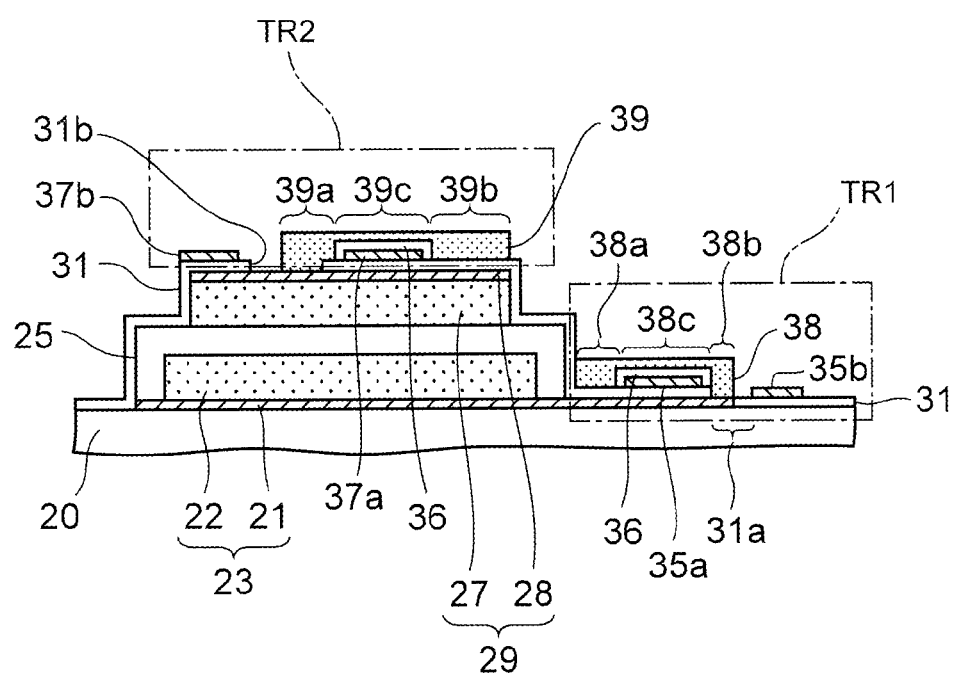
Figure 13E:
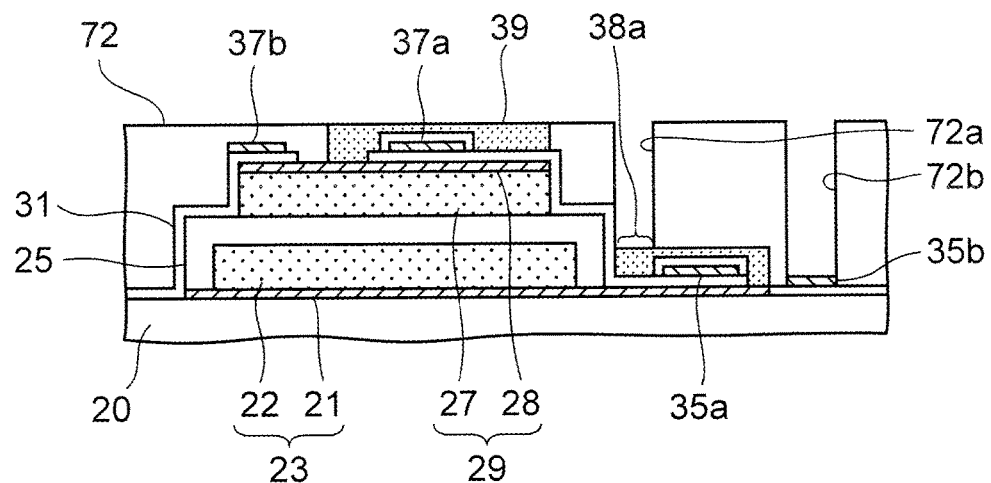
Figure 13F:
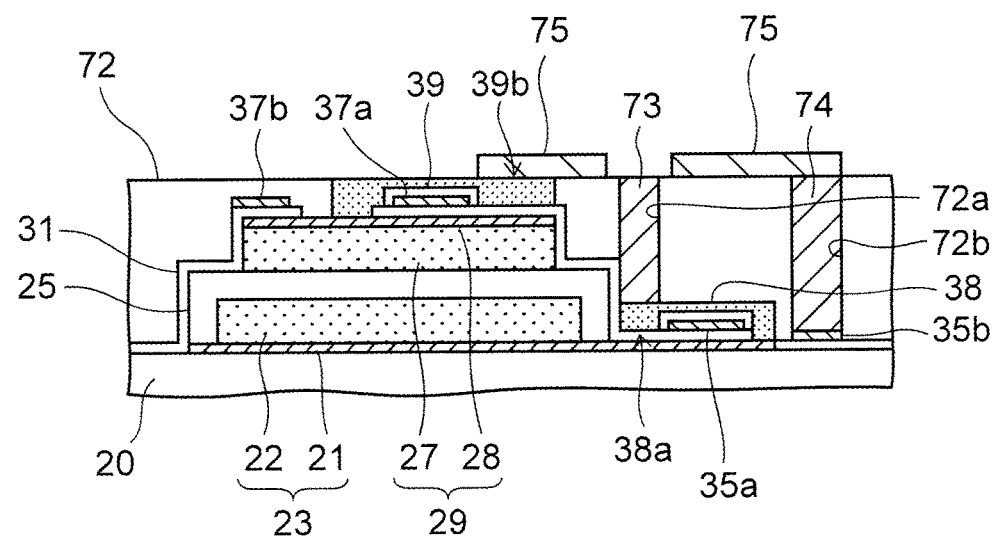
Figure 13G:
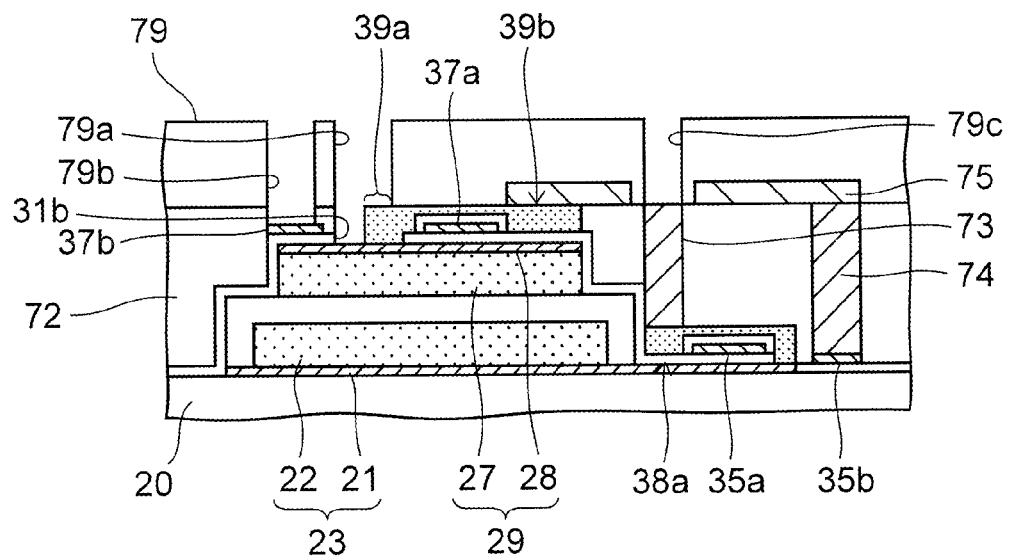
Figure 13H:
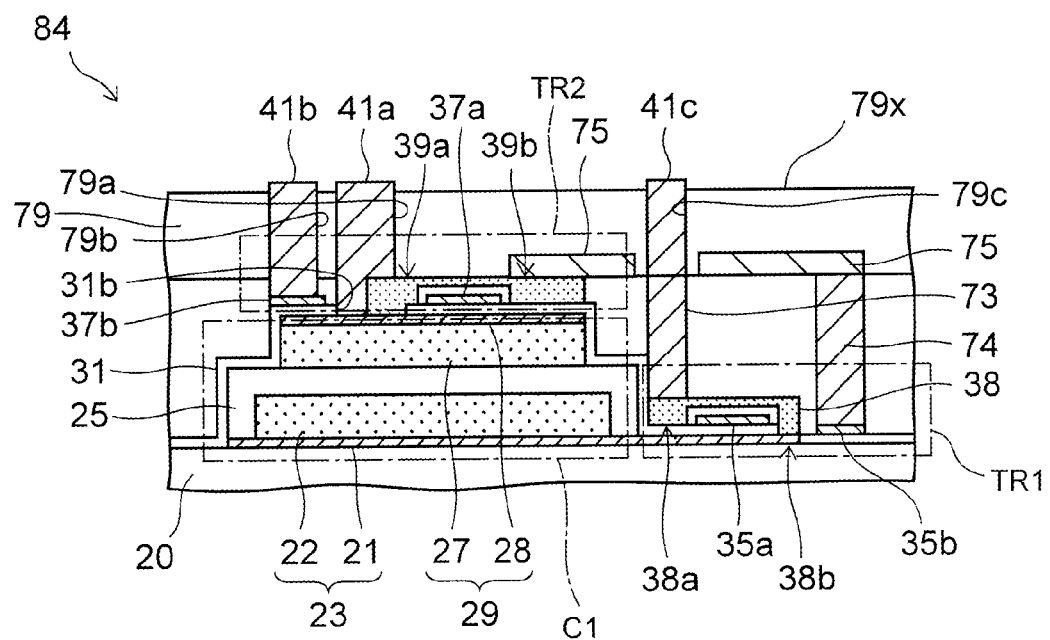
Figure 14A:
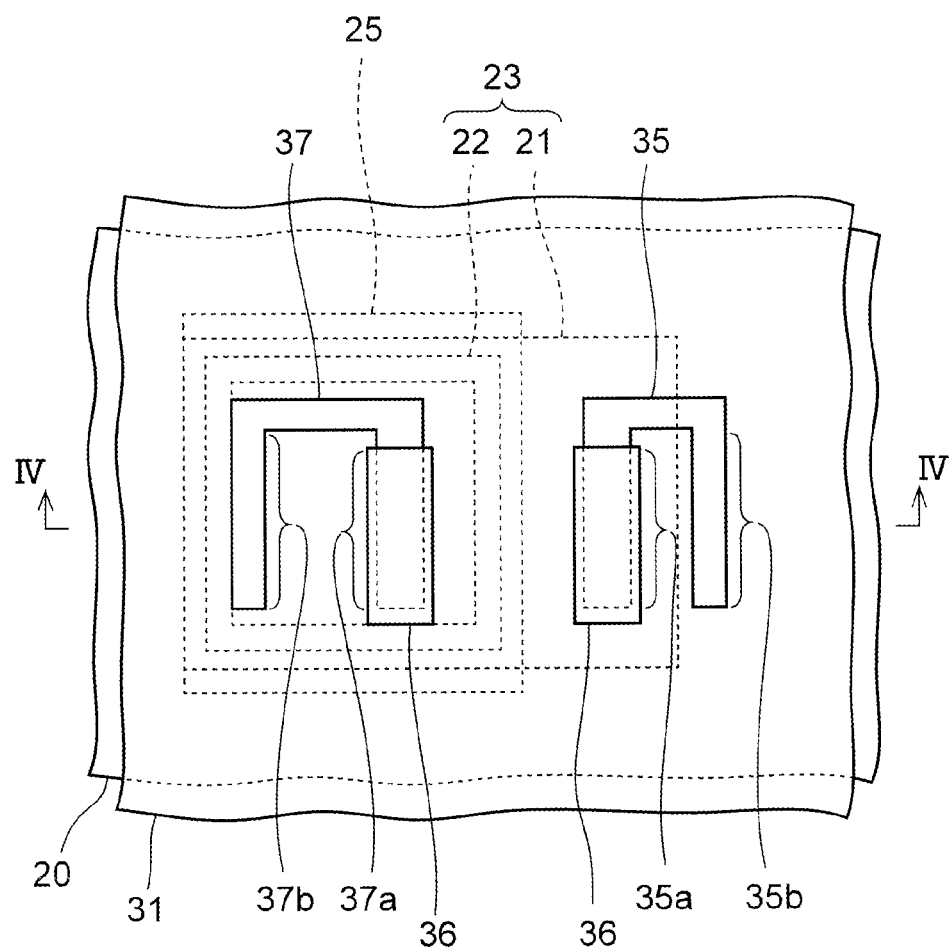
FIGS. 14A to 14C are plan views of the electronic device in the course of manufacturing according to the fourth embodiment.
Figure 14B:
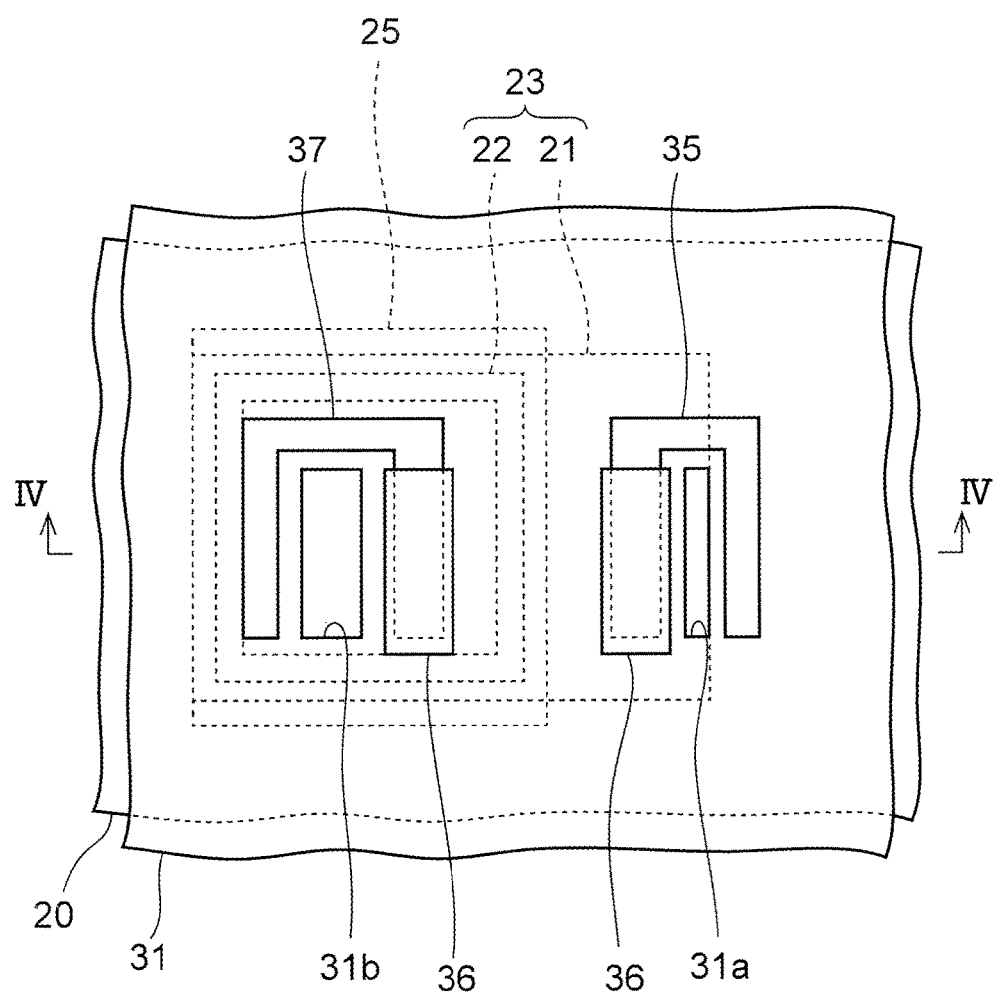
Figure 14C:
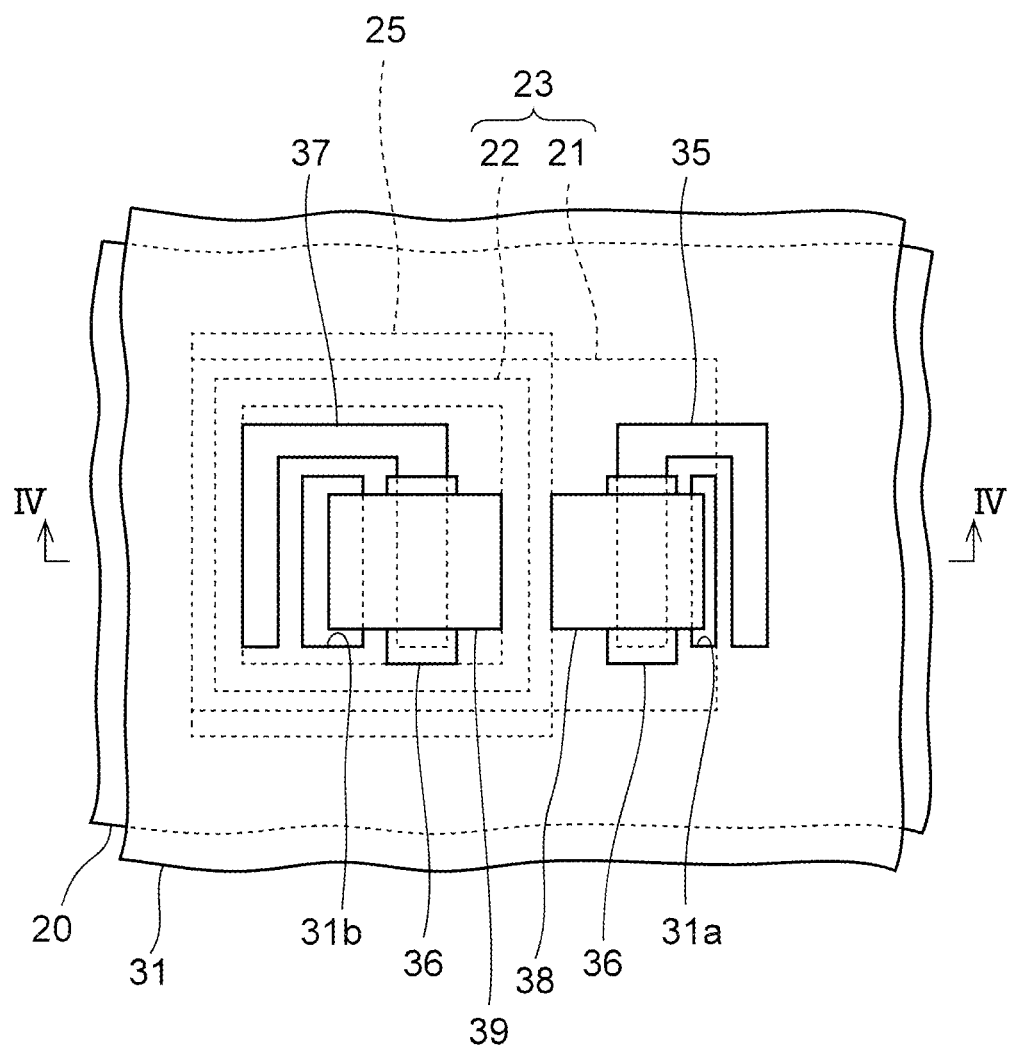

FIGS. 13A to 13H are cross-sectional views of the electronic device in the course of manufacturing according to the present embodiment, and FIGS. 14A to 14C are plan views thereof. Note that the cross-sectional views of FIGS. 13A to 13H correspond to cross-sectional views taken along the line IV-IV in FIGS. 14A to 14C.

Moreover, in FIGS. 13A to 13H and 14A to 14C, the same elements as those described in the first to third embodiments are denoted by the same reference numerals as those in the first to third embodiments, and description thereof is omitted below.

First, the same step as that illustrated in FIG. 10A in the third embodiment is performed to obtain a structure in which a first all-solid-state secondary cell C1 and a first gate electrode 35 are formed on a silicon substrate 20, as illustrated in FIG. 13A.

However, in the present embodiment, a second gate electrode 37 is formed, which includes a gate body 37*a* and an extension portion 37*b* on an insulating film 37 of the first all-solid-state secondary cell C1, by performing the same step as the first gate electrode 35.

Next, as illustrated in FIG. 13B and FIG. 14A, an alumina film is formed to have a thickness of about 0.05 μm to 0.5 μm as a gate insulating film 36 on the entire upper surface of the silicon substrate 20. Then, the gate insulating film 36 is patterned and removed from the extension portions 35*b* and 37*b* of the first and second gate electrodes 35 and 37, and is thus left only on the gate bodies 35*a* and 37*a*.

The patterning of the gate insulating film 36 may be performed by dry etching using an unillustrated resist film as a mask or by using the liftoff technique.

As illustrated in FIG. 14A, the second gate electrode 37 has a U-shape having the gate body 37a and the extension portion 37b facing each other over the negative electrode layer 29.

Subsequently, as illustrated in FIG. 13C and FIG. 14B, the insulating film 31 is patterned to form a first opening 31a in which a positive electrode layer 23 is exposed in the insulating film 31 at one side of the gate body 35a of the first gate electrode 35. At the same time, a second opening 31b is formed, in which the negative electrode layer 29 is exposed in the insulating film 31 at one side of the gate body 37a of the second gate electrode 37.

The patterning of the insulating film 31 is performed by dry etching using an unillustrated resist film as a mask and using mixed gas of $CF_4$ gas and argon gas as etching gas.

Next, as illustrated in FIG. 13D and FIG. 14C, a p type first semiconductor layer 38 is formed to have a thickness of about 0.05 μm to 0.5 μm beside the first all-solid-state secondary cell C1, using the sputtering method and the liftoff technique.

The p type first semiconductor layer 38 includes a first source drain 38a, a second source drain 38b and a channel 38c, and forms a p type first transistor TR1 in cooperation with the first gate electrode 35 described above.

As for a material of the p type first semiconductor layer 38, tin oxide (SnO), nickel oxide (NiO), $LiCoO_2$, $CaCoO_2$ and the like are available.

The second source drain 38b described above comes into ohmic contact with the positive electrode layer 23 in the first opening 31a in the insulating film 31.

Thereafter, an n type second semiconductor layer 39 is formed to have a thickness of about 0.05 μm to 0.5 μm over the negative electrode layer 29.

The n type second semiconductor layer 39 includes a third source drain 39a, a fourth source drain 39b and a channel 39c, and forms an n type second transistor TR2 in cooperation with the second gate electrode 37 described above.

As for an n type semiconductor material which can be used as a material of the second semiconductor layer 39, an oxide semiconductor is available, which contains any of zinc (Zn), indium (In) and gallium (Ga). As for such an n type oxide semiconductor, zinc oxide (ZnO), IGZO ($InGaZnO_4$) and IZO (InZnO) are available.

Also, the third source drain 39a described above comes into ohmic contact with the negative electrode layer 29 in the second opening 31b in the insulating film 31.

Note that, in the above description, the first semiconductor layer 38 and the second semiconductor layer 39 are patterned using the liftoff technique. However, the respective semiconductor layers 38 and 39 may be formed on the entire upper surface of the silicon substrate 20 and then patterned by dry etching.

In this case, as in the case of the second embodiment, it is preferable to lower an oxygen concentration as much as possible in the sputtering atmosphere during formation of the n type second semiconductor layer 39. Thus, a carrier concentration of the second semiconductor layer 39 is lowered, making it possible to prevent the first all-solid-state secondary cell C1 from being short-circuited by the second semiconductor layer 39 before patterning.

Next, as illustrated in FIG. 13E, an alumina film is formed to have a thickness of about 0.1 μm to 1 μm, using the sputtering method, on the entire upper surface of the silicon substrate 20, and the alumina film is used as an interlayer insulating film 72.

Thereafter, the interlayer insulating film 72 is patterned to form a first contact hole 72a and a second contact hole 72b.

Among these holes, the first contact hole 72a is provided on the first source drain 38a, while the second contact hole 72b is provided on the extension portion 35b of the first gate electrode 35.

The patterning of the interlayer insulating film 72 is performed by dry etching using an unillustrated resist film as a mask. For the dry etching, any one of $Cl_2$ gas, $BCl_3$ gas, and gas mixture of $Cl_2$ gas and $BCl_3$ gas can be used as etching gas.

Subsequently, as illustrated in FIG. 13F, a conductive film such as an electrolytic copper plated film is formed on the entire upper surface of the silicon substrate 20. Then, the conductive film is patterned to be left as first and second conductor plugs 73 and 74 in the first and second contact holes 72a and 72b.

The above-described first source drain 38a is connected to the first conductor plug 73, while the extension portion 35b of the first gate electrode 35 is connected to the second conductor plug 74.

Furthermore, an internal wiring 75 is formed on the interlayer insulating film 72 and the second conductor plug 74, and the fourth source drain 39b and the second conductor plug 74 are electrically connected by the internal wiring 75. The internal wiring 75 can be formed, for example, by forming an electrolytic copper plated film on the entire upper surface of the silicon substrate 20 and patterning the electrolytic copper plated film.

Next, as illustrated in FIG. 13G, an alumina film is formed to have a thickness of 0.1 μm to 1 μm, using the sputtering method, as a sealing layer 79 on the interlayer insulating film 72 and the internal wiring 75.

Furthermore, the sealing layer 79 and the interlayer insulating film 72 are patterned to form first to third holes 79a to 79c. Among these holes, the third hole 79c is formed on the first conductor plug 73, and the second hole 79b is formed on the extension portion 37b of the second gate electrode 37.

Meanwhile, the first hole 79a is formed on the second opening 31b in the insulating film 31, and the third source drain 39a and the negative electrode layer 29 are exposed from the first hole 79a.

Note that the patterning of the interlayer insulating film 72 is performed by dry etching using an unillustrated resist film as a mask and using any one of $Cl_2$ gas, $BCl_3$ gas, and gas mixture of $Cl_2$ gas and $BCl_3$ gas as etching gas.

Next, as illustrated in FIG. 13H, after metal film is formed in the holes 79a to 79c by an electrolytic plating method, the metal film is patterned to be left as first to third terminals 41a to 41c in the holes 79a to 79c, respectively. As for a material of the metal film, nickel, copper, gold and the like are available, for example.

Among these terminals, the first terminal 41a is electrically connected to the negative electrode layer 29 and comes into ohmic contact with the third source drain 39a. Meanwhile, the third terminal 41c is electrically connected to the first source drain 38a.

Also, the second terminal 41b is connected to the extension portion 37b of the second gate electrode 37. The second transistor TR2 is turned on by controlling the potential of the second terminal 41b. Thus, a voltage of the fourth source drain 39b of the second transistor TR2 can be applied to the first gate electrode 35 of the first transistor TR1.

Thus, a basic structure of an electric storage unit according to the present embodiment is completed, which includes the first all-solid-state secondary cell C1, the first transistor TR1 and the second transistor TR2.

In the electric storage unit 84, the first to third terminals 41a to 41c are exposed from an upper surface 79x of the sealing layer 79 as illustrated in FIG. 13H.

Thereafter, the electronic device 70 as illustrated in FIG. 6F is completed by performing the steps illustrated in FIGS. 6A to 6F described in the first embodiment.

Figure 15:
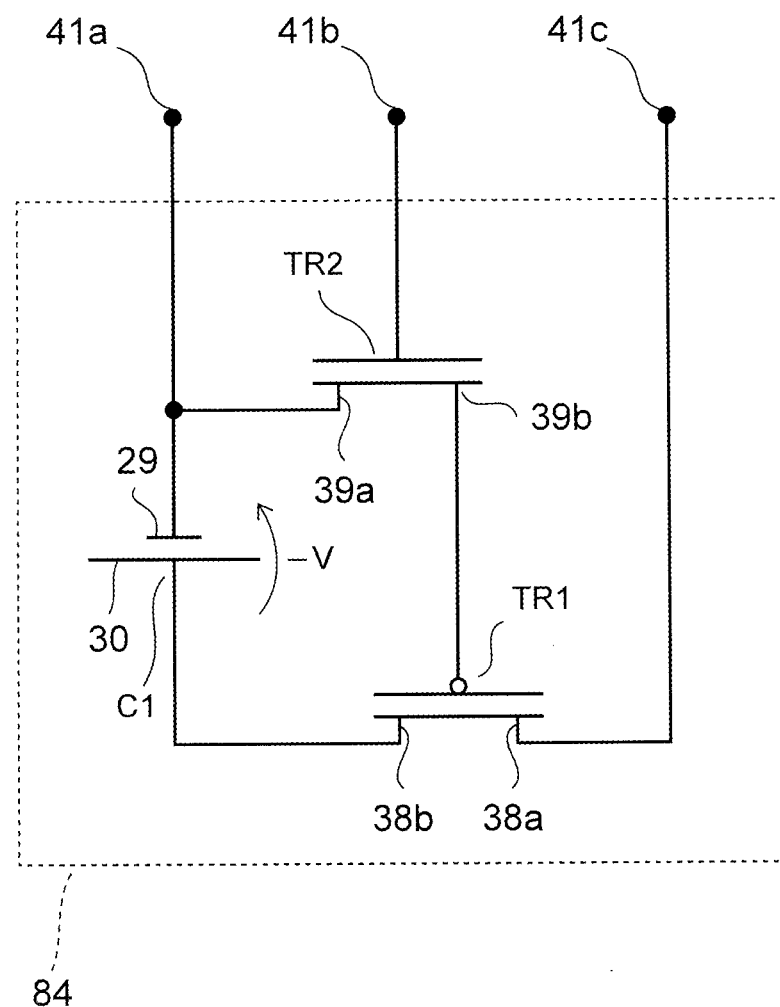
FIG. 15 is an equivalent circuit diagram of an electric storage unit included in the electronic device according to the fourth embodiment.

FIG. 15 is an equivalent circuit diagram of the electric storage unit 84.

As in the case of the third embodiment, the first transistor TR1 is provided on the positive electrode side of the first all-solid-state secondary cell C1 and functions as a high-side switch to shut off the current flowing into the first all-solid-state secondary cell C1.

Here, when the first terminal 41a and the second terminal 41b are short-circuited, a negative potential −V of the first all-solid-state secondary cell C1 is applied to the gate of the second transistor TR2. As a result, the second transistor TR2 having an n conductivity type is turned off. Thus, the negative potential −V of the first all-solid-state secondary cell C1 does not appear in the fourth source drain 39b in the second transistor TR2. Therefore, when the first terminal 41a and the second terminal 41b are short-circuited as described above, the first transistor TR1 having the p conductivity type is turned off. Thus, no current flows into the first all-solid-state secondary cell C1, making it possible to prevent over discharge of the first all-solid-state secondary cell C1.

Also, in order to take power out of the first all-solid-state secondary cell C1 in actual usage, the first transistor TR1 may be turned on by turning on the second transistor TR2 and thus applying the negative potential −V of the cell C1 to the gate of the first transistor TR1.

In this example, the negative potential −V of the first all-solid-state secondary cell C1 is applied to the third source drain 39a in the second transistor TR2. Thus, the second transistor TR2 is turned on by applying a positive potential to the gate of the second transistor TR2.

Accordingly, the second transistor TR2 can be turned on by applying a positive voltage of 0 to V to the gate of the second transistor TR2. As a result, the gate voltage can be lowered compared with the third embodiment in which the gate voltage required to turn on the second transistor TR2 is larger than V. Thus, an unnecessary circuit can be eliminated, such as a boosting circuit to generate a high gate voltage.

According to the present embodiment described above, a boosting circuit to turn on the second transistor TR2 in actual usage can be eliminated as described above.

Furthermore, even when the first terminal 41a and the second terminal 41b are short-circuited, no current flows through the first all-solid-state secondary cell C1. Thus, over-discharge of the first all-solid-state secondary cell C1 can be prevented in the course of manufacturing of the electronic device 70.

Fifth Embodiment

As for a method for forming the first semiconductor layer 38 (see FIG. 13D) according to the fourth embodiment, a method is available, in which the first semiconductor layer 38 is formed on the entire upper surface of the silicon substrate 20 and then the first semiconductor layer 38 is patterned.

However, in this method, the first semiconductor layer 38 before patterning is connected to the positive electrode layer 23 and the negative electrode layer 29 in the first opening 31a and the second opening 31b. Therefore, the respective terminals of the cell C1 may be electrically short-circuited through the first semiconductor layer 38. This is also the case for the second semiconductor layer 39 and the first to third embodiments.

In the present embodiment, short-circuiting of the terminals in the first all-solid-state secondary cell C1 is prevented as described below even when the semiconductor layers 38 and 39 are formed on the entire upper surface of the silicon substrate 20 as described above.

FIGS. 16A to 16F are cross-sectional views of the electronic device in the course of manufacturing according to the present embodiment, and FIGS. 17A to 17D are plan views thereof. Note that the cross-sectional views of FIGS. 16A to 16F correspond to cross-sectional views taken along the line V-V in FIGS. 17A to 17D.

Moreover, in FIGS. 16A to 16F and 17A to 17D, the same elements as those described in the first to fourth embodiments are denoted by the same reference numerals as those in the first to fourth embodiments, and description thereof is omitted below.

Figure 16A:
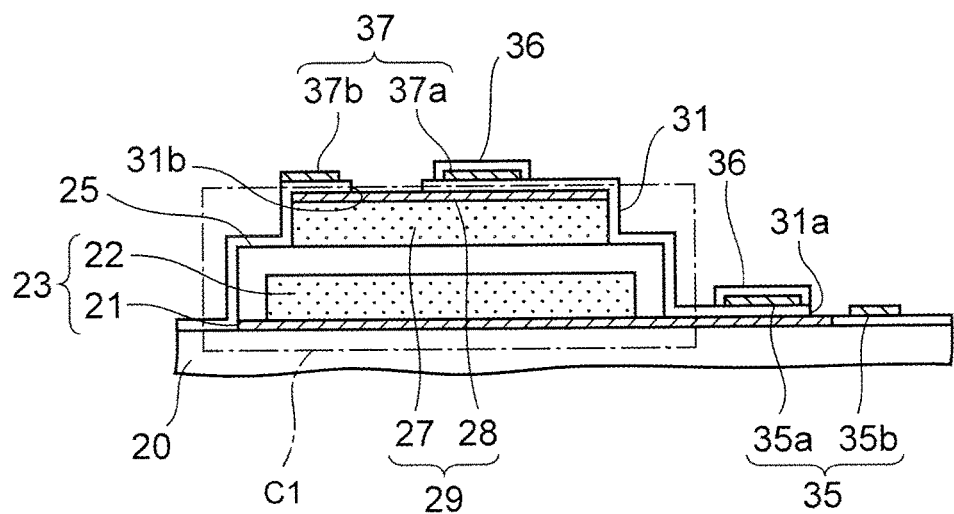
FIGS. 16A to 16F are cross-sectional views of an electronic device in the course of manufacturing according to a fifth embodiment.
Figure 17A:
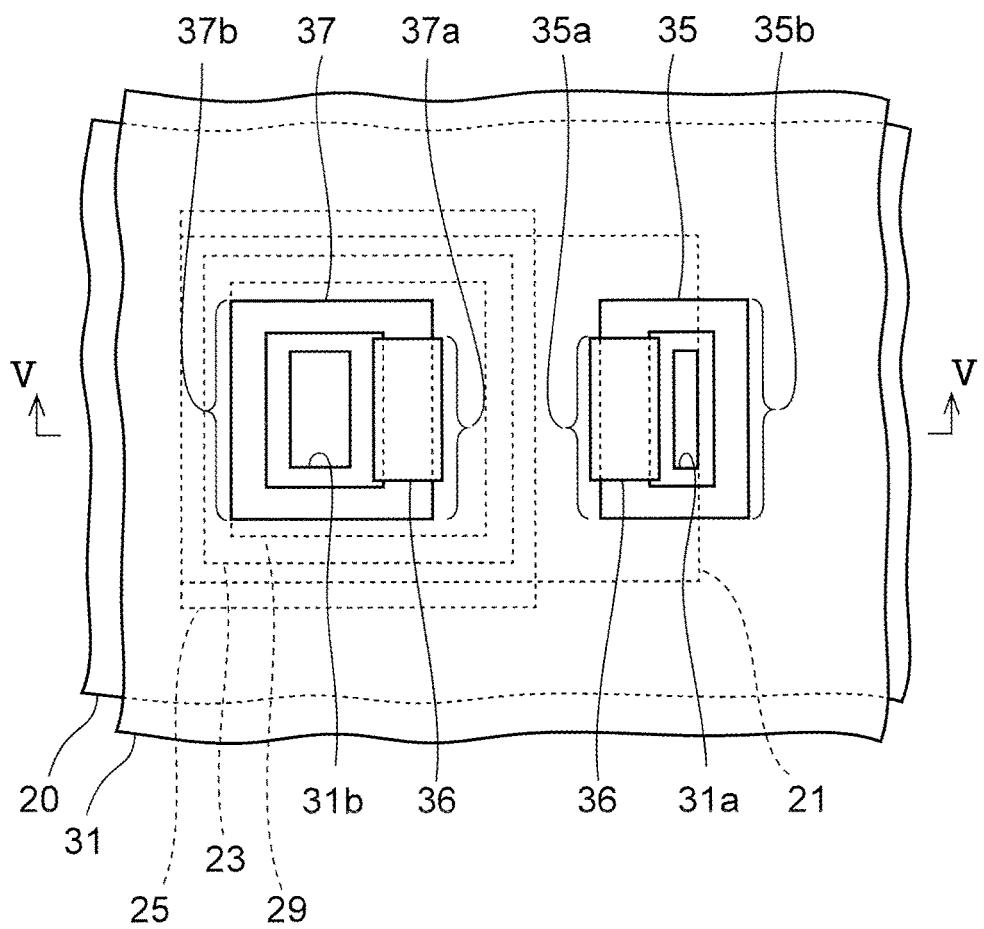
FIGS. 17A to 17D are plan views of the electronic device in the course of manufacturing according to the fifth embodiment.

First, the steps illustrated in FIGS. 13A to 13C in the fourth embodiment are performed to obtain a structure in which a first all-solid-state secondary cell C1, a first gate electrode 35 and a second gate electrode 37 are formed on a silicon substrate 20, as illustrated in FIG. 16A and FIG. 17A.

As illustrated in FIG. 17A, in the present embodiment, the first gate electrode 35 has a ring shape surrounding the first opening 31a in the insulating film 31 in a planar view. Likewise, the second gate electrode 37 has a ring shape surrounding the second opening 31b in a planar view.

Figure 16B:
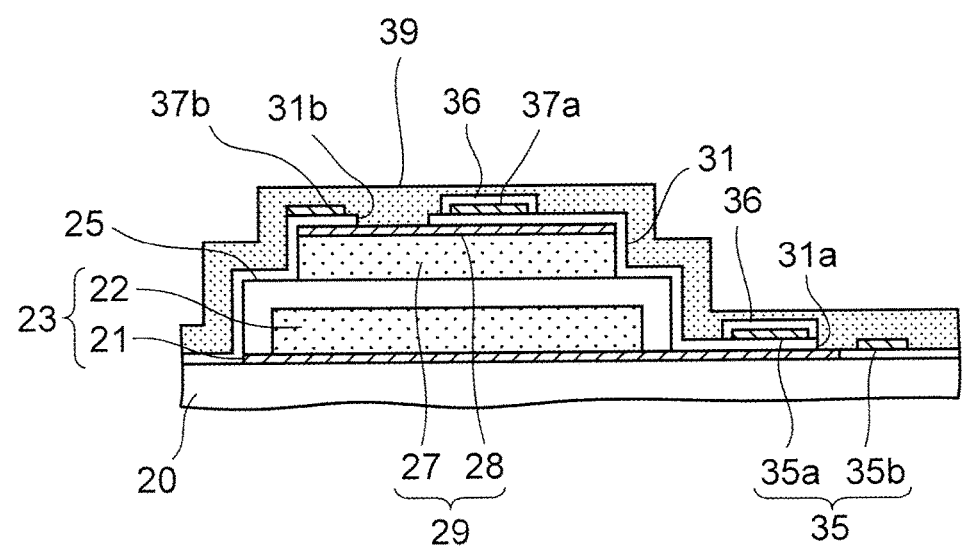
Figure 17B:
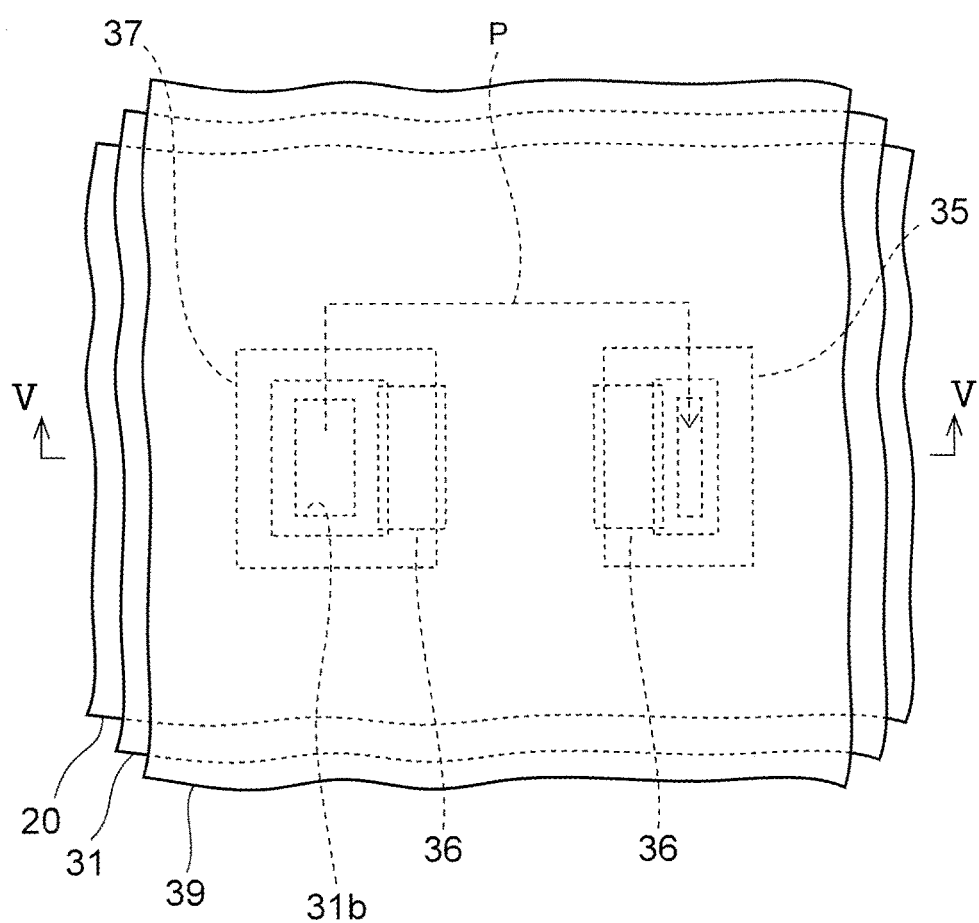

Next, as illustrated in FIG. 16B and FIG. 17B, an n type second semiconductor layer 39 is formed on the insulating film 31, the first and second gate electrodes 35 and 37 and the gate insulating film 36.

A material of the n type second semiconductor layer 39 is not particularly limited, and any of zinc oxide (ZnO), IGZO ($InGaZnO_4$) and IZO (InZnO) can be used as the material of the second semiconductor layer 39.

The second semiconductor layer 39 comes into ohmic contact with the positive electrode layer 23 in the first opening 31a in the insulating film 31, and also comes into ohmic contact with the negative electrode layer 29 in the second opening 31b.

However, since the second semiconductor layer 39 is in contact with the second gate electrode 37, the second semiconductor layer 39 and the second gate electrode 37 have the same potential, and no channel is formed in the second semiconductor layer 39.

Particularly, as illustrated in FIG. 17B, since the second gate electrode 37 has the ring shape in this example, a channel can be prevented from being formed in the second semiconductor layer 39 all around the second gate electrode 37.

This is also the case for the first gate electrode 35 formed in a ring shape.

As a result, a current path P that crosses the first gate electrode 35 or the second gate electrode 37 in a planar view is no longer formed. Therefore, the respective terminals in the first all-solid-state secondary cell C1 can be prevented from being electrically short-circuited by the current path P.

Figure 16C:
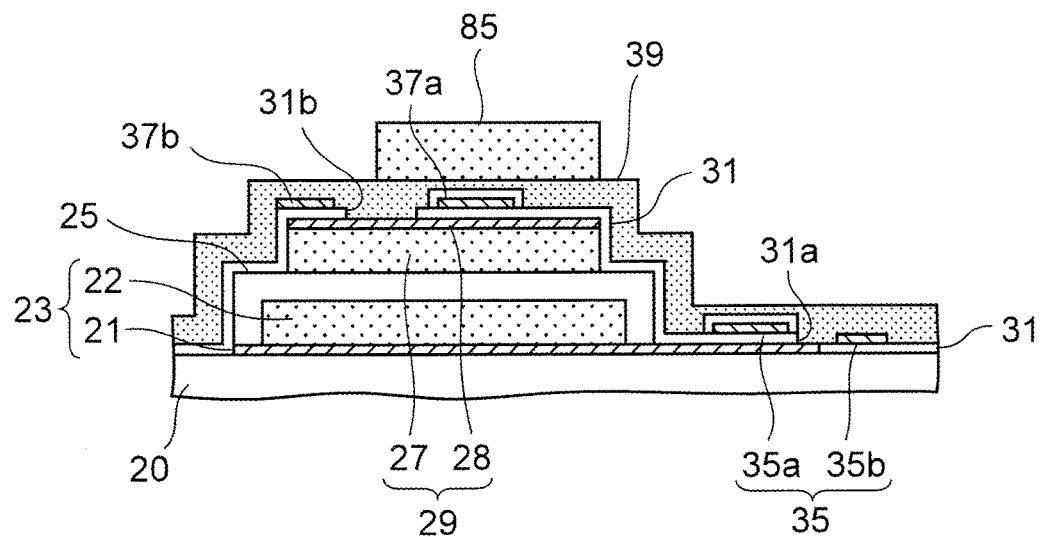

Next, as illustrated in FIG. 16C, a photoresist is applied onto the second semiconductor layer 39, and a resist film 85 is formed by exposing and developing the photoresist.

Figure 16D:
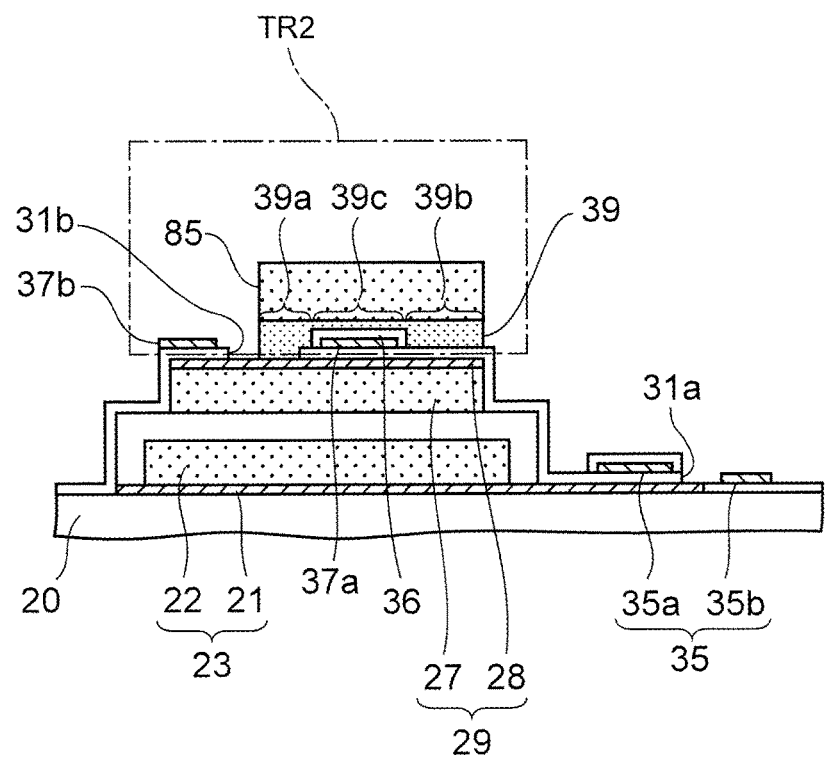
Figure 17C:
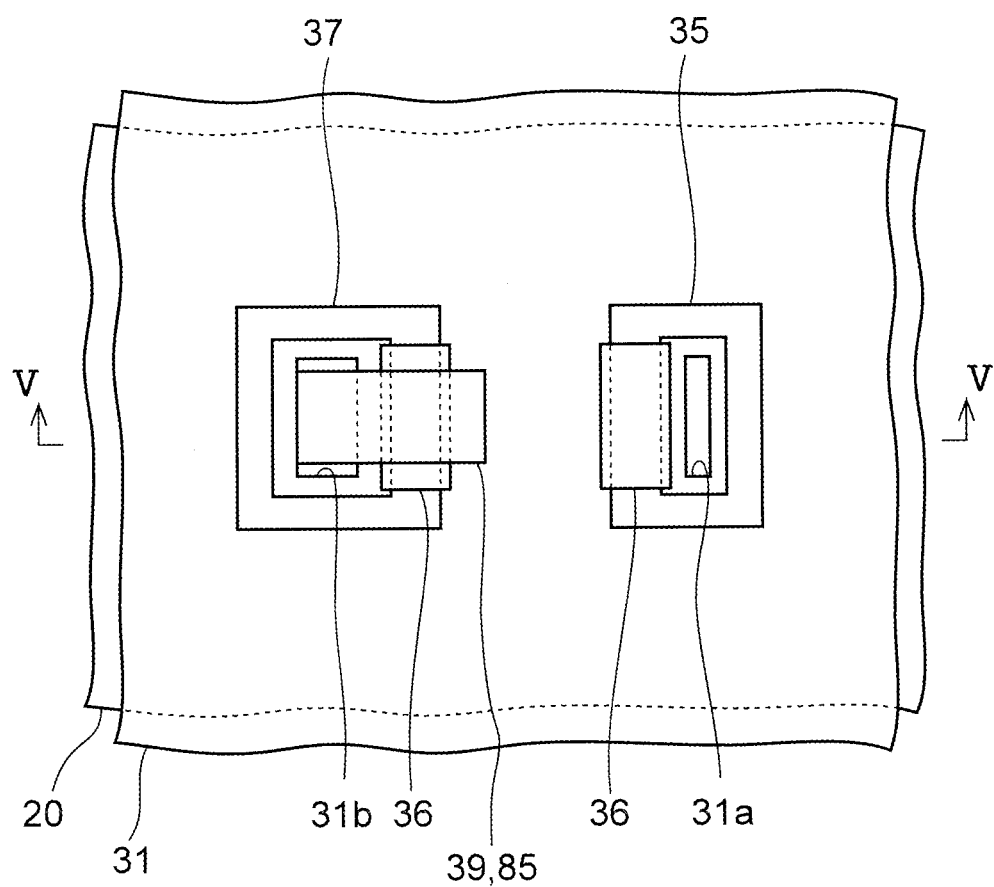

Then, as illustrated in FIG. 16D and FIG. 17C, the second semiconductor layer 39 is dry-etched, using the resist film 85 as a mask, to be left only on the both sides of the gate body 37a of the second gate electrode 37.

Etching gas to be used for the dry etching is not particularly limited. In the present embodiment, any one of $Cl_2$ gas, $BCl_3$ gas, and gas mixture of $Cl_2$ gas and $BCl_3$ gas is used as the etching gas.

Moreover, the patterned second semiconductor layer 39 includes a third source drain 39a, a fourth source drain 39b and a channel 39c, and forms a p type second transistor TR2 in cooperation with the second gate electrode 37.

Thereafter, the resist film 85 is removed.

Figure 16E:
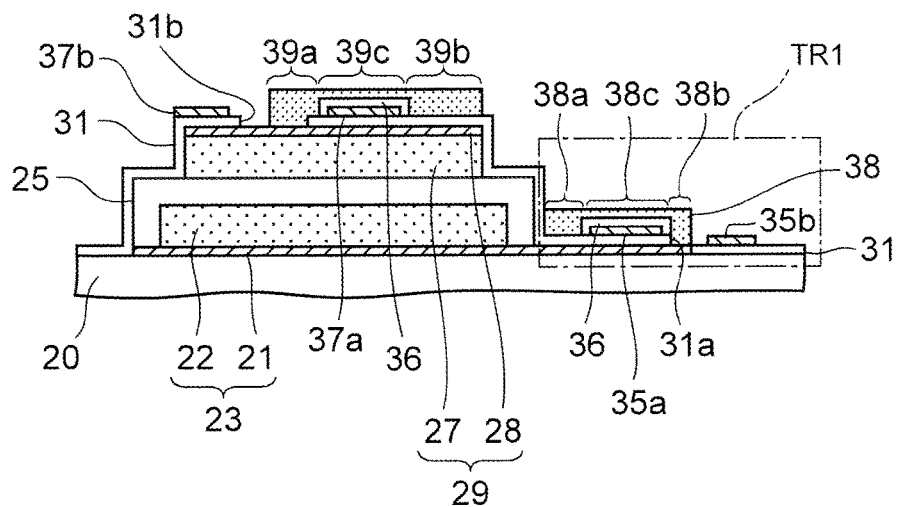
Figure 17D:
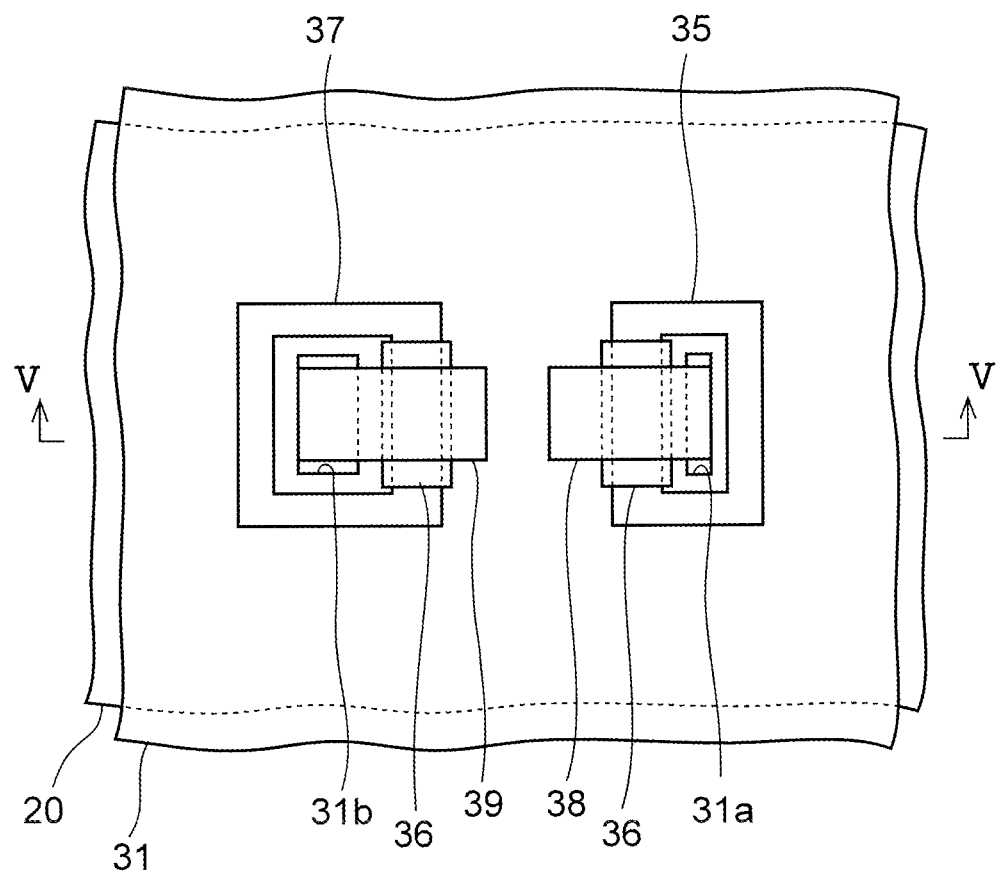

Subsequently, as illustrated in FIG. 16E and FIG. 17D, an n type first semiconductor layer 38 is formed using the sputtering method on the gate body 35a of the first gate electrode 35 and on the both sides thereof.

A method for patterning the first semiconductor layer 38 is not particularly limited. As in the case of the second semiconductor layer 39, after the second semiconductor layer is formed on the entire upper surface of the silicon substrate 20, the first semiconductor layer 38 may be left only on the gate body 35a and its both side of the first gate electrode 35 by dry etching. In this case, for the same reason described with reference to FIG. 17B, the first gate electrode 35 formed so as to surround the first opening 31a functions to prevent the terminals in the first all-solid-state secondary cell C1 from being short-circuited from each other through the first semiconductor layer 38.

Furthermore, the patterned first semiconductor layer 38 includes a first source drain 38a, a second source drain 38b and a channel 38c, and forms an n type first transistor TR1 in cooperation with the first gate electrode 35.

Figure 16F:
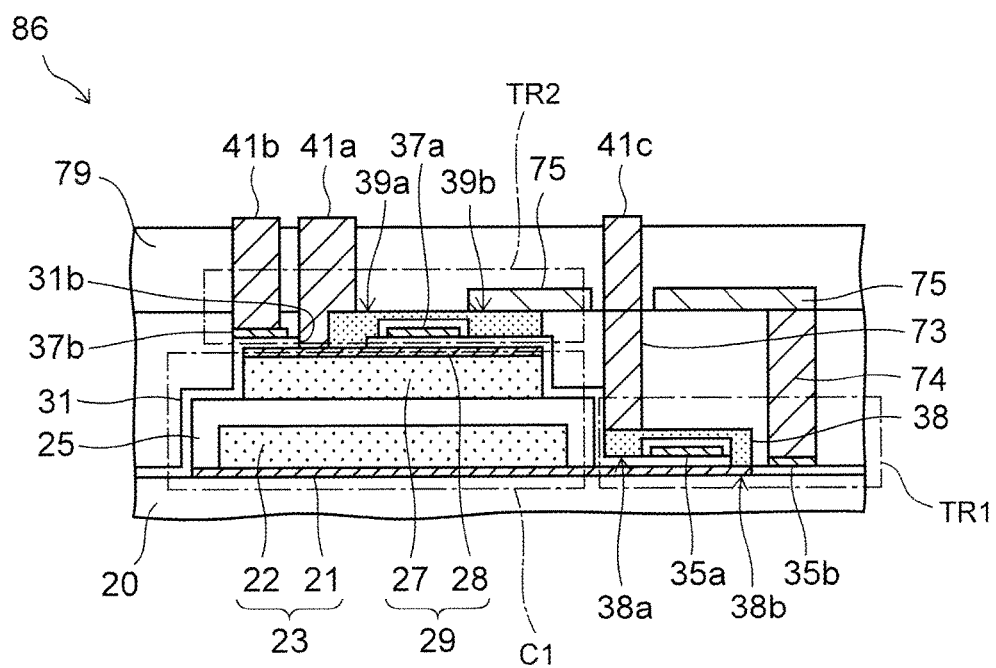

Thereafter, a basic structure of an electric storage unit 86 according to the present embodiment illustrated in FIG. 16F is completed by performing the steps illustrated in FIGS. 13E to 13H described in the fourth embodiment. Furthermore, the electronic device 70 as illustrated in FIG. 6F is completed by performing the steps illustrated in FIGS. 6A to 6F described in the first embodiment.

According to the present embodiment described above, the gate electrodes 35 and 37 are formed in the ring shape surrounding the respective openings 31a and 31b as illustrated in FIG. 17B, thereby preventing formation of the current path P which short-circuits the terminals of the first all-solid-state secondary cell C1. Therefore, even when the semiconductor layers 38 and 39 are formed on the entire upper surface of the silicon substrate 20, the terminals of the first all-solid-state secondary cell C1 are not electrically short-circuited. Thus, over-discharge of the first all-solid-state secondary cell C1 can be suppressed.

Sixth Embodiment

In the third to fifth embodiments, as illustrated in FIG. 10F for example, the first gate electrode 35 of the first transistor TR1 is formed beside the first all-solid-state secondary cell C1.

In the present embodiment, the number of steps is reduced by forming the first gate electrode 35 and a positive electrode collecting layer 21 of a first all-solid-state secondary cell C1 in the same step.

Figure 18A:
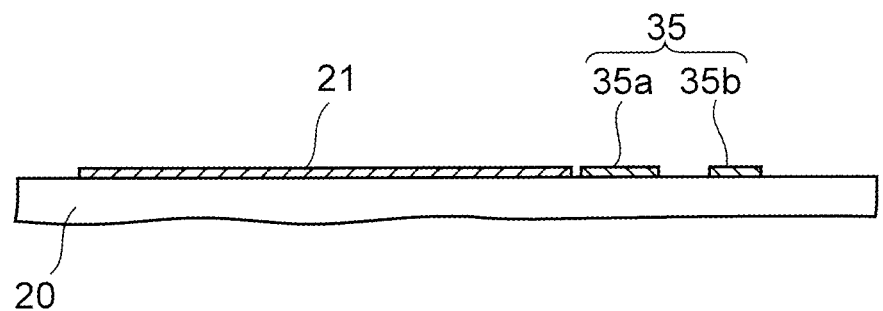
FIGS. 18A to 18E are cross-sectional views of an electronic device in the course of manufacturing according to a sixth embodiment.
Figure 18B:
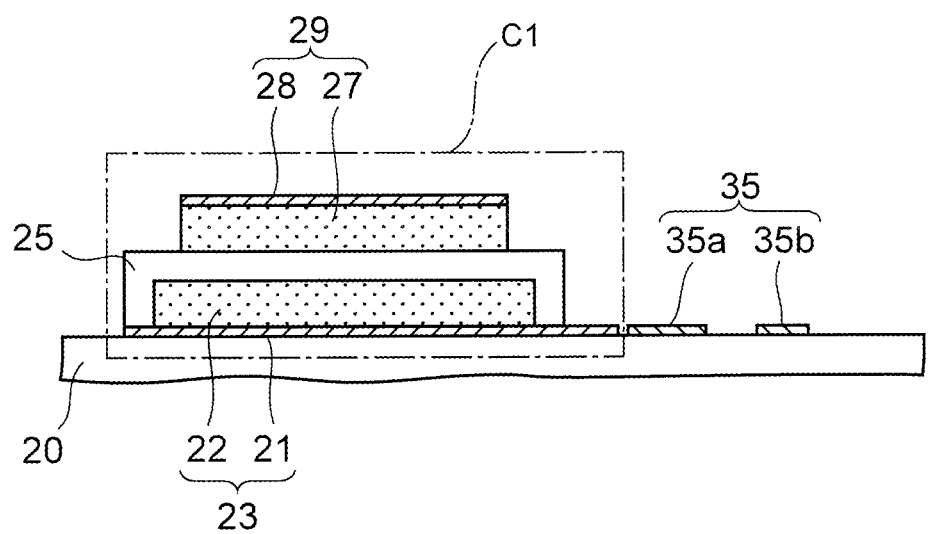
Figure 18C:
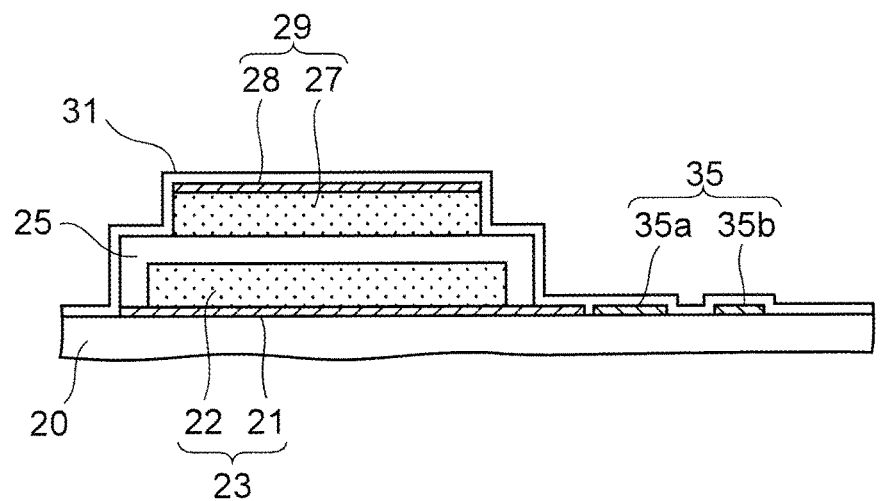
Figure 18D:
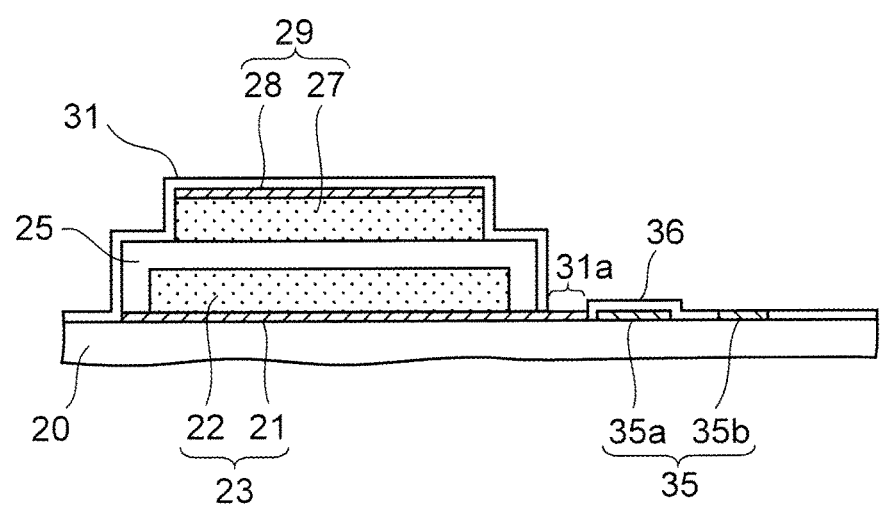
Figure 18E:
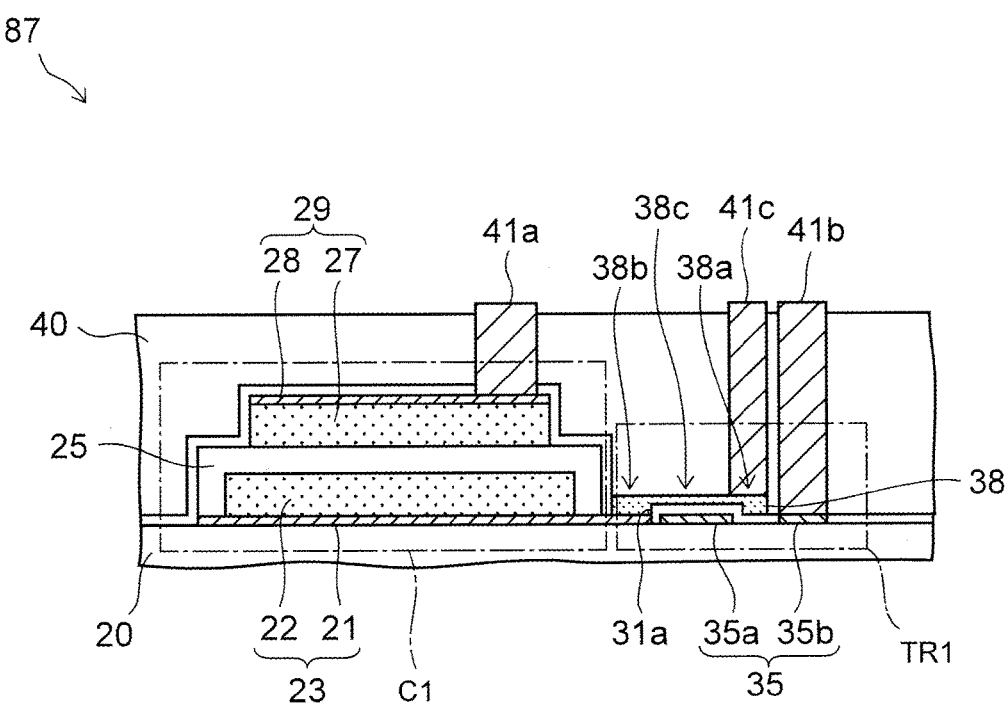
Figure 19A:
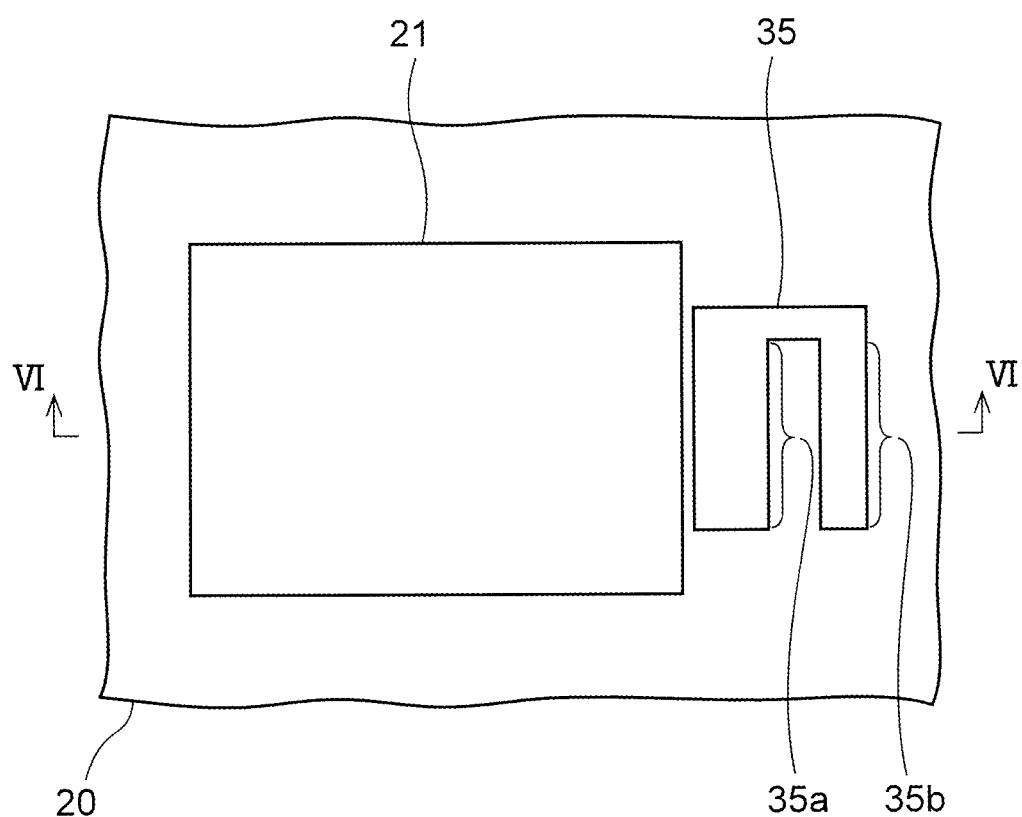
FIGS. 19A to 19C are plan views of the electronic device in the course of manufacturing according to the sixth embodiment.
Figure 19B:
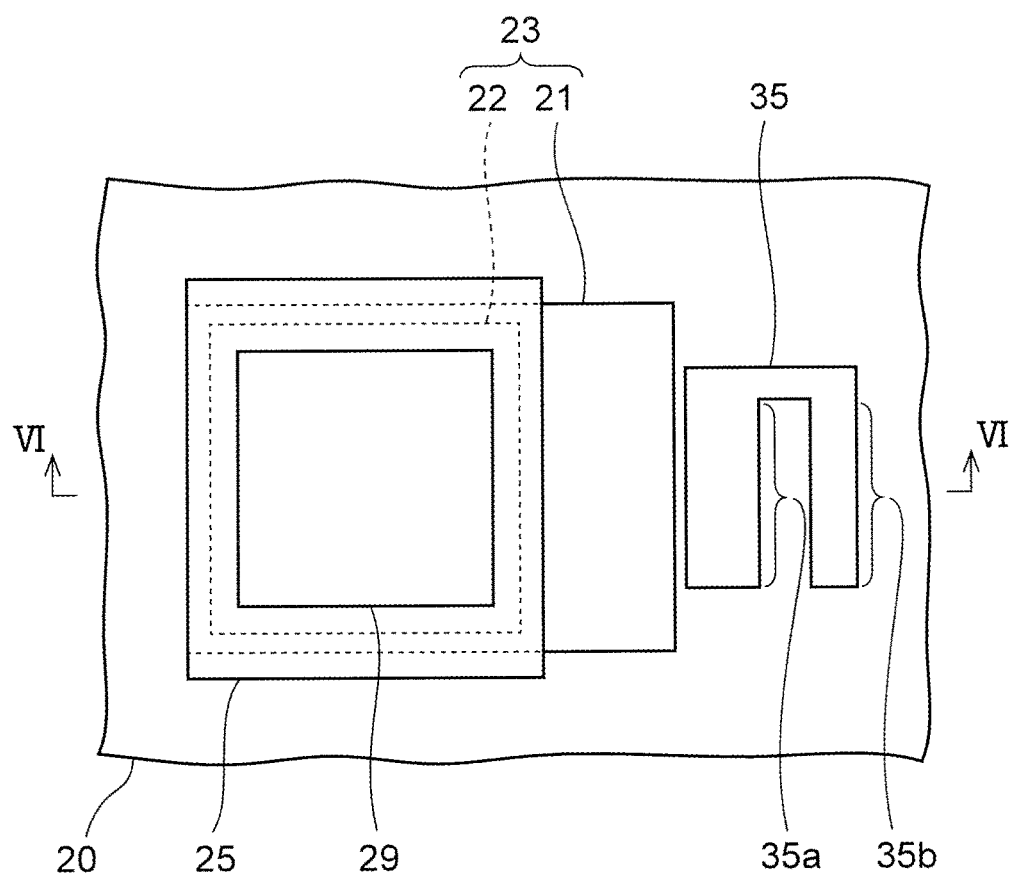
Figure 19C:
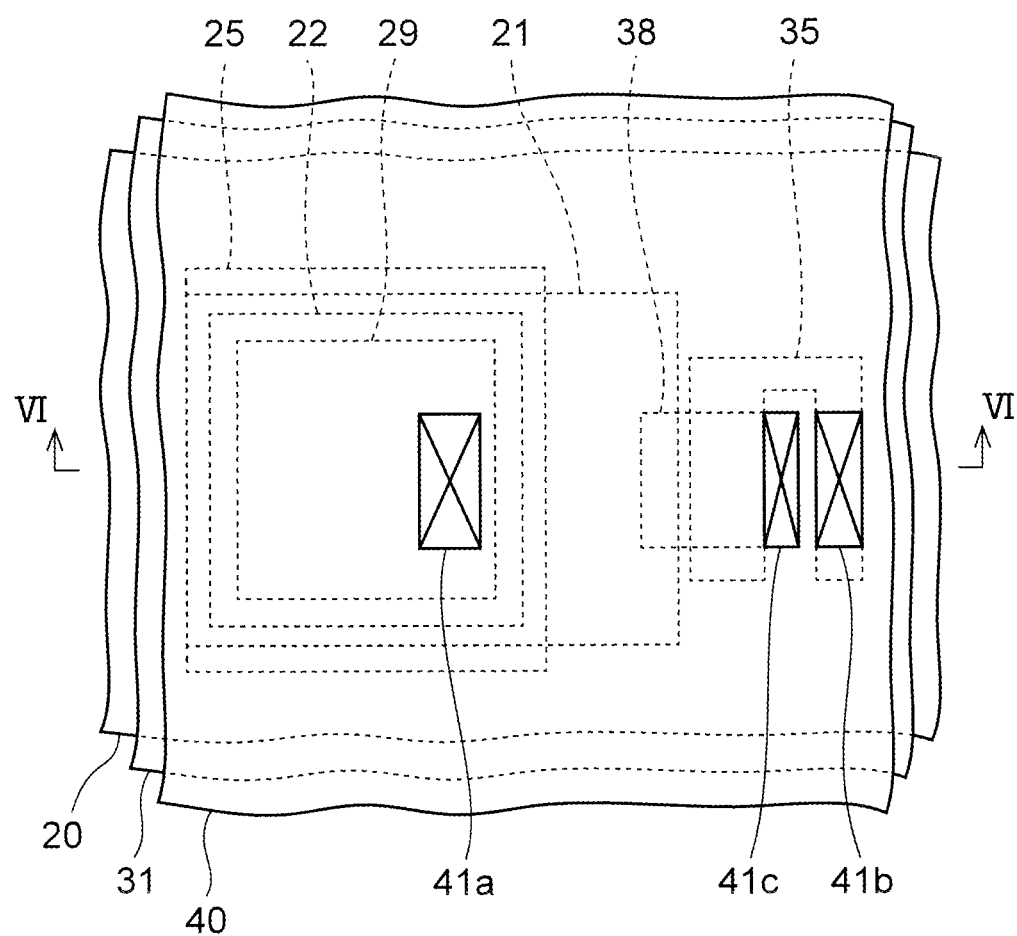

FIGS. 18A to 18E are cross-sectional views of an electronic device in the course of manufacturing according to the present embodiment, and FIGS. 19A to 19C are plan views thereof. Note that the cross-sectional views of FIGS. 18A to 18E correspond to cross-sectional views taken along the line VI-VI in FIGS. 19A to 19C.

Moreover, in FIGS. 18A to 18E and 19A to 19C, the same elements as those described in the first to fifth embodiments are denoted by the same reference numerals as those in the first to fifth embodiments, and description thereof is omitted below.

First, as illustrated in FIG. 18A and FIG. 19A, a metal film is formed using the sputtering method on a silicon substrate 20. Then, the metal film is patterned to form the positive electrode collecting layer 21 and the first gate electrode 35 at a distance, which are made of the same material. As the metal film, a titanium film and a platinum film, for example, are formed in this order using the sputtering method.

By forming the positive electrode collecting layer 21 and the first gate electrode 35 in the same step in this manner, the number of steps can be reduced in the present embodiment, compared with the case where the positive electrode collecting layer 21 and the first gate electrode 35 are formed in separate steps.

Next, the steps illustrated in FIGS. 3C to 3D in the first embodiment are performed to form a first all-solid-state secondary cell C1 as illustrated in FIG. 18B and FIG. 19B.

Then, as illustrated in FIG. 18C, an alumina ($Al_2O_3$) film is formed to have a thickness of about 0.1 μm to 1 μm, using the sputtering method, as an insulating film 31 on the first all-solid-state secondary cell C1 and the first gate electrode 35.

Subsequently, as illustrated in FIG. 18D, the insulating film 31 is patterned to be left as a gate insulating film 36 on the gate body 35a. Also, in this patterning, a first opening 31a is formed in the insulating film 31 beside the gate body 35a, and the positive electrode collecting layer 21 is exposed from the first opening 31a.

Thereafter, a basic structure of an electric storage unit 87 according to the present embodiment as illustrated in FIG. 18E and FIG. 19C is completed by performing the steps illustrated in FIGS. 10D to 10F in the third embodiment. Furthermore, the electronic device 70 as illustrated in FIG. 6F is completed by performing the steps illustrated in FIGS. 6A to 6F described in the first embodiment.

According to the present embodiment described above, since the positive electrode collecting layer 21 and the first gate electrode 35 are formed in the same step as illustrated in FIG. 18A, the number of steps can be reduced compared with the case where the positive electrode collecting layer 21 and the first gate electrode 35 are formed in separate steps.

Seventh Embodiment

In the first to sixth embodiments described above, only either one of the high-side switch and the low-side switch is connected to the all-solid-state secondary cell. On the other hand, in the present embodiment, both of the high-side switch and the low-side switch are connected to the all-solid-state secondary cell.

Figure 20A:
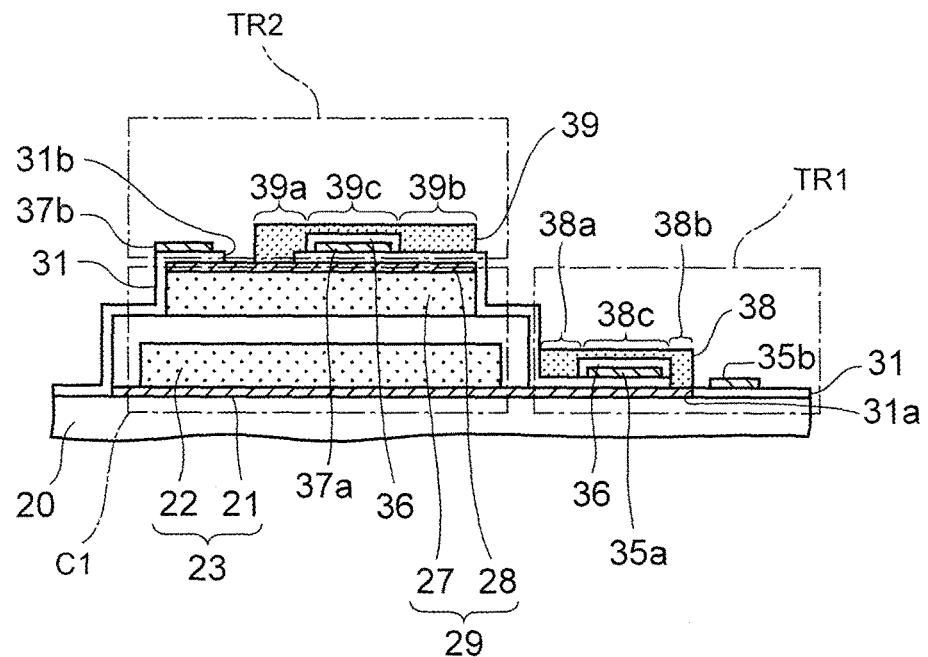
FIGS. 20A to 20C are cross-sectional views of an electronic device in the course of manufacturing according to a seventh embodiment.
Figure 20B:
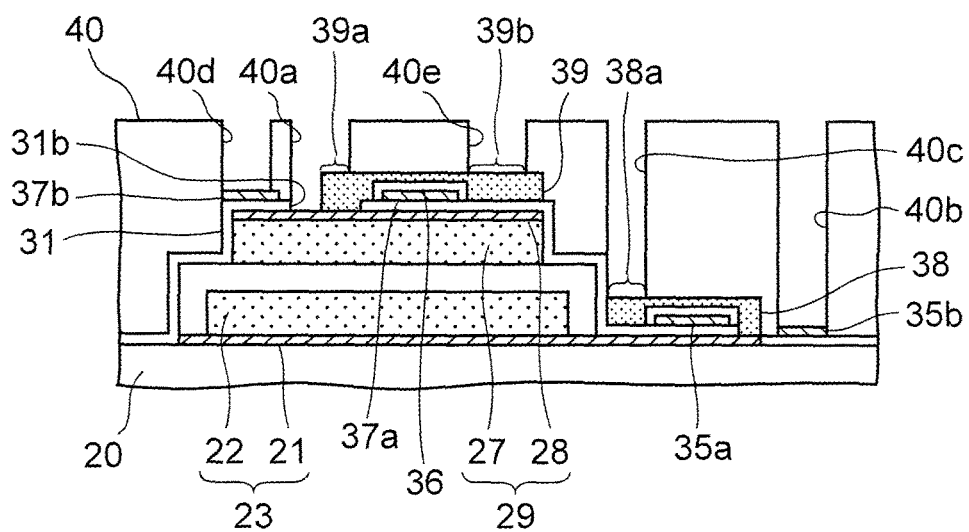
Figure 20C:
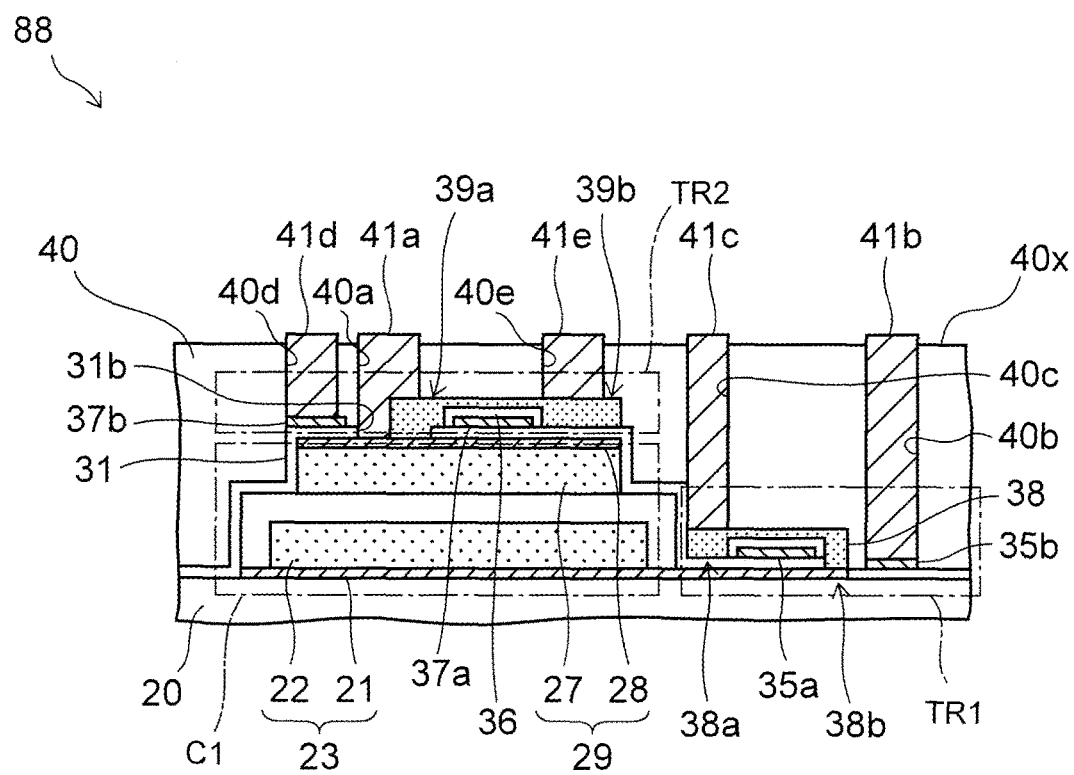

FIGS. 20A to 20C are cross-sectional views of a semiconductor device in the course of manufacturing according to the present embodiment. Note that, in FIGS. 20A to 20C, the same elements as those described in the first to sixth embodiments are denoted by the same reference numerals as those in the first to sixth embodiments, and description thereof is omitted below.

First, the same steps illustrated in FIGS. 13A to 13D in the fourth embodiment are performed to obtain a structure in which a first all-solid-state secondary cell C1, a first transistor TR1 and a second transistor TR2 are formed on a silicon substrate 20, as illustrated in FIG. 20A.

However, in the present embodiment, the first transistor TR1 is the n type and the second transistor TR2 is the p type. Thus, the conductivity types of the respective transistors TR1 and TR2 are set opposite to those in the fourth embodiment. In this case, the conductivity type of the first semiconductor layer 38 in the first transistor TR1 is the n type, while the conductivity type of the second semiconductor layer 39 in the second transistor TR2 is the p type.

Next, as illustrated in FIG. 20B, a sealing layer 40 is formed to have a thickness of about 1 μm to 10 μm on the entire upper surface of the silicon substrate 20. In the present embodiment, an alumina film is formed using the sputtering method as the sealing layer 40. However, instead of the alumina film, any of a silicon oxynitride film, a polyimide film and a parylene film or a laminated film thereof may be formed as the sealing layer 40.

Thereafter, the sealing layer 40 is patterned by dry etching using an unillustrated resist film as a mask to form first to fifth holes 40a to 40e. As for etching gas which can be used for the dry etching, for example, any one of $Cl_2$ gas, $BCl_3$ gas, and gas mixture of $Cl_2$ gas and $BCl_3$ gas can be used.

Among these holes, the first hole 40a is formed on the negative electrode layer 29, and the negative electrode collecting layer 28 and the third source drain 39a are exposed in the first hole 40a.

The second hole 40b is formed on the extension portion 35b of the first gate electrode 35, and the third hole 40c is formed on the first source drain 38a. The fourth hole 40d is formed on the extension portion 37b of the second gate electrode 37, and the fifth hole 40e is formed on the fourth source drain 39b.

Then, as illustrated in FIG. 20C, after metal film is formed in the holes 40a to 40e by an electrolytic plating method, the metal film is patterned to be left as first to fifth terminals 41a to 41e in the holes 40a to 40e, respectively. As for a material of the metal film, nickel, copper, gold and the like are available, for example.

Among these terminals, the first terminal 41a is electrically connected to the negative electrode layer 29 and the third source drain 39a. Meanwhile, the second terminal 41b is electrically connected to the extension portion 35b of the first gate electrode 35, thereby controlling the potential of the first gate electrode 35.

Also, the third terminal 41c is electrically connected to the first source drain 38a. Meanwhile, the fourth terminal 41d is electrically connected to the extension portion 37b of the second gate electrode 37, thereby controlling the potential of the second gate electrode 37. Furthermore, the fifth terminal 41e is electrically connected to the fourth source drain 39b.

Thus, a basic structure of an electric storage unit 88 according to the present embodiment is completed, which includes the first all-solid-state secondary cell C1, the first transistor TR1 and the second transistor TR2.

In the electric storage unit 88, the first to fifth terminals 41a to 41e are exposed from an upper surface 40x of the sealing layer 40 as illustrated in FIG. 20C.

Figure 21:
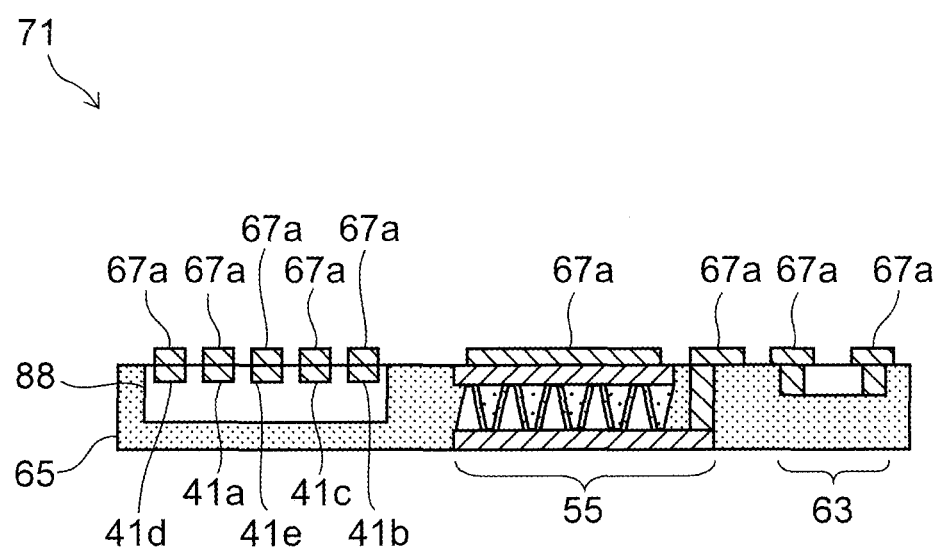
FIG. 21 is a cross-sectional view of the electronic device according to the seventh embodiment.

Thereafter, an electronic device 71 as illustrated in FIG. 21 is completed by performing the steps illustrated in FIGS. 6A to 6F described in the first embodiment.

Figure 22:
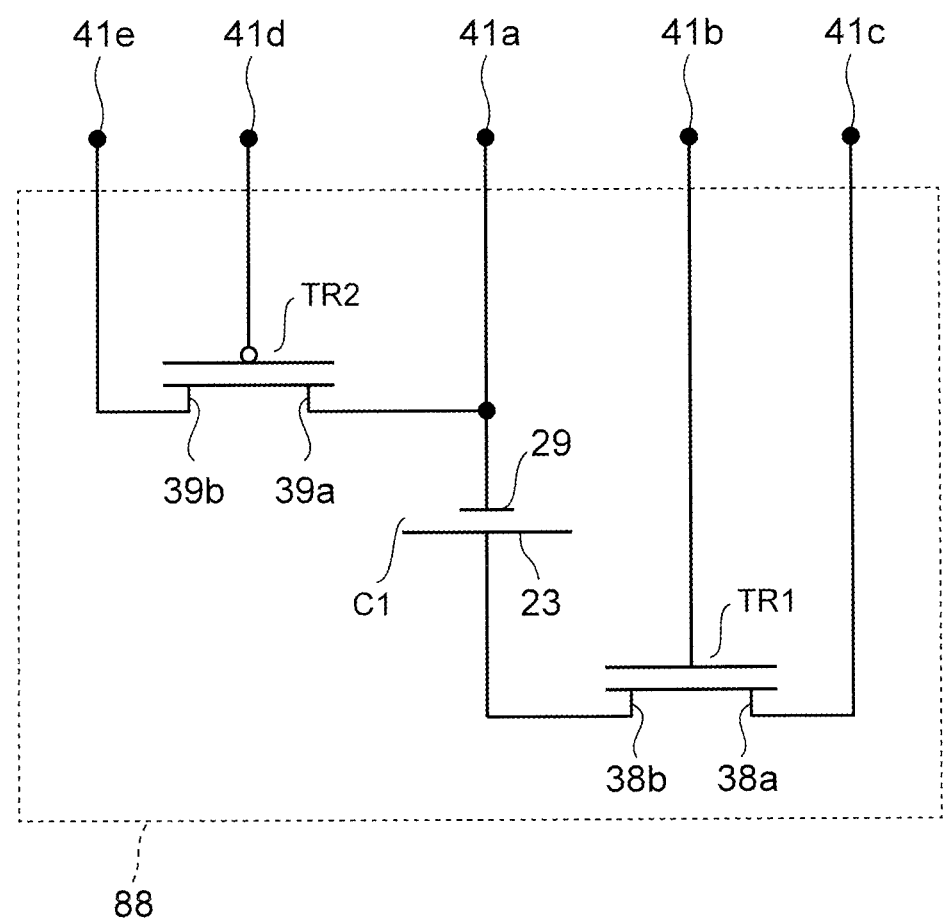
FIG. 22 is an equivalent circuit diagram of an electric storage unit included in the electronic device according to the seventh embodiment.

FIG. 22 is an equivalent circuit diagram of the electric storage unit 88 included in the electronic device 71.

As illustrated in FIG. 22, in the present embodiment, the n type first transistor TR1 is provided as a high-side switch on the positive electrode side of the first all-solid-state secondary cell C1, and the p type second transistor TR2 is provided as a low-side switch on the negative electrode side of the cell C1.

Here, even when the first terminal 41a and the second terminal 41b are electrically short-circuited, no current flows through the first all-solid-state secondary cell C1 since the n type first transistor TR1 is turned off as described in the third embodiment.

Moreover, even when the first terminal 41a and the fourth terminal 41d are electrically short-circuited, no current flows through the first all-solid-state secondary cell C1 since the p type second transistor TR2 is turned off as described in the first embodiment.

Accordingly, even when all of the first to fifth terminals 41a to 41e are electrically short-circuited, over-discharge of the first all-solid-state secondary cell C1 can be suppressed by preventing a current from flowing through the first all-solid-state secondary cell C1.

According to the present embodiment described above, no current flows through the first all-solid-state secondary cell C1 even when the first to fifth terminals 41a to 41e are short-circuited as described above. Therefore, over-discharge of the cell C1 can be prevented in the course of manufacturing of the electronic device 71 (see FIG. 21).

Eighth Embodiment

In the first to seventh embodiments, only one all-solid-state secondary cell is provided in the electronic device. In the present embodiment, on the other hand, two all-solid-state secondary cells are provided in an electronic device.

Figure 23:
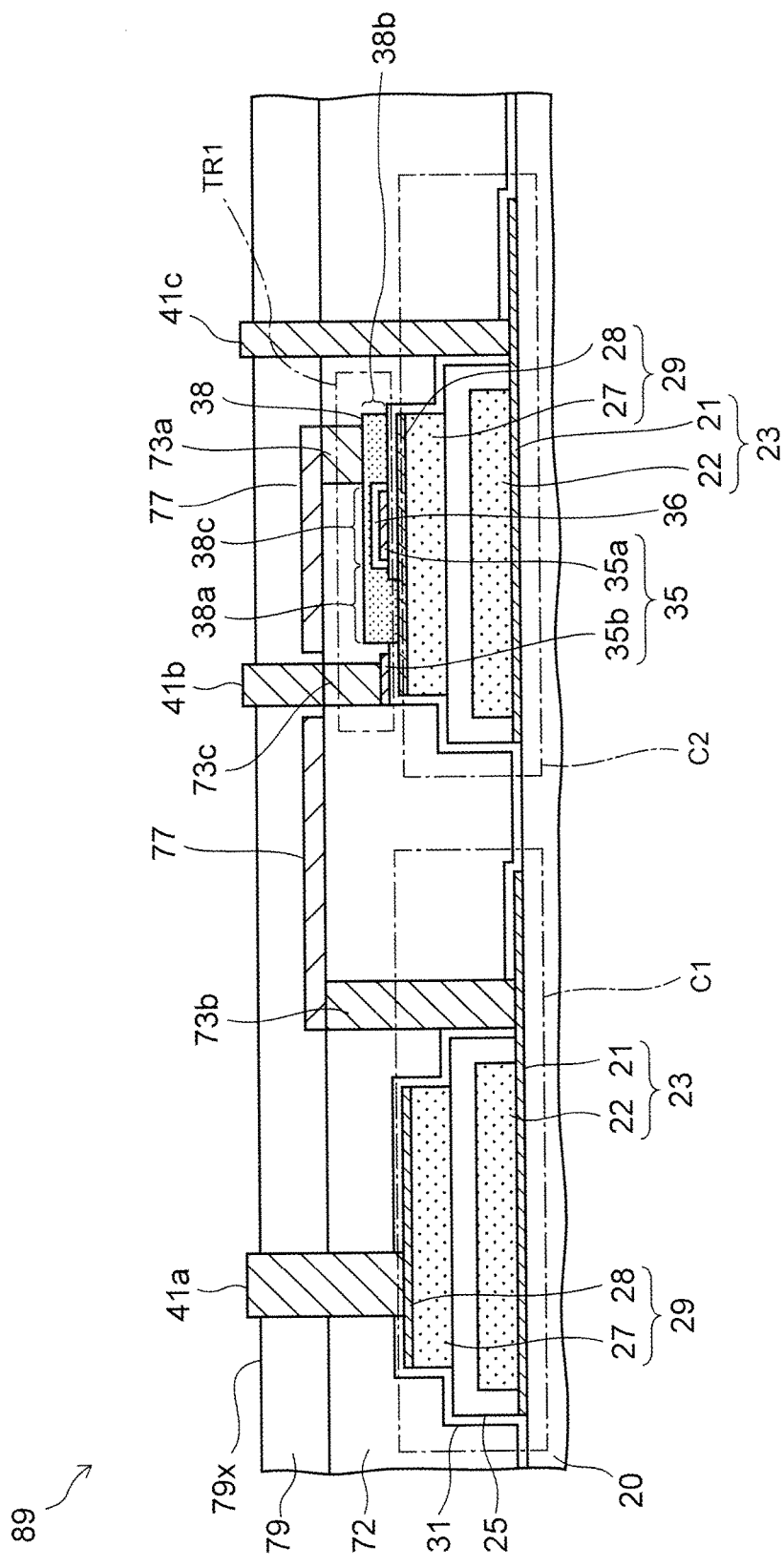
FIG. 23 is a cross-sectional view of an electric storage unit in an electronic device according to an eighth embodiment.

FIG. 23 is a cross-sectional view of an electric storage unit in an electronic device according to the present embodiment. Note that, in FIG. 23, the same elements as those described in the first to seventh embodiments are denoted by the same reference numerals as those in the first to seventh embodiments, and description thereof is omitted below.

As illustrated in FIG. 23, the electric storage unit includes a first all-solid-state secondary cell C1, a second all-solid-state secondary cell C2 and a first transistor TR1.

Among these, the first all-solid-state secondary cell C1 and the second all-solid-state secondary cell C2 are formed at the same time by performing the steps illustrated in FIGS. 3A to 3D in the first embodiment, for example.

The first transistor TR1 is provided over the second all-solid-state secondary cell C2, and the conductivity type thereof may be the n type or p type. A method for forming the first transistor TR1 is not particularly limited. The first transistor TR1 can be formed by performing the steps illustrated in FIGS. 3F to 3I in the first embodiment.

The first and second all-solid-state secondary cells C1 and C2 and the first transistor TR1 are covered with an interlayer insulating film 72 and a sealing layer 79. As described in the second embodiment, alumina films can be formed using the sputtering method as the interlayer insulating film 72 and the sealing layer 79.

In the interlayer insulating film 72, the first to third conductor plugs 73a to 73c in the second embodiment are buried. Among these conductor plugs, the first conductor plug 73a is connected to the second source drain 38b of the first transistor TR1, while the second conductor plug 73b is connected to the positive electrode collecting layer 21 in the first all-solid-state secondary cell C1.

Meanwhile, the third conductor plug 73c is connected to the extension portion 35b of the first gate electrode 35 in the first transistor TR1.

Furthermore, an internal wiring 77 is provided on the interlayer insulating film 72, and the first conductor plug 73a and the second conductor plug 73b are electrically connected through the internal wiring 77.

Meanwhile, first to third terminals 41a to 41c are buried in the sealing layer 79. The first terminal 41a is connected to the negative electrode layer 29 of the first all-solid-state secondary cell C1, and the second terminal 41b is connected to the third conductor plug 73c described above. Also, the third terminal 41c is connected to the positive electrode collecting layer 21 of the second all-solid-state secondary cell C2.

These first to third terminals 41a to 41c are all exposed from an upper surface 79x of the sealing layer 79.

Figure 24:
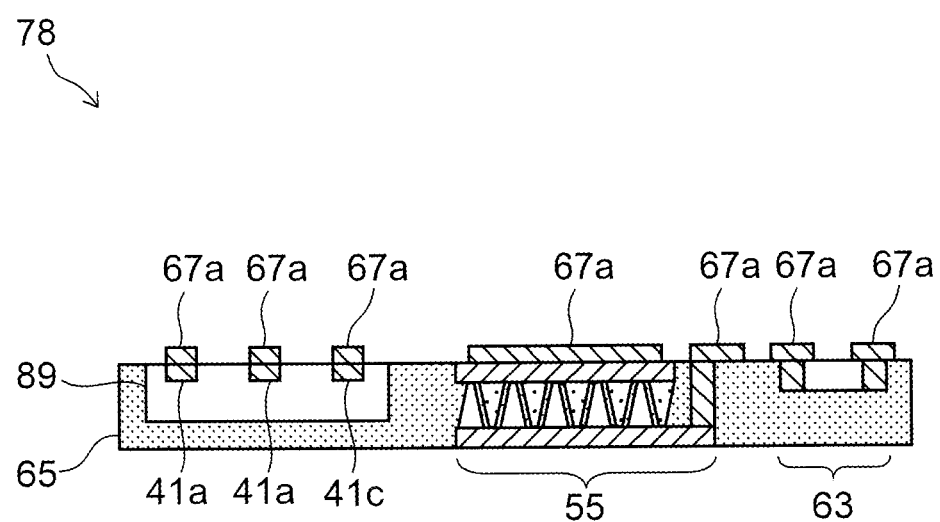
FIG. 24 is a cross-sectional view of the electronic device according to the eighth embodiment.

FIG. 24 is a cross-sectional view of an electronic device 78 according to the present embodiment including the electric storage unit 89.

To manufacture the electronic device 78, the electric storage unit 89, a power generating element 55 and a circuit element 63 may be sealed with a resin layer 65 by performing the steps illustrated in FIGS. 6A to 6F described in the first embodiment.

Figure 25:
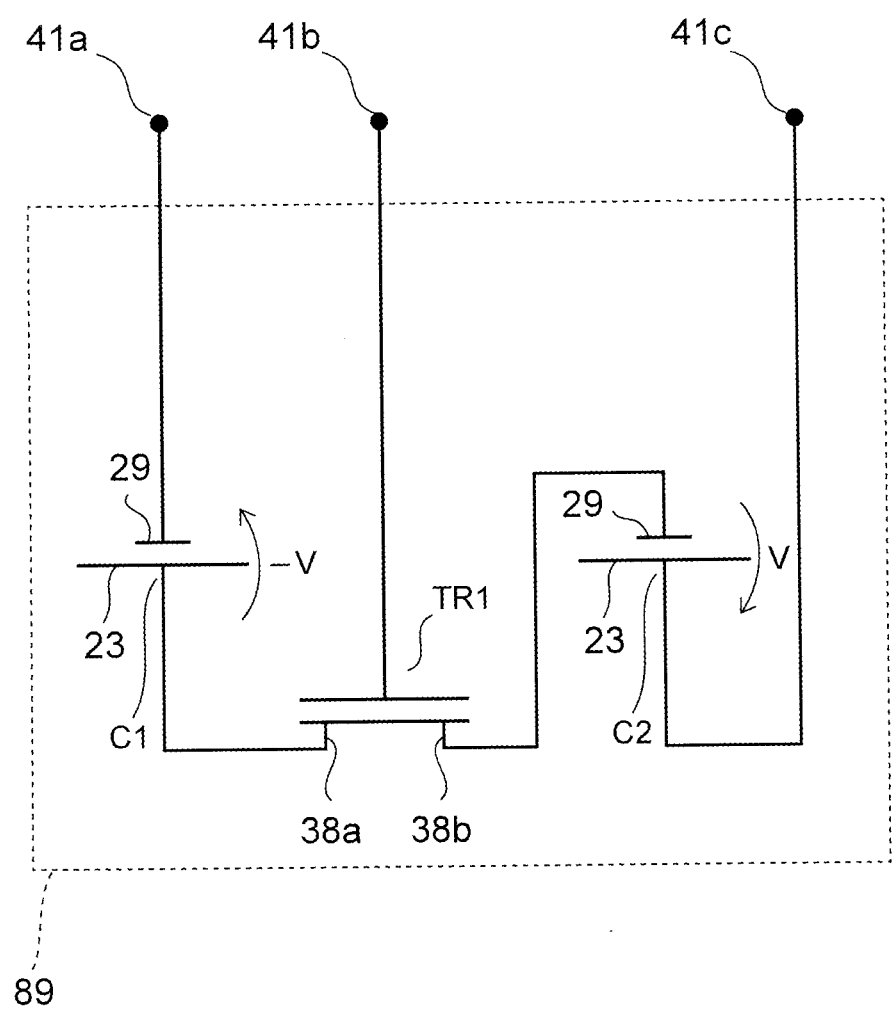
FIG. 25 is an equivalent circuit diagram of the electric storage unit included in the electronic device according to the eighth embodiment.

FIG. 25 is an equivalent circuit diagram of the electric storage unit 89.

As illustrated in FIG. 25, the second all-solid-state secondary cell C2 described above is provided between the third terminal 41c and the first source drain 38a, and is connected in series to the first all-solid-state secondary cell C1 through the first transistor TR1.

When the conductivity type of the first transistor TR1 is set to the n type, the negative potential −V of the first all-solid-state secondary cell C1 is applied to the gate of the first transistor TR1 at the time when the first and second terminals 41a and 41b are electrically short-circuited. Thus, the first transistor TR1 is turned off.

On the other hand, when the conductivity type of the first transistor TR1 is set to the p type, the positive potential V of the second all-solid-state secondary cell C2 is applied to the gate of the first transistor TR1 at the time when the second and third terminals 41b and 41c are electrically short-circuited. Thus, the first transistor TR1 is turned off.

Accordingly, regardless of the conductivity type of the first transistor TR1, no current flows through any of the all-solid-state secondary cells C1 and C2 when the first to third terminals 41a to 41c are short-circuited. Thus, over-discharge of the all-solid-state secondary cells C1 and C2 can be prevented.

As described above, according to the present embodiment, since no current flows through the all-solid-state secondary cells C1 and C2 even when the first to third terminals 41a to 41c are short-circuited, over-discharge of the all-solid-state secondary cells C1 and C2 can be prevented in the course of manufacturing of the electronic device 78.

Moreover, the series connection of the all-solid-state secondary cells C1 and C2 can increase a potential difference between the first and third terminals 41a and 41c when the first transistor TR1 is on, compared with the case where only one all-solid-state secondary cell is provided.

Ninth Embodiment

In the present embodiment, description is given of an electronic device including a plurality of all-solid-state secondary cells and transistors.

Figure 26A:
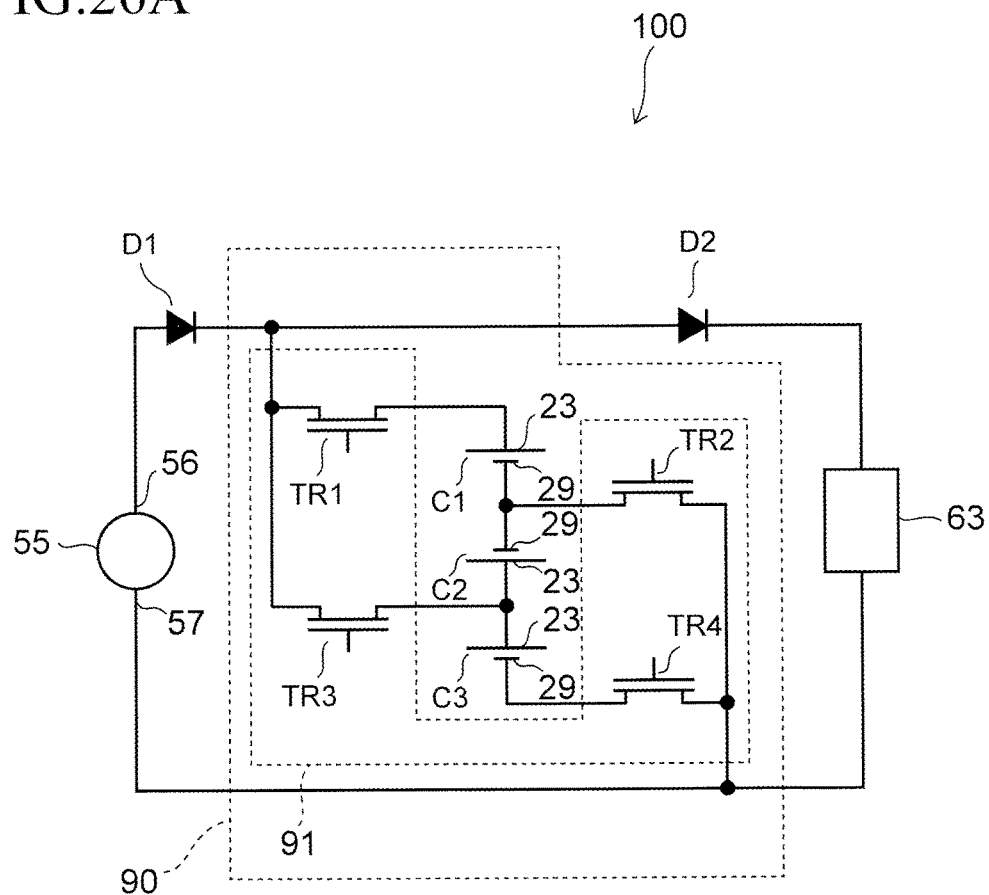
FIG. 26A is a circuit diagram of an electronic device according to a ninth embodiment.

FIG. 26A is a circuit diagram of the electronic device according to the present embodiment.

Note that, in FIG. 26A, the same elements as those described in the first to eighth embodiments are denoted by the same reference numerals as those in the first to eighth embodiments, and description thereof is omitted below.

As illustrated in FIG. 26A, an electronic device 100 according to the present embodiment includes a power generating element 55, an electric storage unit 90 and a circuit element 63.

As for the power generating element 55, a thermoelectric conversion element as described in the first embodiment can be used. Also, as for the circuit element 63, a temperature sensor, an optical sensor, a vibration sensor, an MPU or the like can be used.

Meanwhile, the electric storage unit 90 includes a selection circuit 91 and first to third all-solid-state secondary cells C1 to C3 connected in parallel with each other.

The all-solid-state secondary cells C1 to C3 all have the same layer structure, and can be manufactured according to FIGS. 3A to 3D in the first embodiment, for example.

The selection circuit 91 includes first to fourth transistors TR1 to TR4. The transistors TR1 to TR4 are also manufactured in the same manner as those described in the first to eighth embodiments, and are sealed with a sealing layer 40 and the like together with the all-solid-state secondary cells C1 to C3.

The first to fourth transistors TR1 to TR4 serve as high-side switches or low-side switches to prevent over discharge of the all-solid-state secondary cells C1 to C3.

As for the first all-solid-state secondary cell C1 for example, the first transistor TR1 functions as the high-side switch, and the second transistor TR2 functions as the low-side switch. Thus, by connecting the first and second transistors TR1 and TR2 in the same manner as illustrated in FIG. 15, the terminals of the first all-solid-state secondary cell C1 can be prevented from being electrically short-circuited in the course of manufacturing of the electronic device 100.

Likewise, as for the second all-solid-state secondary cell C2, the second transistor TR2 functions as the low-side switch, and the third transistor TR3 functions as the high-side switch. Also, as for the third all-solid-state secondary cell C3, the third transistor TR3 functions as the high-side switch, and the fourth transistor TR4 functions as the low-side switch.

The electronic device 100 as described above can be manufactured using the electric storage unit 90, instead of the electric storage unit 50, in FIGS. 6A to 6F in the first embodiment.

Note that a first diode D1 is provided between the power generating element 55 and the electric storage unit 90, and a second diode D2 is provided between the electric storage unit 90 and the circuit element 63. These diodes D1 and D2 function to cause only a forward current to flow through the power generating element 55 and the electric storage unit 90. However, when the direction of the current is not problematic, the diodes D1 and D2 may be omitted.

The selection circuit 91 selects any one of the all-solid-state secondary cells C1 to C3 to electrically connect the positive electrode layer 23 of the selected all-solid-state secondary cell to the first electrode 56 of the power generating element 55 and also to electrically connect the negative electrode layer 29 of the selected all-solid-state secondary cell to the second electrode 57 of the power generating element 55.

Table 1 below shows which one of the first to fourth transistors TR1 to TR4 is to be turned on to select a target cell from the all-solid-state secondary cells C1 to C3:

TABLE 1

|  | TR1 | TR2 | TR3 | TR4 |
|---|---|---|---|---|
| Select C1 | ON | ON | OFF | OFF |
| Select C2 | OFF | ON | ON | OFF |
| Select C3 | OFF | OFF | ON | ON |
| Select all | ON | ON | ON | ON |

By turning on or off the first to fourth transistors TR1 to TR4 in accordance with Table 1, the target cell can be selected from the all-solid-state secondary cells C1 to C3, and the selected cell can be connected to the power generating element 55 and the circuit element 63.

In the present embodiment, any one of the all-solid-state secondary cells C1 to C3 is selected in this manner, and the selected all-solid-state secondary cell is charged one by one with power generated by the power generating element 55.

Figure 26B:
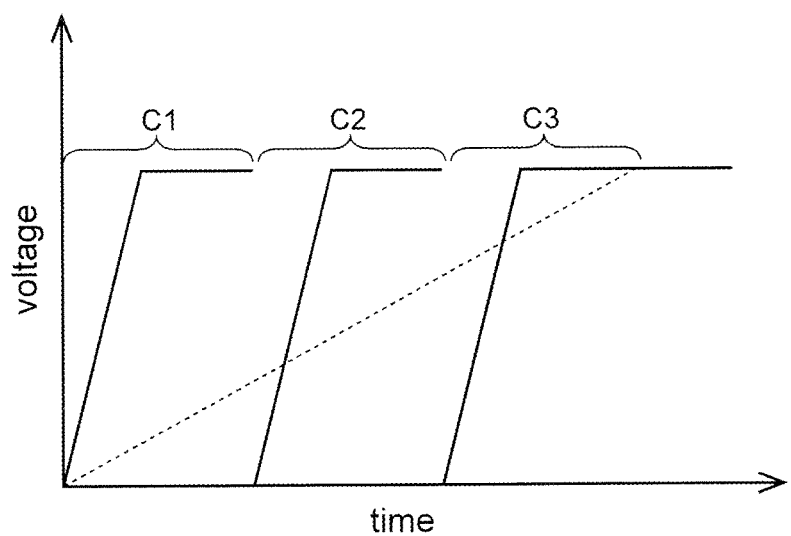
FIG. 26B is a graph schematically illustrating a relationship between the time elapsed since the start of charging and the voltage of each all-solid-state secondary cell.

The graphs of solid line in FIG. 26B are the graphs that schematically illustrate a relationship between the time elapsed since the start of charging and the voltage of each of the all-solid-state secondary cells C1 to C3.

Meanwhile, the graph of dotted line in FIG. 26B is the graph that schematically illustrates a relationship between the time elapsed since the start of charging and the voltage of each of the all-solid-state secondary cells C1 to C3, in a comparative example where all the all-solid-state secondary cells C1 to C3 are simultaneously charged.

As illustrated by the graphs, by charging the all-solid-state secondary cells C1 to C3 one by one as in the present embodiment, the time required to charge one all-solid-state secondary cell can be reduced compared with the comparative example. Thus, various power managements can be realized, such as that the circuit element 63 can be quickly driven using the charged one among the all-solid-state secondary cells C1 to C3.

Tenth Embodiment

Although the plurality of all-solid-state secondary cells are connected in parallel in the ninth embodiment, the all-solid-state secondary cells are connected in series in the present embodiment.

Figure 27A:
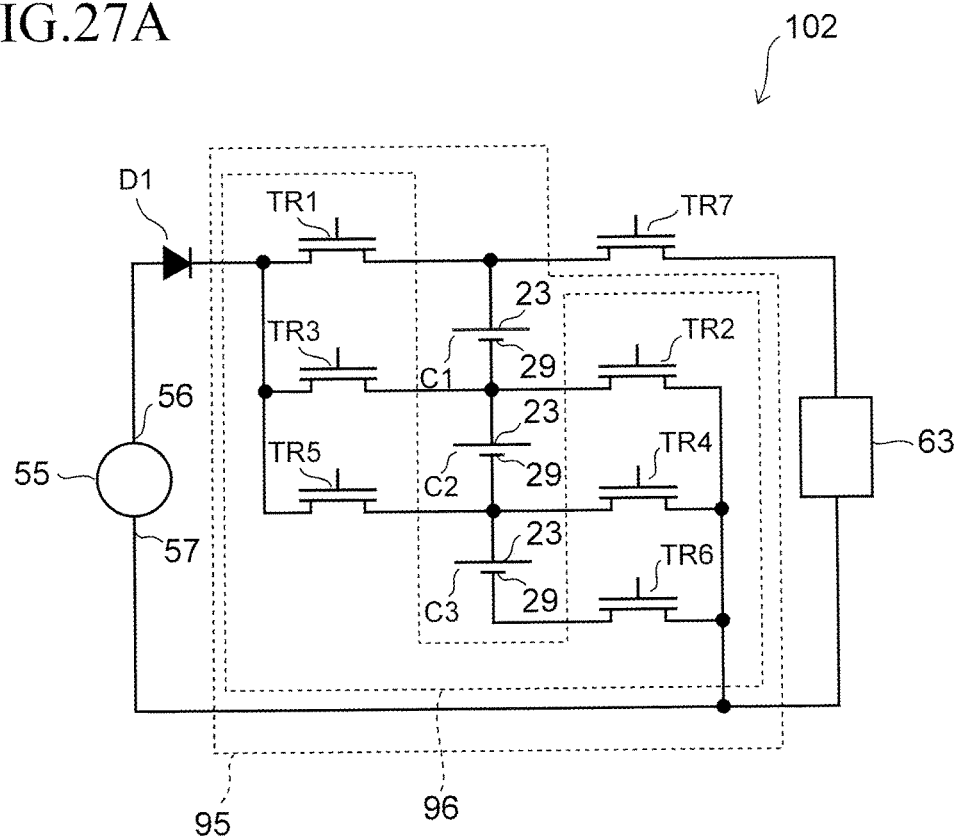
FIG. 27A is a circuit diagram of an electronic device according to a tenth embodiment.

FIG. 27A is a circuit diagram of an electronic device according to the present embodiment.

Note that, in FIG. 27A, the same elements as those described in the first to ninth embodiments are denoted by the same reference numerals as those in the first to ninth embodiments, and description thereof is omitted below.

As illustrated in FIG. 27A, an electronic device 102 according to the present embodiment includes a power generating element 55, an electric storage unit 95 and a circuit element 63.

Among these, the electric storage unit 95 includes a selection circuit 96 and first to third all-solid-state secondary cells C1 to C3 connected in series.

The selection circuit 96 includes first to sixth transistors TR1 to TR6. The transistors TR1 to TR6 are also manufactured in the same manner as those described in the first to eighth embodiments, and are sealed with a sealing layer 40 and the like together with the all-solid-state secondary cells C1 to C3.

The first to sixth transistors TR1 to TR6 serve as high-side switches or low-side switches to prevent over-discharge of the all-solid-state secondary cells C1 to C3.

As for the first all-solid-state secondary cell C1 for example, the first transistor TR1 functions as the high-side switch, and the second transistor TR2 functions as the low-side switch. Thus, by connecting the first and second transistors TR1 and TR2 in the same manner as illustrated in FIG. 15, the terminals in the first all-solid-state secondary cell C1 can be prevented from being electrically short-circuited in the course of manufacturing of the electronic device 102.

Likewise, as for the second all-solid-state secondary cell C2, the third transistor TR3 functions as the high-side switch, and the fourth transistor TR4 functions as the low-side switch. Also, as for the third all-solid-state secondary cell C3, the fifth transistor TR5 functions as the high-side switch, and the sixth transistor TR6 functions as the low-side switch.

Moreover, the electronic device 102 can be manufactured using the electric storage unit 95, instead of the electric storage unit 50, in FIGS. 6A to 6F in the first embodiment.

Note that a first diode D1 to take out only a forward current is provided between the power generating element 55 and the electric storage unit 95. However, when the direction of the current is not an issue, the first diode D1 may be omitted.

Furthermore, between the circuit element 63 and the electric storage unit 95, there is provided a seventh transistor TR7 as a switch to prevent a current from being supplied to the circuit element 63 during charging of the all-solid-state secondary cells C1 to C3. However, when a current is allowed to be supplied to the circuit element 63 during charging, the seventh transistor TR7 may be omitted.

The selection circuit 96 selects any one of the first to third all-solid-state secondary cells C1 to C3 to electrically connect the positive electrode layer 23 of the selected all-solid-state secondary cell to the first electrode 56 of the power generating element 55 and also to electrically connect the negative electrode layer 29 of the selected all-solid-state secondary cell to the second electrode 57 of the power generating element 55.

Table 2 below shows which one of the first to sixth transistors TR1 to TR6 is to be turned on to select a target cell from the all-solid-state secondary cells C1 to C3:

TABLE 2

|  | TR1 | TR2 | TR3 | TR4 | TR5 | TR6 |
|---|---|---|---|---|---|---|
| Select C1 | ON | ON | OFF | OFF | OFF | OFF |
| Select C2 | OFF | OFF | ON | ON | OFF | OFF |
| Select C3 | OFF | OFF | OFF | OFF | ON | ON |
| Series discharge | OFF | OFF | OFF | OFF | OFF | ON |

Note that "series discharge" in the last row of Table 2 means the case where the all-solid-state secondary cells C1 to C3 are connected in series and the power thereof is supplied to the circuit element 63.

By turning on and of the first to sixth transistors TR1 to TR6 in accordance with Table 2, the target cell can be selected from the all-solid-state secondary cells C1 to C3, and the selected cell can be connected to the power generating element 55 and the circuit element 63.

Furthermore, also in the present embodiment, as in the case of the ninth embodiment, any one of the all-solid-state secondary cells C1 to C3 is selected in accordance with Table 2, and the selected all-solid-state secondary cell is charged one by one with power generated by the power generating element 55.

Figure 27B:
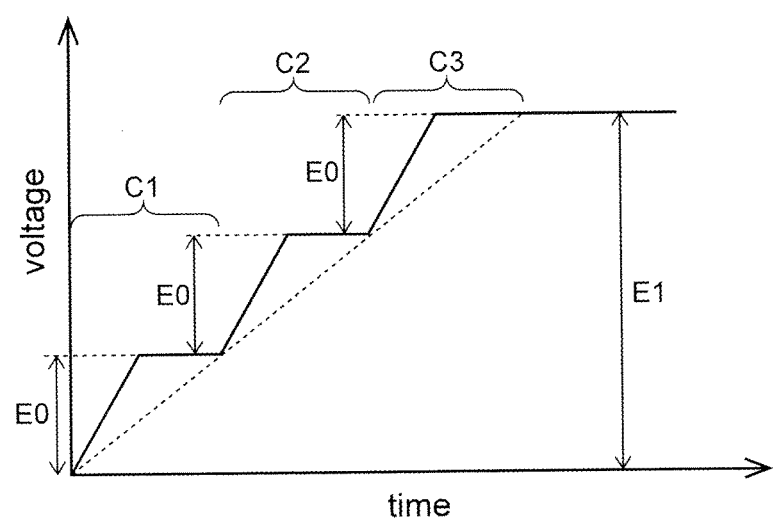
FIG. 27B is a graph schematically illustrating a relationship between the time elapsed since the start of charging and the overall voltage of the series-connected all-solid-state secondary cells.

The graph of the solid line in FIG. 27B is the graph that schematically illustrates a relationship between the time elapsed since the start of charging and the overall voltage of the series-connected all-solid-state secondary cells C1 to C3.

Note that the graph of the dotted line in FIG. 27B is the graph that indicates a comparative example where all of the all-solid-state secondary cells C1 to C3 are simultaneously charged.

As indicated by the solid line, while the voltages of the respective all-solid-state secondary cells C1 to C3 are saturated at the voltage E0 that is obtained by the power generating element 55, the total value E1 of all of the voltages of the all-solid-state secondary cells C1 to C3 is larger than the voltage E0.

Thus, a voltage larger than the voltage E0 obtained by the power generating element 55 can be taken out of the electronic device 96, thereby eliminating the need for a boosting circuit to increase the voltage E0. At the same time, the circuit element 63 that is driven at high voltage can also be used.

Furthermore, as in the case of the ninth embodiment, the time required to charge one all-solid-state secondary cell can be reduced compared with the comparative example. Thus, various power managements can also be realized.

Eleventh Embodiment

In the present embodiment, description is given of a network system using an electronic device according to the first to tenth embodiments.

Figure 28:
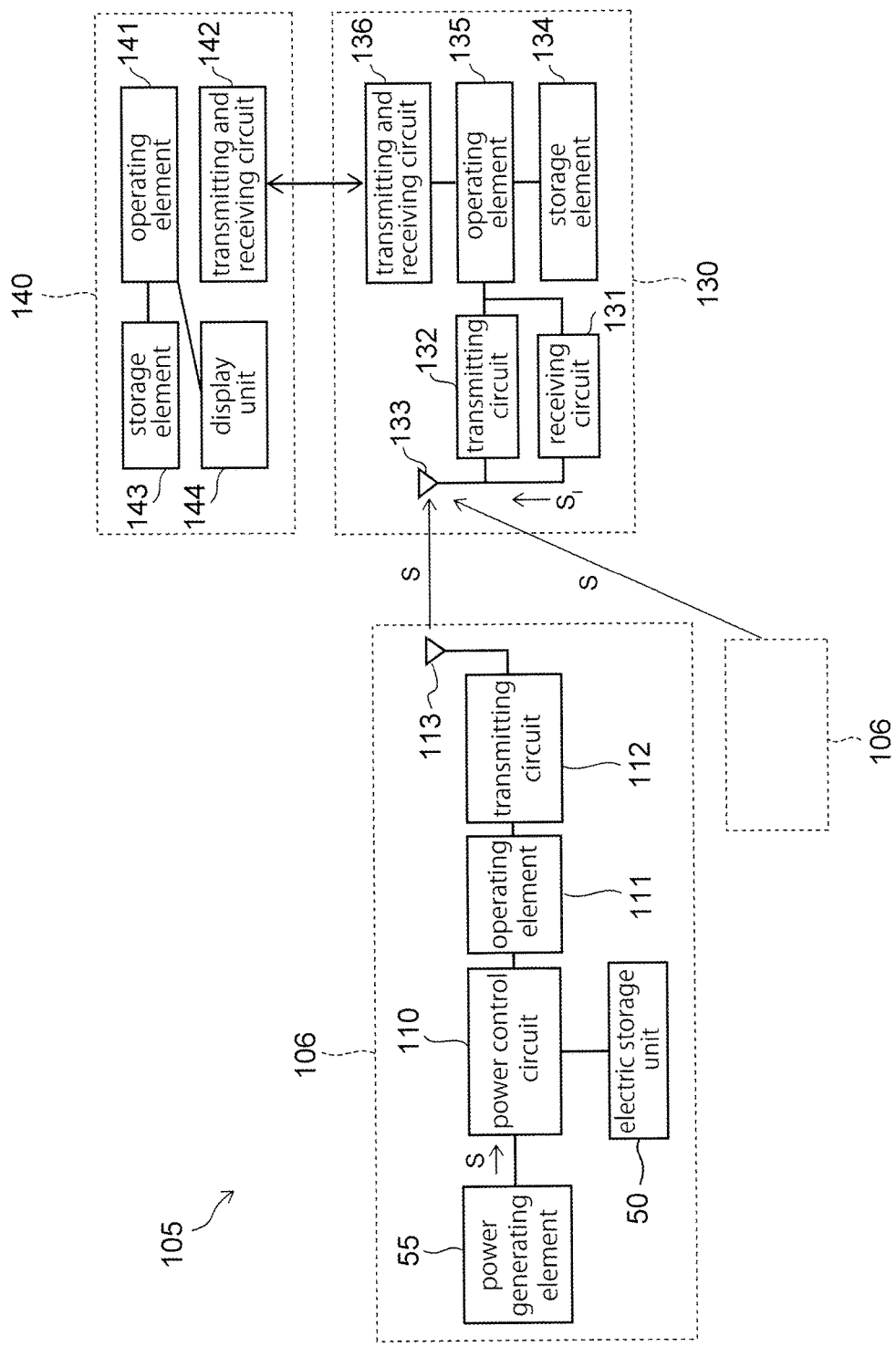
FIG. 28 is a functional block diagram of a network system according to an eleventh embodiment.

FIG. 28 is a functional block diagram of the network system according to the present embodiment.

As illustrated in FIG. 28, the network system 105 includes a plurality of first subdevices 106, a main device 130 and a server 140.

As for the first subdevices 106, the electronic device 70 (see FIG. 6F) according to the first embodiment, for example, can be used. The first subdevice 106 includes the electric storage unit 50 described above, a power generating element 55, a power control circuit 110, an operating element 111, a transmitting circuit 112 and an antenna 113.

Each of the power control circuit 110, the operating element 111 and the transmitting circuit 112 is an example of the circuit element 63 (see FIG. 6F) in the first embodiment, and is sealed with a resin layer 65 together with the electric storage unit 50 and the power generating element 55.

In this example, the thermoelectric conversion element described in the first embodiment is used as the power generating element 55, and a voltage to be outputted from the power generating element 55 is inputted to the power control circuit 110 as information S indicating the temperature of the environment where the power generating element 55 is located.

The power control circuit 110 has a function to supply the information S to the subsequent operating element 111. Other than this function, the power control circuit 110 also has a function as a charge and discharge controller, which charges the electric storage unit 50 with power generated by the power generating element 55, and discharge the electric storage unit 50 to supply its power to the operating element 111.

Note that the power control circuit 110, the operating element 111, the transmitting circuit 112 and the antenna 113 are driven using the power obtained from the electric storage unit 50 as a power source.

The operating element 111 digitizes the above information S for example, and outputs the digitized information to the subsequent transmitting circuit 112. Note that the operating element 111 may encrypt the digitized information S.

Furthermore, the operating element 111 also has a function to provide the information S with an identifier to identify each of the plurality of first subdevices 106.

Then, upon receipt of the information S from the operating element 111, the transmitting circuit 112 modulates the information S into radio waves and outputs the radio waves to the antenna 113. Thus, the information S is radio-transmitted from the antenna 113.

Meanwhile, the main device 130 is an example of a repeater, and includes a receiving circuit 131, a transmitting circuit 132, an antenna 133, a storage element 134, an operating element 135 and a transmitting and receiving circuit 136.

The antenna 133 receives the information S that is radio-transmitted from the antenna 113 of the subdevice 106, and outputs the information S to the subsequent receiving circuit 131. The receiving circuit 131 demodulates the information S modulated into radio waves, and outputs the demodulated information S to the operating element 135.

The operating element 135 decrypts the encrypted information S and identifies from which one of the subdevices 106 the information S is radio-transmitted, based on the identifier attached to the information S to identify the subdevice 106.

Note that the operating element 135 may generate an instruction signal $S_I$ at a predetermined timing, and then the instruction signal $S_I$ may be radio-transmitted from the antenna 133 after being modulated into radio waves by the transmitting circuit 132. Although the first subdevice 106 does not have the function to receive the instruction signal $S_I$, a second subdevice to be described later has a receiving circuit to receive the instruction signal $S_I$. Thus, only when the instruction signal $S_I$ is received, the information S can be radio-transmitted to the main device 130 by the second subdevice.

Then, under the control of the operating element 135, the information S is stored in the storage element 134 for each identifier. As for the storage element 134, an arbitrary element, such as a DRAM (Dynamic Random Access Memory), an FeRAM (Ferroelectric Random Access Memory) and a flash memory, can be used.

Also, the operating element 135 retrieves the information S from the storage element 134 at a predetermined timing, and outputs the information S to the transmitting and receiving circuit 136. The transmitting and receiving circuit 136 transmits the information S obtained from the storage element 134 to the server 140 using a predetermined communication protocol. A mode for the transmission may be either wireless or wired.

The server 140 includes an operating element 141, a transmitting and receiving circuit 142, a storage element 143 and a display unit 144.

Among these, the transmitting and receiving circuit 142 receives the information S transmitted from the main device 130, and outputs the information S to the operating element 141.

The operating element 141 stores the information S in the storage element 143, and converts the information S into an appropriate image signal to display the image signal on display unit 144 such as a display. Thus, a user can find out the temperature of the environment where the subdevice 106 is located, based on the information S displayed on the display unit 144.

The network system 105 can realize energy harvest in which the power generating element 55 of the first subdevice 106 generates power using the temperature of the environment and the power thus obtained is stored in the electric storage unit 50.

Furthermore, the user can use a voltage value of the power generating element 55 to monitor the surrounding temperature of the power generating element 55.

Note that, instead of monitoring the temperature with the power generating element 55 as described above, a sensor to acquire information on the environment may be provided in the subdevice as described below.

Figure 29:
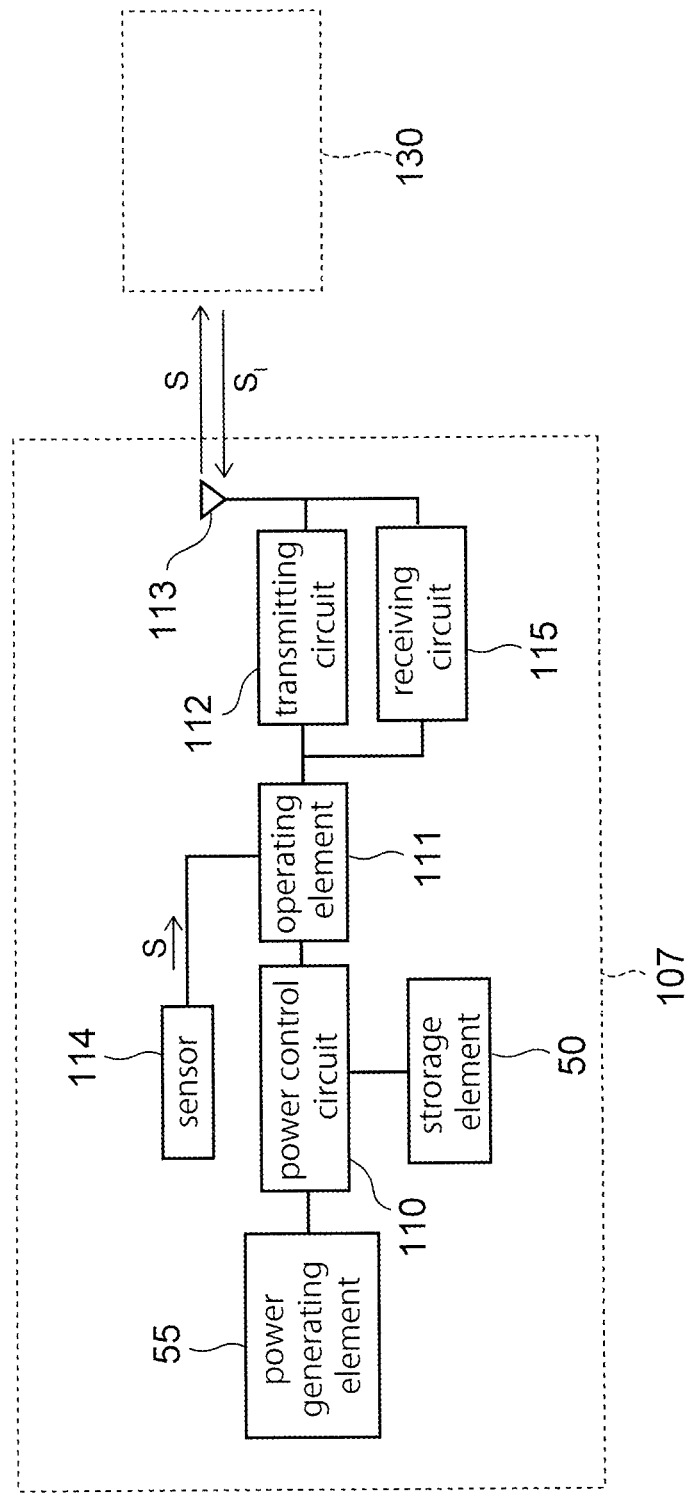
FIG. 29 is a functional block diagram of a second sub-device which can be used in the eleventh embodiment.

FIG. 29 is a functional block diagram of the second subdevice which can be used in the network system 105 described above. Note that, in FIG. 29, the same elements as those described with reference to FIG. 28 are denoted by the same reference numerals as those in FIG. 28, and description thereof is omitted below.

As illustrated in FIG. 29, the second subdevice 107 includes a sensor 114 connected to an operating element 111 and a receiving circuit 115.

The sensor 114 is not particularly limited. In this example, any of a temperature sensor, an optical sensor, a vibration sensor and a sound sensor is used as the sensor 114. Thus, information S is outputted from the sensor 114, such as a temperature, light, vibration and sounds in the environment where the power generating element 55 is located.

The receiving circuit 115 decrypts the instruction signal $S_I$ generated by the operating element 135 of the main device 130, and outputs the decrypted instruction signal $S_I$ to the operating element 111. The operating element 111 acquires the information S from the sensor 114 only when receiving the instruction signal $S_I$. The information S acquired by the operating element 111 is radio-transmitted from the antenna 113, as in the case of the first subdevice 106.

According to the second subdevice 107 as described above, one can acquire the information such as light, vibration and sounds, which the user wishes to monitor other than temperature, thereby contributing to the convenience of the user.

Next, description is given of an installation example of the first subdevice 106 and the second subdevice 107.

Figure 30A:
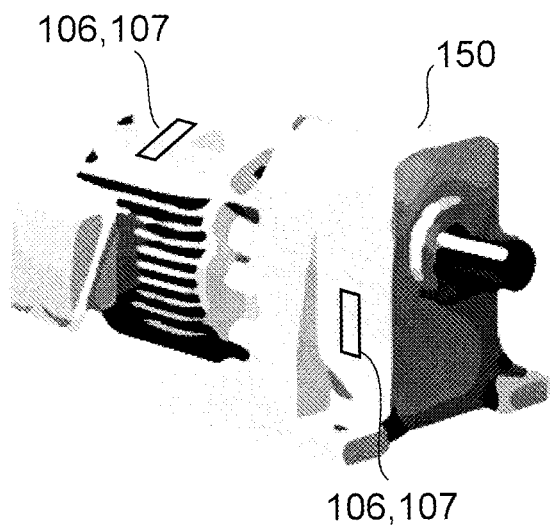
FIGS. 30A to 30C are schematic views illustrating an installation example of first subdevices and the second subdevices in the eleventh embodiment.
Figure 30B:
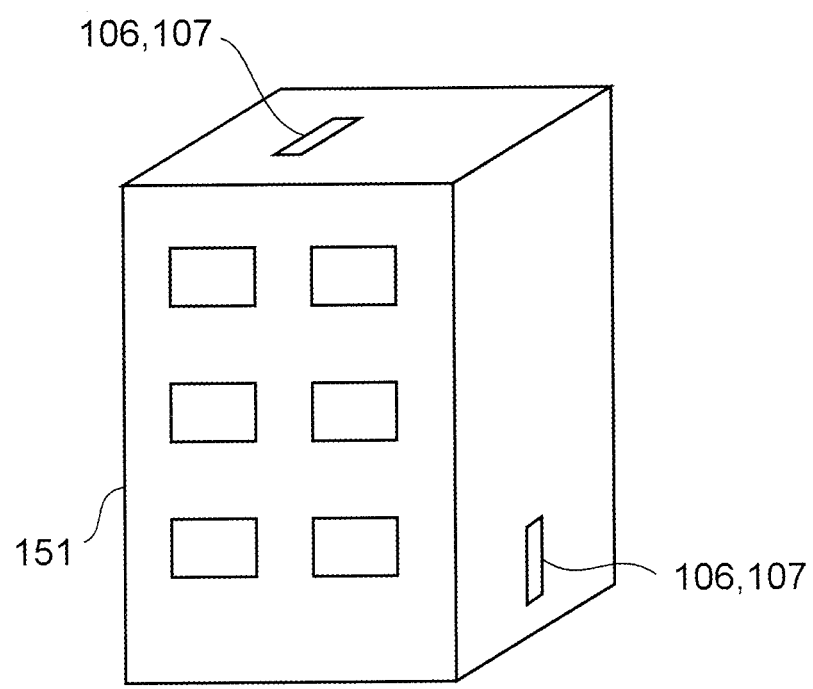
Figure 30C:
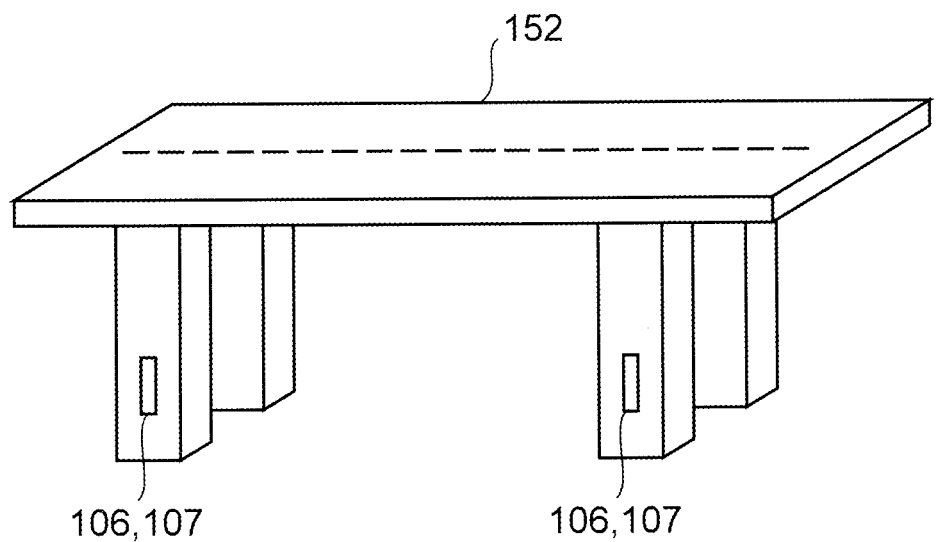

FIGS. 30A to 30C are schematic views illustrating an installation example of the subdevices 106 and 107.

In the example illustrated in FIG. 30A, a plurality of the subdevices 106 and 107 are provided to equipment 150 such as a motor. In this case, the power generating element generates power by utilizing power generated by the equipment 150, and this power operates the second subdevice 107. Note that a radiator plate to facilitate radiation from the equipment 150 may be provided to the second subdevice 107 in order to maintain a large temperature difference between the radiator plate and the equipment 150, so as to ensure an amount of power generated by the power generating element 55. Moreover, by using any of a sound sensor, a vibration sensor and an acceleration sensor as the sensor 114 of the second subdevice 107, abnormal vibration and abnormal noise of the equipment 150 can be monitored. Thus, the user can determine whether or not the equipment 150 is normally operated. As a result, the user can take action such as repair and replacement of the equipment 150 before the equipment 150 breaks down.

Note that the temperature of the equipment 150 may be monitored using the power generating element 55 (see FIG. 28) of the first subdevice 106. Thus, the user can monitor the surface temperature of the equipment 150 and therefore can determine whether or not the equipment 150 is abnormally heated.

Moreover, instead of using the thermoelectric element as the power generating element 55 as in the above, a vibration power generating element which generates power using the vibration of the equipment 150 may be used as the power generating element 55.

In the example illustrated in FIG. 30B, a plurality of the subdevices 106 and 107 are provided in a building 151 such as a factory.

In this case, abnormal vibration or abnormal noise in the building 151 can be monitored by using a sound sensor or a vibration sensor as the second sensor 114. When there is abnormal vibration or abnormal noise, the user can determine that there is a suspicious person in the building 151. Thus, the second subdevices 107 can help the security and maintenance of the building 151.

Note that the temperature of the building 151 may be monitored by using the power generating element 55 (see FIG. 28) in the first subdevice 106.

In the example illustrated in FIG. 30C, a plurality of the subdevices 106 and 107 are provided in a traffic facility 152 such as a road, a bridge and a tunnel.

In this case, again, abnormal noise or cracks in the traffic facility 152 can be monitored by using a sound sensor or a vibration sensor as the sensor 114 of the second subdevice 107. Moreover, the temperature of the traffic facility 152 may be monitored by using the power generating element 55 (see FIG. 28) of the first subdevice 106.

While the embodiments have been described above in detail, the embodiments are not limited thereto. For example, in the above embodiments, the positive electrode layer 23, the solid electrolyte layer 25 and the negative electrode layer 29 are formed in this order. However, the negative electrode layer 29, the solid electrolyte layer 25 and the positive electrode layer 23 may be formed in this order.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device comprising:
    a substrate;
    a first all-solid-state secondary cell provided on the substrate, the first all-solid-state secondary cell including a first electrode layer, a solid electrolyte layer, and a second electrode layer;
    a first transistor including a first source drain, a second source drain electrically connected to the second electrode layer, and a first gate electrode;
    a first terminal electrically connected to the first electrode layer;
    a second terminal to control a potential of the first gate electrode;
    a third terminal electrically connected to the first source drain; and
    a sealing layer covering the first all-solid-state secondary cell and the first transistor, wherein
    the first terminal, the second terminal, and the third terminal are exposed on an upper surface of the sealing layer.

2. The electronic device according to claim 1, wherein
the first electrode layer is a negative electrode,
the second electrode layer is a positive electrode, and
the first transistor is of an n type.

3. The electronic device according to claim 1, further comprising an n type second transistor covered with the sealing layer, the second transistor including a third source drain, a fourth source drain, and a second gate electrode, wherein
the first electrode layer is a negative electrode,
the second electrode layer is a positive electrode,
the first transistor is of a p type,
the second terminal is electrically connected to the second gate electrode,
the third source drain is electrically connected to the first electrode layer, and
the fourth source drain is electrically connected to the first gate electrode.

4. The electronic device according to claim 1, wherein
the first electrode layer is a positive electrode,
the second electrode layer is a negative electrode, and
the first transistor is of a p type.

5. The electronic device according to claim 1, further comprising a p type second transistor covered with the sealing layer, the second transistor including a third source drain, a fourth source drain, and a second gate electrode, wherein
the first electrode layer is a positive electrode,
the second electrode layer is a negative electrode,
the first transistor is of an n type,
the second terminal is electrically connected to the second gate electrode,
the third source drain is electrically connected to the first electrode layer, and
the fourth source drain is electrically connected to the first gate electrode.

6. The electronic device according to claim 1, further comprising:
a second transistor covered with the sealing layer, the second transistor including a third source drain, a fourth source drain, and a second gate electrode;
a fourth terminal electrically connected to the second gate electrode and exposed on the upper surface of the sealing layer; and
a fifth terminal electrically connected to the fourth source drain and exposed on the upper surface of the sealing layer, wherein
the third source drain is electrically connected to the first electrode layer.

7. The electronic device according to claim 1, further comprising a second all-solid-state secondary cell provided between the third terminal and the first source drain and connected in series to the first all-solid-state secondary cell through the first transistor, wherein
the second all-solid-state secondary cell is covered with the sealing layer.

8. The electronic device according to claim 1, further comprising a power generating element including a first electrode and a second electrode, wherein
the first electrode of the power generating element is electrically connected to the first electrode layer of the first all-solid-state secondary cell, and
the second electrode of the power generating element is electrically connected to the second electrode layer of the first all-solid-state secondary cell.

9. The electronic device according to claim 8, wherein
a plurality of the first all-solid-state secondary cells are connected in parallel, and
the electronic device further comprises a selection circuit configured to select any one of the plurality of first all-solid-state secondary cells, to electrically connect the first electrode layer of the selected first all-solid-state secondary cell to the first electrode of the power generating element, and to electrically connect the second electrode layer of the selected first all-solid-state secondary cell to the second electrode of the power generating element.

10. The electronic device according to claim 8, wherein
a plurality of the first all-solid-state secondary cells are connected in series, and
the electronic device further comprises a selection circuit configured to select any one of the plurality of first all-solid-state secondary cells, to electrically connect the first electrode layer of the selected first all-solid-state secondary cell to the first electrode of the power generating element, and to electrically connect the second electrode layer of the selected first all-solid-state secondary cell to the second electrode of the power generating element.

11. The electronic device according to claim 1, wherein the first transistor includes:
a gate insulating film formed on the first gate electrode; and
a semiconductor layer formed on the gate insulating film, the semiconductor layer including the first source drain and the second source drain, wherein
a part of the first gate electrode is positioned between the first source drain and the second source drain in a planar view.

12. The electronic device according to claim 11, further comprising an insulating film including an opening formed on the first electrode layer, wherein
the first source drain in the semiconductor layer is in contact with the first electrode layer in the opening, and
the first gate electrode has a ring shape surrounding the opening in a planar view.

13. The electronic device according to claim 1, wherein the first electrode layer includes:
a collecting layer formed on the substrate, and
a electrode body formed on the collecting layer, and
the first gate electrode is formed on the substrate and consists of the same material as a material of the collecting layer.

14. The electronic device according to claim 1, further comprising a wiring layer formed on the upper surface of the sealing layer and electrically connected to the first terminal, the second terminal, and the third terminal.

15. A method of manufacturing an electronic device, the method comprising:
forming a collecting layer on a substrate, the collecting layer including a first region and a second region;
forming a first electrode body on the first region of the collecting layer, thereby forming a first electrode layer of an all-solid-state secondary cell using the collecting layer and the first electrode body;
forming a solid electrolyte layer of the all-solid-state secondary cell on the first electrode layer;
forming a second electrode layer of the all-solid-state secondary cell on the solid electrolyte layer;
forming an insulating film covering the all-solid-state secondary cell and the substrate;

forming a gate electrode of a transmitter on the insulating film over the second electrode layer, the gate electrode including a gate body and an extension portion;

forming a gate insulating film on the gate body;

forming an opening, in which the second electrode layer is exposed, in the insulating film at one side of the gate body;

forming a semiconductor layer on the all-solid-state secondary cell, the semiconductor layer including a first source drain of the transmitter on the insulating film at another side of the gate body, a second source drain of the transmitter being in contact with the second electrode layer in the opening, and a channel on the gate insulating film;

forming a sealing layer on the extension portion, the semiconductor layer, and the insulating film;

patterning the sealing layer to form a first hole on the collecting layer in the second region, a second hole on the extension portion of the gate electrode, and a third hole on the first source drain; and forming a first terminal, a second terminal, and a third terminal in the first hole, the second hole, and the third hole, respectively.

16. A method of manufacturing an electronic device, the method comprising:

forming a collecting layer on a substrate, the collecting layer including a first region and a second region;

forming a first electrode body on the first region of the collecting layer, thereby forming a first electrode layer of an all-solid-state secondary cell using the collecting layer and the first electrode body;

forming a solid electrolyte layer of the all-solid-state secondary cell on the first electrode layer;

forming a second electrode layer of the all-solid-state secondary cell on the solid electrolyte layer;

forming an insulating film covering the all-solid-state secondary cell and the substrate;

forming a gate body of a gate electrode of a transmitter on the insulating film in the second region, and forming an extension portion of the gate electrode on the insulating film beside the second region;

forming a gate insulating film on the gate body;

forming an opening, in which the collecting layer is exposed, in the insulating film at one side of the gate body;

forming a semiconductor layer in the second region, the semiconductor layer including a first source drain of the transmitter on the insulating film at the one side of the gate body, a second source drain of the transmitter being in contact with the first electrode layer in the opening, and a channel on the gate insulating film;

forming a sealing layer on the extension portion, the semiconductor layer, and the insulating film;

patterning the sealing layer to form a first hole on the second electrode layer, a second hole on the extension portion of the gate electrode, and a third hole on the first source drain; and forming a first terminal, a second terminal, and a third terminal in the first hole, the second hole, and the third hole, respectively.

17. A network system comprising:

a plurality of electronic devices, each including a power generating element, an all-solid-state secondary cell storing power generated by the power generating element, and a transmitting circuit driven by the power of the all-solid-state secondary cell to transmit information regarding an environment where the power generating element is located, wherein each of the plurality of electronic devices includes:

a substrate, a first electrode layer, a solid electrolyte layer, and a second electrode layer, which are provided on the substrate to form an all-solid-state secondary cell, a transistor including a first source drain, a second source drain electrically connected to the second electrode layer, and a first gate electrode, a first terminal electrically connected to the first electrode layer, a second terminal to control a potential of the first gate electrode, a third terminal electrically connected to the first source drain, a sealing layer covering the all-solid-state secondary cell and the transistor, and a wiring layer formed on the upper surface of the sealing layer and electrically connected to the first terminal, the second terminal, and the third terminal.

18. The network system according to appendix 17, wherein the electronic device is provided with a sensor to acquire information regarding the environment.

19. The network system according to claim 18, wherein the sensor is any one of a temperature sensor, an optical sensor, a vibration sensor, a sound sensor, an acceleration sensor, and a pressure sensor.

20. The network system according to claim 17, wherein each of the plurality of electronic devices is provided in any of equipment, a building, and a traffic facility.

* * * * *